(12) United States Patent
Asami et al.

(10) Patent No.: US 12,074,224 B2
(45) Date of Patent: Aug. 27, 2024

(54) SEMICONDUCTOR DEVICE AND MANUFACTURING METHOD THEREOF

(71) Applicant: SEMICONDUCTOR ENERGY LABORATORY CO., LTD., Atsugi (JP)

(72) Inventors: Yoshinobu Asami, Kanagawa (JP); Yutaka Okazaki, Kanagawa (JP); Satoru Okamoto, Kanagawa (JP); Shinya Sasagawa, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/591,690

(22) Filed: Feb. 3, 2022

(65) Prior Publication Data

US 2022/0199831 A1 Jun. 23, 2022

Related U.S. Application Data

(63) Continuation of application No. 16/378,622, filed on Apr. 9, 2019, now Pat. No. 11,245,039, which is a
(Continued)

(30) Foreign Application Priority Data

Jan. 26, 2015 (JP) .................. 2015-012713
Jan. 26, 2015 (JP) .................. 2015-012718
(Continued)

(51) Int. Cl.
 *H01L 29/786* (2006.01)
 *C23C 16/40* (2006.01)
(Continued)

(52) U.S. Cl.
 CPC .......... *H01L 29/7869* (2013.01); *C23C 16/40* (2013.01); *C23C 16/45531* (2013.01);
(Continued)

(58) Field of Classification Search
 CPC ......... H01L 29/42384; H01L 29/66969; H01L 29/78603; H01L 29/78618;
(Continued)

(56) References Cited

U.S. PATENT DOCUMENTS 5,731,856 A  3/1998 Kim et al.
5,734,185 A  3/1998 Iguchi et al.
(Continued)

FOREIGN PATENT DOCUMENTS

CN  102834922 A  12/2012
EP  0777269 A  6/1997
(Continued)

OTHER PUBLICATIONS

Chatterjee.A et al., "Sub-100nm Gate Length Metal Gate NMOS Transistors Fabricated by a Replacement Gate Process", IEDM 97: Technical Digest of International Electron Devices Meeting, Dec. 7, 1997, pp. 821-824.
(Continued)

*Primary Examiner* — Galina G Yushina
(74) *Attorney, Agent, or Firm* — Fish & Richardson P.C.

(57) ABSTRACT

A semiconductor device includes a first oxide insulating layer over a first insulating layer, an oxide semiconductor layer over the first oxide insulating layer, a source electrode layer and a drain electrode layer over the oxide semiconductor layer, a second insulating layer over the source electrode layer and the drain electrode layer, a second oxide insulating layer over the oxide semiconductor layer, a gate insulating layer over the second oxide insulating layer, a gate electrode layer over the gate insulating layer, and a third
(Continued)

insulating layer over the second insulating layer, the second oxide insulating layer, the gate insulating layer, and the gate electrode layer. A side surface portion of the second insulating layer is in contact with the second oxide insulating layer. The gate electrode layer includes a first region and a second region. The first region has a width larger than that of the second region.

21 Claims, 57 Drawing Sheets

Related U.S. Application Data continuation of application No. 15/959,548, filed on Apr. 23, 2018, now abandoned, which is a continuation of application No. 14/995,562, filed on Jan. 14, 2016, now Pat. No. 9,954,112.

(30) Foreign Application Priority Data

Feb. 27, 2015 (JP) .................................. 2015-039161
Mar. 3, 2015 (JP) .................................. 2015-041682
Mar. 10, 2015 (JP) .................................. 2015-046870
Mar. 17, 2015 (JP) .................................. 2015-053100

(51) Int. Cl.
| | |
|---|---|
| *C23C 16/455* | (2006.01) |
| *H01L 21/475* | (2006.01) |
| *H01L 21/4757* | (2006.01) |
| *H01L 21/67* | (2006.01) |
| *H01L 27/12* | (2006.01) |
| *H01L 29/06* | (2006.01) |
| *H01L 29/417* | (2006.01) |
| *H01L 29/423* | (2006.01) |
| *H01L 29/66* | (2006.01) |
| *H01L 21/02* | (2006.01) |

(52) U.S. Cl.
CPC ...... *H01L 21/475* (2013.01); *H01L 21/47573* (2013.01); *H01L 21/67207* (2013.01); *H01L 27/1207* (2013.01); *H01L 27/1225* (2013.01); *H01L 29/0649* (2013.01); *H01L 29/41733* (2013.01); *H01L 29/42356* (2013.01); *H01L 29/42376* (2013.01); *H01L 29/42384* (2013.01); *H01L 29/66969* (2013.01); *H01L 29/78603* (2013.01); *H01L 29/78618* (2013.01); *H01L 29/78696* (2013.01); *H01L 21/02554* (2013.01); *H01L 21/02565* (2013.01); *H01L 21/0262* (2013.01)

(58) Field of Classification Search
CPC ........... H01L 29/78696; H01L 27/1225; H01L 29/0649; H01L 29/41733; H01L 29/42356; H01L 29/42376; H01L 29/7869; H01L 21/475; H01L 21/47573; H01L 21/67207; H01L 27/1207
See application file for complete search history.

(56) References Cited

U.S. PATENT DOCUMENTS

| | | |
|---|---|---|
| 5,744,864 A | 4/1998 | Cillessen et al. |
| 5,960,270 A | 9/1999 | Misra et al. |
| 6,140,158 A | 10/2000 | Rhee et al. |
| 6,294,274 B1 | 9/2001 | Kawazoe et al. |
| 6,346,450 B1 | 2/2002 | Deleonibus et al. |
| 6,475,841 B1 * | 11/2002 | Taylor, Jr. ........ H01L 21/823456 257/E21.624 |
| 6,563,174 B2 | 5/2003 | Kawasaki et al. |
| 6,727,522 B1 | 4/2004 | Kawasaki et al. |
| 6,958,500 B2 | 10/2005 | Saito |
| 7,045,867 B2 | 5/2006 | Dang et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,126,199 B2 | 10/2006 | Doczy et al. |
| 7,211,825 B2 | 5/2007 | Shih et al. |
| 7,238,557 B2 | 7/2007 | Hayakawa |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,834,356 B2 | 11/2010 | Hayakawa |
| 8,043,905 B2 | 10/2011 | Hayakawa |
| 8,143,668 B2 | 3/2012 | Morita et al. |
| 8,237,166 B2 | 8/2012 | Kumomi et al. |
| 8,482,001 B2 | 7/2013 | Yamazaki et al. |
| 8,501,564 B2 | 8/2013 | Suzawa et al. |
| 8,547,771 B2 | 10/2013 | Koyama |
| 8,552,423 B2 | 10/2013 | Yamazaki et al. |
| 8,581,247 B2 | 11/2013 | Suzuki et al. |
| 8,680,529 B2 | 3/2014 | Kimura |
| 8,698,143 B2 | 4/2014 | Yamazaki et al. |
| 8,823,074 B2 | 9/2014 | Suzawa et al. |
| 8,895,373 B2 | 11/2014 | Suzuki et al. |
| 8,896,030 B2 | 11/2014 | Mukherjee et al. |
| 8,995,174 B2 | 3/2015 | Koyama |
| 9,012,918 B2 | 4/2015 | Yamazaki et al. |
| 9,040,995 B2 | 5/2015 | Kimura |
| 9,048,265 B2 | 6/2015 | Hondo et al. |
| 9,048,323 B2 | 6/2015 | Yamazaki et al. |
| 9,054,201 B2 | 6/2015 | Yamazaki et al. |
| 9,059,219 B2 | 6/2015 | Sasagawa et al. |
| 9,064,967 B2 | 6/2015 | Suzawa et al. |
| 9,263,472 B2 | 2/2016 | Yamazaki et al. |
| 9,281,408 B2 | 3/2016 | Yamazaki et al. |
| 9,299,850 B2 | 3/2016 | Nakagawa |
| 9,337,342 B2 | 5/2016 | Okazaki et al. |
| 9,418,898 B2 | 8/2016 | Mukherjee et al. |
| 9,431,547 B2 | 8/2016 | Yamazaki et al. |
| 9,437,744 B2 | 9/2016 | Sasagawa et al. |
| 9,508,862 B2 | 11/2016 | Kimura |
| 9,543,327 B2 | 1/2017 | Nakagawa |
| 9,559,183 B2 | 1/2017 | Inoue et al. |
| 9,705,001 B2 | 7/2017 | Yamazaki |
| 9,705,003 B2 | 7/2017 | Yamazaki et al. |
| 9,722,088 B2 | 8/2017 | Hanaoka et al. |
| 9,761,737 B2 | 9/2017 | Tanaka |
| 9,837,552 B2 | 12/2017 | Yamazaki et al. |
| 9,865,620 B2 | 1/2018 | Nakagawa |
| 9,935,202 B2 | 4/2018 | Yamazaki et al. |
| 9,984,884 B2 | 5/2018 | Inoue et al. |
| 9,991,395 B2 | 6/2018 | Sasagawa et al. |
| 10,020,232 B2 | 7/2018 | Mukherjee et al. |
| 10,068,926 B2 | 9/2018 | Kimura |
| 10,083,996 B2 | 9/2018 | Yamazaki et al. |
| 10,128,384 B2 | 11/2018 | Yamazaki et al. |
| 10,170,599 B2 | 1/2019 | Okazaki et al. |
| 10,256,347 B2 | 4/2019 | Yamazaki |
| 10,283,530 B2 | 5/2019 | Kimura |
| 10,411,136 B2 | 9/2019 | Yamazaki et al. |
| 10,461,098 B2 | 10/2019 | Yamazaki et al. |
| 10,573,758 B2 | 2/2020 | Hanaoka et al. |
| 10,720,532 B2 | 7/2020 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |

(56) References Cited

U.S. PATENT DOCUMENTS

| | | |
|---|---|---|
| 2003/0060018 A1 | 3/2003 | Hsu |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0113212 A1 | 6/2004 | Lee et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0260818 A1 | 11/2005 | Fujiwara |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0135955 A1 | 6/2008 | Korogi |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0189201 A1 | 7/2009 | Chang et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0062436 A1 | 3/2011 | Yamazaki et al. |
| 2011/0133177 A1 | 6/2011 | Suzawa et al. |
| 2011/0180796 A1 | 7/2011 | Yamazaki et al. |
| 2011/0240990 A1 | 10/2011 | Yamazaki |
| 2012/0025191 A1* | 2/2012 | Yamazaki ......... H01L 21/02554 257/E29.296 |
| 2012/0032163 A1 | 2/2012 | Yamazaki |
| 2012/0061774 A1 | 3/2012 | Morita et al. |
| 2012/0104509 A1 | 5/2012 | Matsumoto |
| 2012/0168859 A1 | 7/2012 | Jin et al. |
| 2012/0248544 A1 | 10/2012 | Yokoyama |
| 2012/0264286 A1* | 10/2012 | Yeo ..................... H01L 29/6656 257/E21.19 |
| 2013/0015436 A1 | 1/2013 | Yamazaki |
| 2013/0026558 A1 | 1/2013 | Jeon et al. |
| 2013/0075722 A1 | 3/2013 | Yamazaki et al. |
| 2013/0187239 A1 | 7/2013 | Chudzik et al. |
| 2013/0256595 A1 | 10/2013 | Ikenaga et al. |
| 2013/0270549 A1 | 10/2013 | Okazaki et al. |
| 2013/0277676 A1 | 10/2013 | Yamazaki |
| 2013/0285050 A1 | 10/2013 | Yamazaki et al. |
| 2013/0320332 A1 | 12/2013 | Hondo et al. |
| 2014/0004656 A1 | 1/2014 | Sasagawa et al. |
| 2014/0103338 A1* | 4/2014 | Yamazaki ......... H01L 21/02565 257/43 |
| 2014/0131700 A1* | 5/2014 | Yamazaki ........... H01L 27/1214 257/43 |
| 2014/0151688 A1 | 6/2014 | Yamazaki |
| 2014/0227843 A1* | 8/2014 | Tsukamoto ......... H01L 29/6659 438/275 |
| 2014/0284593 A1 | 9/2014 | Nakano et al. |
| 2014/0326992 A1 | 11/2014 | Hondo et al. |
| 2014/0339546 A1 | 11/2014 | Yamazaki et al. |
| 2015/0084064 A1* | 3/2015 | Yamamoto ........ H01L 29/42376 257/77 |
| 2015/0187898 A1 | 7/2015 | Miyairi |
| 2015/0221754 A1 | 8/2015 | Hondo et al. |
| 2015/0270402 A1 | 9/2015 | Endo et al. |
| 2015/0280003 A1 | 10/2015 | Yamazaki et al. |
| 2015/0280013 A1 | 10/2015 | Yamazaki et al. |
| 2015/0372009 A1 | 12/2015 | Yamazaki |
| 2018/0151377 A1 | 5/2018 | Inoue et al. |
| 2018/0226510 A1 | 8/2018 | Yamazaki et al. |
| 2018/0301551 A1 | 10/2018 | Majhi et al. |
| 2019/0006397 A1 | 1/2019 | Yamazaki et al. |
| 2019/0035690 A1 | 1/2019 | Mukherjee et al. |
| 2019/0081082 A1 | 3/2019 | Kimura |
| 2020/0058682 A1 | 2/2020 | Yamazaki et al. |
| 2021/0057586 A1 | 2/2021 | Yamazaki et al. |

FOREIGN PATENT DOCUMENTS

| | | |
|---|---|---|
| EP | 1737044 A | 12/2006 |
| EP | 2226847 A | 9/2010 |
| EP | 2544237 A | 1/2013 |
| EP | 2782138 A | 9/2014 |
| EP | 2811528 A | 12/2014 |
| EP | 3217435 A | 9/2017 |
| EP | 3540772 A | 9/2019 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-147411 A | 6/1995 |
| JP | 08-097431 A | 4/1996 |
| JP | 08-162640 A | 6/1996 |
| JP | 08-264794 A | 10/1996 |
| JP | 09-153612 A | 6/1997 |
| JP | 11-505377 | 5/1999 |
| JP | 2000-044236 A | 2/2000 |
| JP | 2000-150900 A | 5/2000 |
| JP | 2001-093861 A | 4/2001 |
| JP | 2001-506807 | 5/2001 |
| JP | 2002-076356 A | 3/2002 |

(56) References Cited

FOREIGN PATENT DOCUMENTS

| | | |
|---|---|---|
| JP | 2002-198521 A | 7/2002 |
| JP | 2002-289859 A | 10/2002 |
| JP | 2002-299610 A | 10/2002 |
| JP | 2003-086000 A | 3/2003 |
| JP | 2003-086808 A | 3/2003 |
| JP | 2003-218362 A | 7/2003 |
| JP | 2003-289080 A | 10/2003 |
| JP | 2004-103957 A | 4/2004 |
| JP | 2004-111611 A | 4/2004 |
| JP | 2004-152790 A | 5/2004 |
| JP | 2004-273614 A | 9/2004 |
| JP | 2004-273732 A | 9/2004 |
| JP | 2004-356168 A | 12/2004 |
| JP | 2005-116592 A | 4/2005 |
| JP | 2005-332993 A | 12/2005 |
| JP | 2006-165528 A | 6/2006 |
| JP | 2006-344905 A | 12/2006 |
| JP | 2008-060313 A | 3/2008 |
| JP | 2008-515190 | 5/2008 |
| JP | 2008-147355 A | 6/2008 |
| JP | 2008-227165 A | 9/2008 |
| JP | 2009-302317 A | 12/2009 |
| JP | 2010-034139 A | 2/2010 |
| JP | 2011-101027 A | 5/2011 |
| JP | 2011-139055 A | 7/2011 |
| JP | 2011-228695 A | 11/2011 |
| JP | 2012-049514 A | 3/2012 |
| JP | 2012-216776 A | 11/2012 |
| JP | 2012-248829 A | 12/2012 |
| JP | 2013-033923 A | 2/2013 |
| JP | 2013-080918 A | 5/2013 |
| JP | 2013-251534 A | 12/2013 |
| JP | 2014-003280 A | 1/2014 |
| JP | 2014-007381 A | 1/2014 |
| JP | 2014-007393 A | 1/2014 |
| JP | 2014-029994 A | 2/2014 |
| JP | 2014-187181 A | 10/2014 |
| JP | 2014-199921 A | 10/2014 |
| JP | 2014-199924 A | 10/2014 |
| JP | 2014-212191 A | 11/2014 |
| JP | 2014-232869 A | 12/2014 |
| JP | 2014-232870 A | 12/2014 |
| JP | 2015-216282 A | 12/2015 |
| KR | 2012-0117723 A | 10/2012 |
| KR | 2013-0032304 A | 4/2013 |
| KR | 2013-0122554 A | 11/2013 |
| KR | 2014-0001117 A | 1/2014 |
| KR | 2014-0131264 A | 11/2014 |
| KR | 2014-0136381 A | 11/2014 |
| TW | 201140809 | 11/2011 |
| TW | 201214705 | 4/2012 |
| TW | 201343881 | 11/2013 |
| TW | 201347197 | 11/2013 |
| TW | 201403758 | 1/2014 |
| TW | 201417291 | 5/2014 |
| TW | 201448230 | 12/2014 |
| TW | 201501311 | 1/2015 |
| WO | WO-2004/114391 | 12/2004 |
| WO | WO-2006/036671 | 4/2006 |
| WO | WO-2011/010543 | 1/2011 |
| WO | WO-2011/033936 | 3/2011 |
| WO | WO-2011/068028 | 6/2011 |
| WO | WO-2011/077946 | 6/2011 |
| WO | WO-2011/122364 | 10/2011 |
| WO | WO-2013/042696 | 3/2013 |
| WO | WO-2014/039325 | 3/2014 |
| WO | WO-2014/142333 | 9/2014 |
| WO | WO-2014/178335 | 11/2014 |
| WO | WO-2014/188982 | 11/2014 |

OTHER PUBLICATIONS

Yagishita.A et al., "High Performance Damascene Metal Gate MOSFET's for 0.1 μm Regime", IEEE Transactions on Electron Devices, May 1, 2000, vol. 47, No. 5, pp. 1028-1034.

Hisamoto.D et al., "FinFET.A Self-Aligned Double-Gate MOSFET Scalable to 20 nm", IEEE Transactions on Electron Devices, Dec. 1, 2000, vol. 47, No. 12, pp. 2320-2325.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel, $YbFe_2O_4$, and $Yb_2Fe_3O_7$ Types of Structures for Compounds in the $In_2O_3$ and $Sc_2O_3$—$A_2O_3$—BO Systems [A; Fe, Ga, or Al; B: Mg, Mn, Fe, Ni, Cu, or Zn] at Temperatures Over 1000° C", Journal of Solid State Chemistry, 1985, vol. 60, pp. 382-384.

Nakamura.M et al., "The phase relations in the $In_2O_3$—$Ga_2ZnO_4$—ZnO system at 1350° C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing $MOO_3$ as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper: Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

(56) References Cited

OTHER PUBLICATIONS

Park.S et al., "Challenge to Future Displays: Transparent AM-OLED Driven by Peald Grown ZnO TFT", IMID '07 DIGEST, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-

(56) References Cited

OTHER PUBLICATIONS

FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

International Search Report (Application No. PCT/IB2016/050183) Dated May 10, 2016.

Written Opinion (Application No. PCT/IB2016/050183) Dated May 10, 2016.

Ytterdal.T et al., "MOSFET Device Physics and Operation", Device Modeling for Analog and RF CMOS Circuit Design, Mar. 18, 2003, pp. 1-45, John Wiley & Sons, Ltd.

Taiwanese Office Action (Application No. 108102075) Dated Jun. 15, 2021.

Taiwanese Office Action (Application No. 105102135) Dated Jun. 18, 2021.

Taiwanese Office Action (Application No. 110148761) Dated Apr. 17, 2023.

\* cited by examiner 121, 122, 130b

FIG. 23A
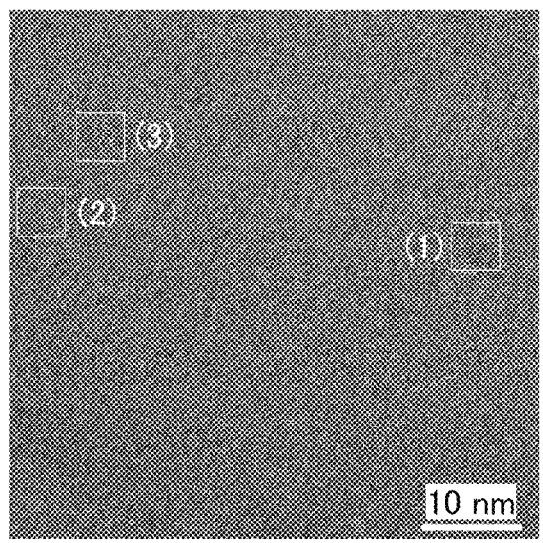
FIG. 23B  FIG. 23C  FIG. 23D
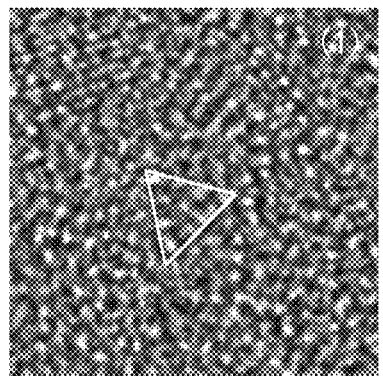 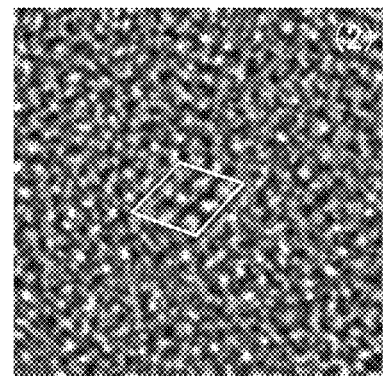 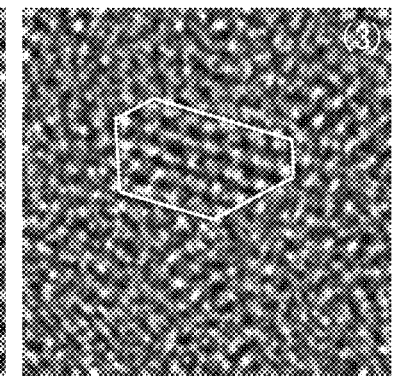

FIG. 24A out-of-plane method CAAC-OS
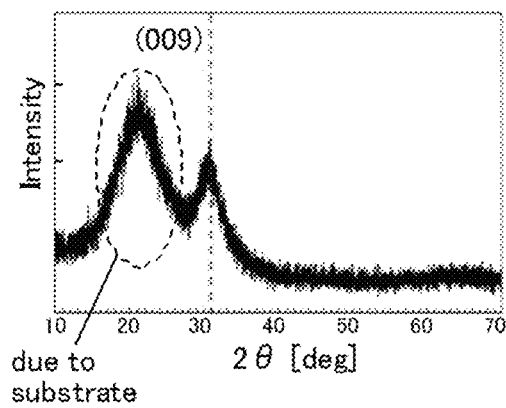
due to substrate
FIG. 24B
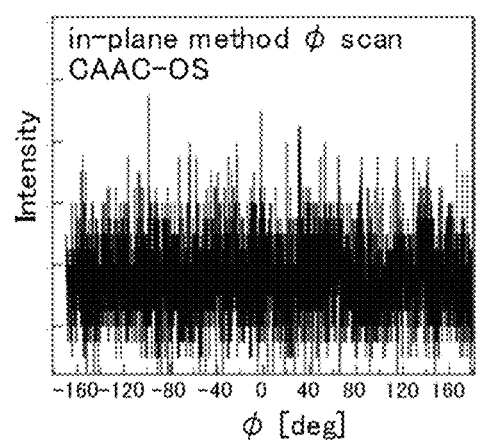
FIG. 24C in-plane method φ scan single crystal OS
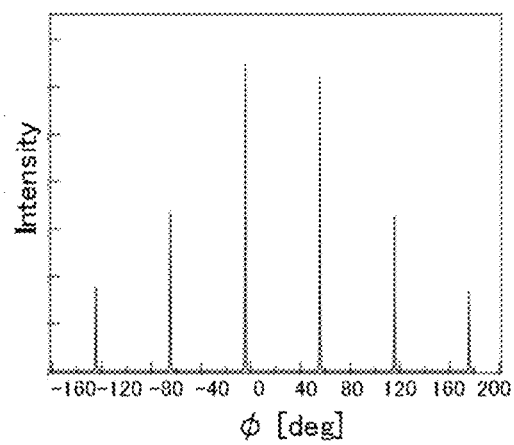

electron beam is in incident on
CAAC-OS in direction
parallel
to sample surface electron beam is in incident on
CAAC-OS in direction
perpendicular
to sample surface Condition 1

Condition 4

Condition 2

Condition 5

Condition 3

Condition 6

Condition 2

Condition 5

Condition 4

Condition 6

SEMICONDUCTOR DEVICE AND MANUFACTURING METHOD THEREOF

CROSS-REFERENCE TO RELATED APPLICATIONS

This application is a continuation of U.S. application Ser. No. 16/378,622, filed Apr. 9, 2019, now allowed, which is a continuation of U.S. application Ser. No. 15/959,548, filed Apr. 23, 2018, now abandoned, which is a continuation of U.S. application Ser. No. 14/995,562, filed Jan. 14, 2016, now U.S. Pat. No. 9,954,112, which claims the benefit of foreign priority applications filed in Japan on Jan. 26, 2015, as Japanese Patent Application Serial Nos. 2015-012713 and 2015-012718, on Feb. 27, 2015, as Japanese Patent Application Serial No. 2015-039161, on Mar. 3, 2015, as Japanese Patent Application Serial No. 2015-041682, on Mar. 10, 2015, as Japanese Patent Application Serial No. 2015-046870, and on Mar. 17, 2015, as Japanese Patent Application Serial No. 2015-053100, all of which are incorporated by reference.

TECHNICAL FIELD

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, an imaging device, a driving method thereof, or a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, or an electronic device includes a semiconductor device.

BACKGROUND ART

A technique by which a transistor is formed using a semiconductor film formed over a substrate having an insulating surface has been attracting attention. The transistor is used in a wide range of electronic devices such as an integrated circuit (IC) or an image display device (display device). A silicon-based semiconductor material is widely known as a material for a semiconductor thin film that can be used for a transistor. As another material, an oxide semiconductor has been attracting attention.

For example, a transistor whose active layer includes an amorphous oxide semiconductor containing indium (In), gallium (Ga), and zinc (Zn) is disclosed in Patent Document 1.

REFERENCE

Patent Document

[Patent Document 1] Japanese Published Patent Application No. 2006-165528

DISCLOSURE OF INVENTION

In miniaturization of a semiconductor element, the parasitic capacitance of a transistor is a major problem.

In the case where parasitic capacitance exists in a channel (e.g., between a source electrode and a drain electrode) and the vicinity of the channel, a time for charging the parasitic capacitance is needed in the transistor operation; thus, not only the responsiveness of the transistor but the responsiveness of the semiconductor device is lowered.

It becomes more difficult to control various steps of manufacturing transistors (in particular, film formation, processing, and the like) as the miniaturization advances, and variations in the shapes of the transistors significantly affect transistor characteristics and reliability.

Thus, an object of one embodiment of the present invention is to reduce the parasitic capacitance of a transistor. Another object is to provide a semiconductor device with favorable electrical characteristics. Another object is to provide a highly reliable semiconductor device. Another object is to reduce variations in characteristics caused by manufacturing steps of a transistor or a semiconductor device. Another object is to provide a semiconductor device including an oxide semiconductor layer having few oxygen vacancies. Another object is to provide a semiconductor device that can be manufactured in a simple process. Another object is to provide a semiconductor device with a structure in which the density of interface states in the vicinity of the oxide semiconductor layer can be reduced. Another object is to provide a semiconductor device with low power consumption. Another object is to provide a novel semiconductor device or the like. Another object is to provide a manufacturing method of the semiconductor device.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first insulating layer, a first oxide insulating layer over the first insulating layer, an oxide semiconductor layer over the first oxide insulating layer, a source electrode layer and a drain electrode layer over the oxide semiconductor layer, a second insulating layer over the first insulating layer, the source electrode layer, the drain electrode layer, and the oxide semiconductor layer, a second oxide insulating layer over the oxide semiconductor layer, a gate insulating layer over the second oxide insulating layer, a gate electrode layer over the gate insulating layer, and a third insulating layer over the second insulating layer, the second oxide insulating layer, the gate insulating layer, and the gate electrode layer. A side surface portion of the second insulating layer is in contact with the second oxide insulating layer. The gate electrode layer includes a first region and a second region that have different widths. The first region is located over the second region. The first region has a width larger than that of the second region.

In addition, in the gate electrode layer, a side surface portion of the gate electrode layer includes at least one inflection point in a cross section parallel to a thickness direction of the gate electrode layer.

In addition, in the gate electrode layer, a side surface portion of the first region extends beyond a tangent of a side surface portion of the second region.

In addition, the side surface portion of the gate electrode layer includes two or more taper angles.

Another embodiment of the present invention is a semiconductor device including a first insulating layer, a first oxide insulating layer over the first insulating layer, an oxide semiconductor layer over the first oxide insulating layer, a source electrode layer and a drain electrode layer over the oxide semiconductor layer, a second insulating layer over the first insulating layer, the source electrode layer, the drain electrode layer, and the oxide semiconductor layer, a second oxide insulating layer over the oxide semiconductor layer, a gate insulating layer over the second oxide insulating layer, a gate electrode layer over the gate insulating layer, and a third insulating layer over the second insulating layer, the second oxide insulating layer, the gate insulating layer, and the gate electrode layer. A side surface portion of the second insulating layer is in contact with the second oxide insulating layer. The gate electrode layer includes a first region, a second region, and a third region that have different widths. The first region is located over the second region and the third region. The second region is located over the third region. The third region has a width larger than that in a lower portion of the second region.

In addition, a side surface portion of the first region or the third region of the gate electrode layer preferably extends beyond a tangent formed in the second region of the gate electrode layer.

In addition, a side surface portion of the gate electrode layer preferably includes two or more inflection points.

In addition, the side surface portion of the gate electrode layer preferably includes three or more taper angles.

Another embodiment of the present invention is a method for manufacturing a semiconductor device including the steps of forming a first insulating layer, forming a first oxide insulating film over the first insulating layer, forming an oxide semiconductor film over the first oxide insulating film, forming a first conductive film over the oxide semiconductor film, forming a first oxide insulating layer and an oxide semiconductor layer by selectively etching the first oxide insulating film and the oxide semiconductor film using a first resist mask and the first conductive film, forming a second insulating film over the first insulating layer and the first conductive film, forming a second insulating layer by performing planarization treatment on the second insulating film, forming a groove by selectively etching the second insulating layer using a second resist mask, forming a source electrode layer and a drain electrode layer by selectively etching the first conductive film using the second resist mask and the second insulating layer, forming a second oxide insulating film over the second insulating layer and the oxide semiconductor layer, forming a third insulating film over the second oxide insulating film, forming a second conductive film over the third insulating film, forming a second oxide insulating layer, a gate insulating layer, and a gate electrode layer by performing planarization treatment on the second conductive film, the third insulating film, and the second oxide insulating film, and forming a fourth insulating layer over the second oxide insulating layer, the gate insulating layer, and the gate electrode layer.

In addition, at the time of forming the groove, it is preferable that the shape of the second resist mask be changed to form a third resist mask protruding from the side surface portion of the second insulating layer, the second insulating layer be selectively etched using the third resist mask, and the side surface portion of the second insulating layer have one or more inflection points in a cross section parallel to a thickness direction of the gate electrode layer.

Another embodiment of the present invention is a method for manufacturing a semiconductor device including the steps of forming a first insulating layer, forming a first oxide insulating film over the first insulating layer, forming an oxide semiconductor film over the first oxide insulating film, forming a first conductive film over the oxide semiconductor film, forming a first oxide insulating layer and an oxide semiconductor layer by selectively etching the first oxide insulating film and the oxide semiconductor film using a first resist mask and the first conductive film, forming a second insulating film over the first insulating layer and the first conductive film, forming a second insulating layer by performing planarization treatment on the second insulating film, forming a groove by selectively etching the second insulating layer using a second resist mask, selectively etching the first conductive film using the second resist mask and the second insulating layer, forming a source electrode layer and a drain electrode layer such that a distance between the source and drain electrode layers is larger than a width between lower ends of side surfaces of the second insulating layer by etching the first conductive film in a direction substantially perpendicular to a substrate surface, forming a second oxide insulating film to be in contact with a top surface of the oxide semiconductor layer, part of a top surface, a side surface portion, and a bottom surface of the second insulating layer, the source electrode layer, and the drain electrode layer, forming a third insulating film over the second oxide insulating film, forming a second conductive film over the third insulating film, forming a second oxide insulating layer, a gate insulating layer, and a gate electrode layer by performing planarization treatment on the second conductive film, the third insulating film, and the second oxide insulating film, and forming a fourth insulating layer over the second oxide insulating layer, the gate insulating layer, and the gate electrode layer.

In addition, at the time of forming the groove, it is preferable that the shape of the second resist mask be changed to form a third resist mask protruding from the side surface portion of the second insulating layer, the second insulating layer be selectively etched using the third resist mask, and the side surface portion of the second insulating layer have one or more inflection points in a cross section parallel to a thickness direction of the gate electrode layer.

Any of the aforementioned semiconductor devices can be combined with a microphone, a speaker, and a housing.

According to one embodiment of the present invention, the parasitic capacitance of a transistor can be reduced. Alternatively, a semiconductor device with favorable electrical characteristics can be provided. Alternatively, a highly reliable semiconductor device can be provided. Alternatively, variations in characteristics caused by manufacturing steps of a transistor or a semiconductor device can be reduced. Alternatively, a semiconductor device including an oxide semiconductor layer having few oxygen vacancies can be provided. Alternatively, a semiconductor device that can be manufactured in a simple process can be provided. Alternatively, a semiconductor device with a structure in which the density of interface states in the vicinity of the oxide semiconductor layer can be reduced can be provided. Alternatively, a semiconductor device with low power consumption can be provided. Alternatively, a novel semiconductor device or the like can be provided. Alternatively, a manufacturing method of the semiconductor device can be provided.

Note that the description of these effects does not disturb the existence of other effects. One embodiment of the present invention does not necessarily have all the effects listed above. Other effects will be apparent from and can be derived from the description of the specification, the drawings, the claims, and the like.

BRIEF DESCRIPTION OF DRAWINGS

In the accompanying drawings:

FIGS. 23A to 23D are Cs-corrected high-resolution TEM images of a plane of a CAAC-OS;

FIGS. 24A to 24C show structural analysis of a CAAC-OS and a single crystal oxide semiconductor by XRD;

BEST MODE FOR CARRYING OUT THE INVENTION

Figure 1A:
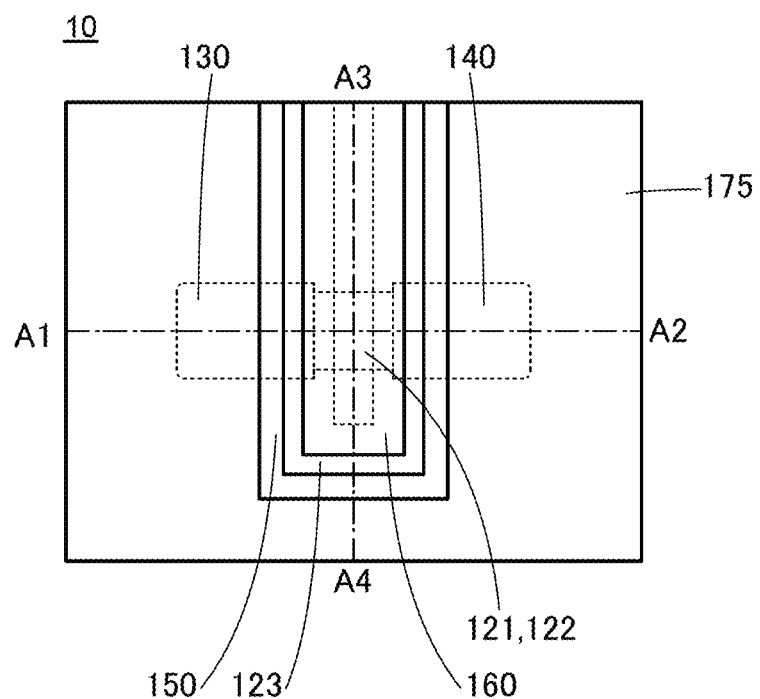
FIGS. 1A and 1B are a top view and a cross-sectional view illustrating a transistor.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. In structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, each of X and Y denotes an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; or a control circuit) can be connected between X and Y. Note that for example, in the case where a signal output from X is transmitted to Y even when another circuit is provided between X and Y, X and Y are functionally connected. The case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected."

For example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are connected in that order." When the connection order in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path." Still another example of the expressions is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, the term "electrical connection" in this specification also means such a case where one conductive film has functions of a plurality of components.

<Notes on the Description for Drawings>

In this specification, terms for describing arrangement, such as "over" and "under", are used for convenience to describe a positional relation between components with reference to drawings. Furthermore, the positional relation between components is changed as appropriate in accordance with a direction in which each component is described. Thus, there is no limitation on terms used in this specification, and description can be made appropriately depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings.

In drawings such as plan views (also referred to as layout views) and perspective views, some of components might not be illustrated for clarity of the drawings.

The expression "being the same" may refer to having the same area or having the same shape. In addition, the expression "being the same" include a case of "being substantially the same" because a manufacturing process might cause some differences.

<Notes on Expressions that can be Rephrased>

In this specification and the like, in describing connections of a transistor, expressions "one of a source and a drain" (or a first electrode or a first terminal) and "the other of the source and the drain" (or a second electrode or a second terminal) are used. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of the component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source.

Since the source and the drain of the transistor change depending on the structure, operating conditions, and the like of the transistor, it is difficult to define which is a source or a drain. Thus, a portion that functions as a source or a portion is not referred to as a source or a drain in some cases. In that case, one of the source and the drain might be referred to as a first electrode, and the other of the source and the drain might be referred to as a second electrode.

In this specification, ordinal numbers such as first, second, and third are used to avoid confusion among components, and thus do not limit the number of the components.

In this specification and the like, a structure in which a flexible printed circuit (FPC), a tape carrier package (TCP), or the like is attached to a substrate of a display panel, or a structure in which an integrated circuit (IC) is directly mounted on a substrate by a chip on glass (COG) method is referred to as a display device in some cases.

Note that the terms "film" and "layer" can be interchanged with each other depending on the case or circumstances. For example, the term "conductive layer" can be changed into the term "conductive film" in some cases. In addition, the term "insulating film" can be changed into the term "insulating layer" in some cases.

Notes on Definitions of Terms

Definitions of terms that are not mentioned in the above embodiments are described below.

In this specification, the term "trench" or "groove" refers to a depression with a narrow belt shape.

In addition, the term "inflection point" refers to a point at which the direction of a tangent is changed when the tangent is drawn at one point of a side surface portion of a structure including a "film" and a "layer".

Moreover, in this specification, an angle formed by a plane which is parallel to a substrate and a side surface portion of an object is referred to as a taper angle.

<Connection>

In this specification, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Embodiment 1

In this embodiment, a semiconductor device of one embodiment of the present invention and a manufacturing method of the semiconductor device are described with reference to drawings.

Figure 1B:
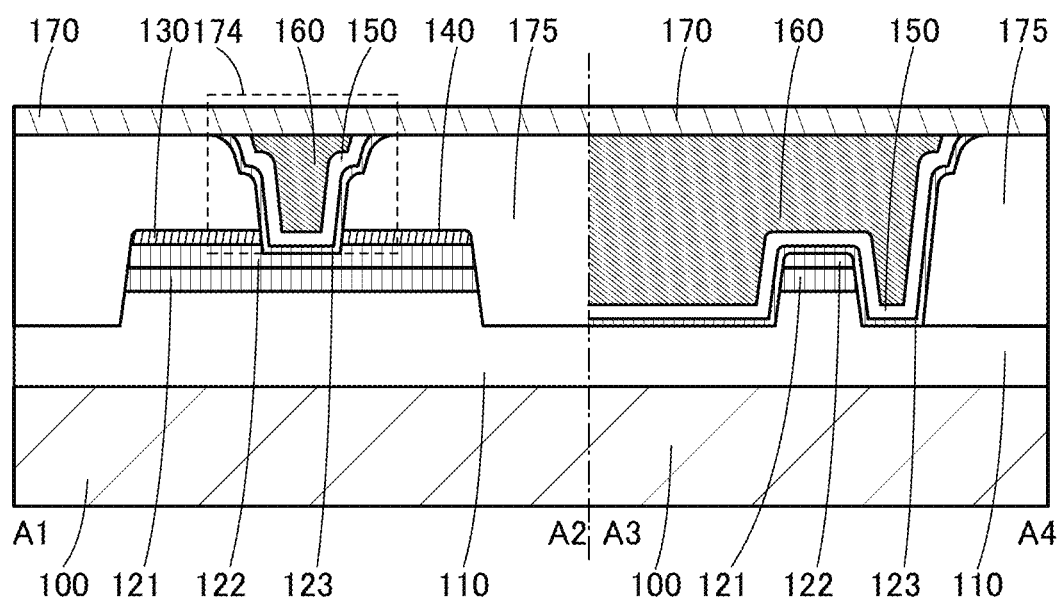

FIGS. 1A and 1B are a top view and a cross-sectional view which illustrate a transistor 10 of one embodiment of the present invention. FIG. 1A is a top view and FIG. 1B is a cross-sectional view taken along dashed-dotted line A1-A2 and dashed-dotted line A3-A4 in FIG. 1A. In FIG. 1A, some components are scaled up or down or omitted for easy understanding. In some cases, the direction of the dashed-dotted line A1-A2 is referred to as a channel length direction, and the direction of the dashed-dotted line A3-A4 is referred to as a channel width direction.

The transistor 10 includes a substrate 100, an insulating layer 110, an oxide insulating layer 121, an oxide semiconductor layer 122, an oxide insulating layer 123, a source electrode layer 130, a drain electrode layer 140, a gate insulating layer 150, a gate electrode layer 160, an insulating layer 175, and an insulating layer 170. The insulating layer 110 is formed over the substrate 100. The oxide insulating layer 121 is formed over the insulating layer 110. The oxide semiconductor layer 122 is formed over the oxide insulating layer 121. The source electrode layer 130 and the drain electrode layer 140 are formed over and electrically connected to the oxide semiconductor layer 122. The insulating layer 175 is formed over the insulating layer 110, the source electrode layer 130, and the drain electrode layer 140, and is in contact with side surface portions of the oxide insulating layer 121 and the oxide semiconductor layer 122. The oxide insulating layer 123 is formed over the oxide semiconductor layer 122. In addition, the oxide insulating layer 123 is in contact with side surfaces of the insulating layer 175, the source electrode layer 130, and the drain electrode layer 140. The gate insulating layer 150 is formed over the oxide insulating layer 123. The gate electrode layer 160 is formed over the gate insulating layer 150. The insulating layer 170 is formed over the gate electrode layer 160, the gate insulating layer 150, the oxide insulating layer 123, and the insulating layer 175.

<Oxide Insulating Layer>

An oxide insulating layer (e.g., the oxide insulating layer 121 and the oxide insulating layer 123) refers to a layer which basically has an insulating property and in which current can flow through the interface with the semiconductor layer and the vicinity thereof when a gate electric field or a drain electric field is increased.

Although the gate electrode layer 160 is a single layer in FIG. 1B, it may be a stacked layer of a gate electrode layer 161 and a gate electrode layer 162, which will be described in Embodiment 2. In the transistor 10, end portions of the oxide insulating layer 123 and the gate insulating layer 150 are located on the outer side of the gate electrode layer 160. In addition, an insulating layer formed using an oxide may be provided over the insulating layer 170. The insulating layer is provided as needed and another insulating layer may be further provided thereover. The structure described here has a high heat dissipation effect: heat generated in the oxide insulating layer 121, the oxide semiconductor layer 122, and the oxide insulating layer 123 by the operation of the transistor 10 can be sufficiently released because the oxide semiconductor layer 122 and the oxide insulating layer 123 are in contact with the source electrode layer 130 and the drain electrode layer 140.

In the transistor 10, in the channel width direction, the gate electrode layer 160 faces the side surfaces of the oxide insulating layer 121, the oxide semiconductor layer 122, and the oxide insulating layer 123 with the gate insulating layer 150 provided therebetween as illustrated in the cross-sectional view taken along line A3-A4 in FIG. 1B. That is, the oxide insulating layer 121, the oxide semiconductor layer 122, and the oxide insulating layer 123 are surrounded by the electric field of the gate electrode layer 160 in the channel width direction when voltage is applied to the gate electrode layer 160. The transistor structure in which a semiconductor layer is surrounded by the electric field of the gate electrode layer 160 is referred to as a surrounded channel (s-channel) structure. Furthermore, the gate electrode, the source electrode, and the drain electrode of the transistor 10 can be formed in a self-aligned manner; thus, alignment accuracy can be improved and miniaturized transistors can be easily manufactured. Note that such a structure is referred to as a self-aligned (SA) s-channel FET structure, a trench-gate s-channel FET structure, a trench-gate self-aligned (TGSA) s-channel FET structure, or a gate-last s-channel FET structure.

Here, the oxide insulating layer 121, the oxide semiconductor layer 122, and the oxide insulating layer 123 are collectively referred to as an oxide semiconductor layer 120. When a transistor having the SA s-channel structure (SA s-channel transistor) is in an on state, a channel is formed in the entire oxide semiconductor layer 120 (bulk), so that the on-state current increases. When the SA s-channel transistor is in an off state, the entire channel region formed in the oxide semiconductor layer 120 is depleted; as a result, the off-state current can be further reduced.

Figure 2:
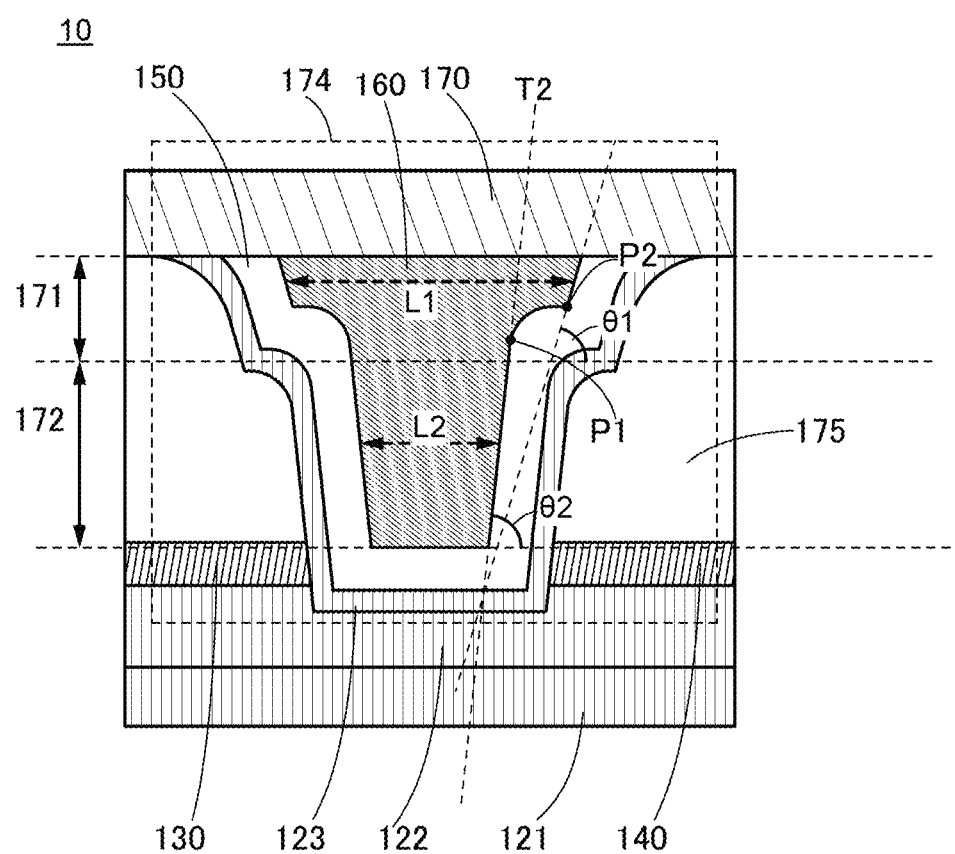
FIG. 2 is an enlarged cross-sectional view of a transistor.

FIG. 2 is an enlarged view of the transistor 10. The transistor 10 includes the oxide insulating layer 123, the gate insulating layer 150, and the gate electrode layer 160 in a groove portion 174. The gate electrode layer 160 has a first region 171 and a second region 172 that have different widths in a cross section of the groove portion 174 in the channel length direction. A width L1 in the first region 171 is larger than a width L2 in the second region 172. Note that the first region 171 is located over the second region 172.

In the case where an angle formed by a plane which is parallel to a substrate and a side surface portion of the gate electrode layer 160 is referred to as a taper angle, the side surface portion of the gate electrode layer 160 of the transistor 10 has a first taper angle θ1 in the first region 171 and a second taper angle θ2 in the second region 172. In addition, the cross section of the gate electrode layer 160 has two inflection points (an inflection point P1 and an inflection point P2) at which the curvature of the side surface portion is changed. Moreover, the side surface portion of the first region 171 of the gate electrode layer 160 extends beyond a tangent T2 of the side surface portion of the second region 172.

With such a structure, when the oxide insulating layer 123, the gate insulating layer 150, and the gate electrode layer 160 are formed in the groove portion 174, the embeddability of each film can be improved, and the transistor 10 can be easily manufactured.

In addition, the transistor 10 has the SA s-channel structure, whereby parasitic capacitance generated between the gate electrode and the source electrode or between the gate electrode and the drain electrode is reduced, and the cut-off frequency characteristics of the transistor 10 are improved. That is, high-speed response of the transistor 10 can be achieved.

Note that the top surface of the source electrode layer 130 or the drain electrode layer 140 may be located under, over, or at the same level as the bottom surface of the gate electrode layer 160.

<Channel Length>

Note that the channel length refers to, for example, a distance between a source (a source region or a source electrode) and a drain (a drain region or a drain electrode) in a region where a semiconductor (or a portion where current flows in a semiconductor when a transistor is on) and a gate electrode overlap with each other or a region where a channel is formed in a top view of the transistor. In one transistor, channel lengths in all regions are not necessarily the same value. In other words, the channel length of one transistor is not fixed to one value in some cases. Therefore, in this specification, the channel length is any one of values, the maximum value, the minimum value, or the average value in a region where a channel is formed.

<Channel Width>

Note that the channel width refers to, for example, the length of a region where a semiconductor (or a portion where current flows in a semiconductor when a transistor is on) and a gate electrode overlap with each other. In one transistor, channel widths in all regions are not necessarily the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, without accurate information on the shape of a semiconductor, it is difficult to measure an effective channel width accurately.

<SCW>

Therefore, in this specification, in a top view of a transistor, an apparent channel width in a region where a semiconductor and a gate electrode overlap with each other is referred to as a surrounded channel width (SCW) in some cases. Further, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from the value obtained by calculation using an effective channel width is obtained in some cases.

<Improvement of Characteristics in Miniaturization>

High integration of a semiconductor device requires miniaturization of a transistor. However, it is known that miniaturization of a transistor causes deterioration of electrical characteristics of the transistor. A decrease in channel width causes a reduction in on-state current.

In the transistor of one embodiment of the present invention shown in FIGS. 1A and 1B, for example, as described above, the oxide insulating layer 123 is formed so as to cover the oxide semiconductor layer 122 where a channel is formed and the channel formation layer and the gate insulating layer are not in contact with each other. Accordingly, scattering of carriers at the interface between the channel formation layer and the gate insulating layer can be reduced and the on-state current of the transistor can be increased.

In the transistor of one embodiment of the present invention, the gate electrode layer 160 is formed to electrically surround the oxide semiconductor layer 122, which is to be a channel, in the channel width direction; accordingly, a gate electric field is applied to the oxide semiconductor layer 122 in the side surface direction in addition to the perpendicular direction. In other words, a gate electric field is applied to the oxide semiconductor layer entirely, so that current flows in the whole of the oxide semiconductor layer 122, leading to a further increase in on-state current.

In the transistor of one embodiment of the present invention, the oxide insulating layer 123 is formed over the oxide insulating layer 121 and the oxide semiconductor layer 122, so that an interface state is less likely to be formed. In addition, impurities do not enter the oxide semiconductor layer 122 from above and below because the oxide insulating layer 121 is positioned between the insulating layer 110 and the oxide semiconductor layer 122 and the oxide insulating layer 123 is positioned between the gate insulating layer 150 and the oxide semiconductor layer 122. Therefore, the transistor can achieve not only the increase in the on-state current of the transistor but also stabilization of the threshold voltage and a reduction in the S value (subthreshold value). Thus, Icut (current when gate voltage VG is 0 V)

can be reduced and power consumption can be reduced. Further, since the threshold voltage of the transistor becomes stable, long-term reliability of the semiconductor device can be improved.

Although an example where a channel or the like is formed in the oxide semiconductor layer 120 or the like is described in this embodiment, one embodiment of the present invention is not limited thereto. For example, depending on cases or conditions, a channel, the vicinity of the channel, a source region, a drain region, or the like may be formed using a material containing silicon (including strained silicon), germanium, silicon germanium, silicon carbide, gallium arsenide, aluminum gallium arsenide, indium phosphide, gallium nitride, an organic semiconductor, or the like.

<Structure of Transistor>

A structure of a transistor of this embodiment will be described.

<<Substrate 100>>

A glass substrate, a ceramic substrate, a quartz substrate, a sapphire substrate, or the like can be used as the substrate 100. Alternatively, a single crystal semiconductor substrate or a polycrystalline semiconductor substrate of silicon or silicon carbide, a compound semiconductor substrate of silicon germanium, a silicon on insulator (SOI) substrate, or the like can be used. Still alternatively, any of these substrates provided with a semiconductor element may be used. The substrate 100 is not limited to a simple supporting substrate, and may be a substrate where a device such as a transistor is formed. In that case, one of the gate electrode layer 160, the source electrode layer 130, and the drain electrode layer 140 of the transistor may be electrically connected to the device.

Alternatively, a flexible substrate may be used as the substrate 100. As a method for providing the transistor over a flexible substrate, there is a method in which the transistor is formed over a non-flexible substrate and then the transistor is separated and transferred to the substrate 100 that is a flexible substrate. In that case, a separation layer is preferably provided between the non-flexible substrate and the transistor. As the substrate 100, a sheet, a film, or a foil containing a fiber may be used. The substrate 100 may have elasticity. The substrate 100 may have a property of returning to its original shape when bending or pulling is stopped. Alternatively, the substrate 100 may have a property of not returning to its original shape. The thickness of the substrate 100 is, for example, greater than or equal to 5 μm and less than or equal to 700 μm, preferably greater than or equal to 10 μm and less than or equal to 500 μm, or further preferably greater than or equal to 15 μm and less than or equal to 300 μm. When the substrate 100 has a small thickness, the weight of the semiconductor device can be reduced. When the substrate 100 has a small thickness, even in the case of using glass or the like, the substrate 100 may have elasticity or a property of returning to its original shape when bending or pulling is stopped. Therefore, an impact applied to the semiconductor device over the substrate 100, which is caused by dropping or the like, can be reduced. That is, a durable semiconductor device can be provided.

For the substrate 100 which is a flexible substrate, metal, an alloy, resin, glass, or fiber thereof can be used, for example. The flexible substrate 100 preferably has a lower coefficient of linear expansion because deformation due to an environment is suppressed. The flexible substrate 100 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate 100 because of its low coefficient of linear expansion.

<<Insulating Layer 110>>

The insulating layer 110 can have a function of supplying oxygen to the oxide semiconductor layer 120 as well as a function of preventing diffusion of impurities from the substrate 100. For this reason, the insulating layer 110 is preferably an insulating film containing oxygen, further preferably an insulating film having an oxygen content higher than that in the stoichiometric composition. For example, the insulating layer 110 is a film of which the amount of released oxygen when converted into oxygen atoms is $1.0\times10^{19}$ atoms/cm$^3$ or more in TDS analysis. Note that the temperature of the film surface in the TDS analysis is preferably higher than or equal to 100° C. and lower than or equal to 700° C., or higher than or equal to 100° C. and lower than or equal to 500° C. In the case where the substrate 100 is provided with another device as described above, the insulating layer 110 also has a function of an interlayer insulating film. In that case, the insulating layer 110 is preferably subjected to planarization treatment such as chemical mechanical polishing (CMP) treatment so as to have a flat surface.

<<Oxide Insulating Layer 121, Oxide Semiconductor Layer 122, and Oxide Insulating Layer 123>>

The oxide semiconductor layer 122 is an oxide semiconductor film containing In or Zn and typically contains In—Ga oxide, In—Zn oxide, In—Mg oxide, Zn—Mg oxide, or an In-M-Zn oxide (M is Al, Ti, Ga, Y, Zr, Sn, La, Ce, Mg, Hf, or Nd).

An oxide that can be used for each of the oxide insulating layer 121, the oxide semiconductor layer 122, and the oxide insulating layer 123 preferably contains at least indium (In) or zinc (Zn). Alternatively, both In and Zn are preferably contained. In order to reduce variations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

Note that in the case where the oxide semiconductor layer 122 is an In-M-Zn oxide, the atomic percentage of In may be greater than or equal to 50 atomic % and the atomic percentage of M may be less than 50 atomic %, when the summation of In and M is assumed to be 100 atomic %.

The indium and gallium contents in the oxide semiconductor layer 122 can be compared with each other by time-of-flight secondary ion mass spectrometry (TOF-SIMS), X-ray photoelectron spectrometry (XPS), or inductively coupled plasma mass spectrometry (ICP-MS).

Since the oxide semiconductor layer 122 has an energy gap of 2 eV or more, preferably 2.5 eV or more, further preferably 3 eV or more, the off-state current of the transistor 10 can be low.

The thickness of the oxide semiconductor layer 122 is greater than or equal to 3 nm and less than or equal to 200 nm, preferably greater than or equal to 3 nm and less than or equal to 100 nm, further preferably greater than or equal to 3 nm and less than or equal to 50 nm.

The oxide insulating layer 121 and the oxide insulating layer 123 each contain one or more elements contained in the oxide semiconductor layer 122. Thus, interface scattering is unlikely to occur at the interfaces between the oxide semiconductor layer 122 and the oxide insulating layer 121 and between the oxide semiconductor layer 122 and the oxide insulating layer 123. The movement of carriers is not hindered at the interfaces accordingly, and the transistor 10 can have high field-effect mobility.

Each of the oxide insulating layers 121 and 123 is typically In—Ga oxide, In—Zn oxide, In—Mg oxide, Ga—Zn oxide, Zn—Mg oxide, or an In-M-Zn oxide (M is Al, Ti, Ga, Y, Zr, Sn, La, Ce, Mg, Hf, or Nd), and has the energy level at the conduction band minimum that is closer to a vacuum level than the energy level at the conduction band minimum of the oxide semiconductor layer 122 is. Typically, a difference between the energy level at the conduction band minimum of the oxide semiconductor layer 122 and the energy level at the conduction band minimum of each of the oxide insulating layers 121 and 123 is greater than or equal to 0.05 eV, greater than or equal to 0.07 eV, greater than or equal to 0.1 eV, or greater than or equal to 0.2 eV and also less than or equal to 2 eV, less than or equal to 1 eV, less than or equal to 0.5 eV, or less than or equal to 0.4 eV. That is, the difference between the electron affinity of the oxide semiconductor layer 122 and the electron affinity of each of the oxide insulating layers 121 and 123 is greater than or equal to 0.05 eV, greater than or equal to 0.07 eV, greater than or equal to 0.1 eV, or greater than or equal to 0.2 eV and also less than or equal to 2 eV, less than or equal to 1 eV, less than or equal to 0.5 eV, or less than or equal to 0.4 eV. Note that the electron affinity refers to an energy difference between the vacuum level and the conduction band minimum.

When the oxide insulating layers 121 and 123 each contain a larger amount of Al, Ti, Ga, Y, Zr, Sn, La, Ce, Mg, Hf, or Nd in an atomic ratio than the amount of In in an atomic ratio, any of the following effects may be obtained.

(1) The energy gap of each of the oxide insulating layers 121 and 123 is widened.
(2) The electron affinity of each of the oxide insulating layers 121 and 123 is reduced.
(3) Impurities from the outside are blocked.
(4) An insulating property of each of the oxide insulating layers 121 and 123 is higher than that of the oxide semiconductor layer 122.
(5) Oxygen vacancies are less likely to be generated in the oxide insulating layers 121 and 123 because Al, Ti, Ga, Y, Zr, Sn, La, Ce, Mg, Hf, and Nd are metal elements that can be strongly bonded to oxygen.

Since the oxide insulating layers 121 and 123 have higher insulating properties than the oxide semiconductor layer 122, they each have a function of a gate insulating film.

In the case where the oxide insulating layers 121 and 123 are each an In-M-Zn oxide, the proportion of In and the proportion of M, not taking Zn and O into consideration, are less than 50 atomic % and greater than or equal to 50 atomic %, respectively, and preferably less than 25 atomic % and greater than or equal to 75 atomic %, respectively.

Further, in the case where the oxide insulating layers 121 and 123 are each an In-M-Zn oxide (M is Al, Ti, Ga, Y, Zr, Sn, La, Ce, Mg, Hf, or Nd), the proportion of M atoms (M is Al, Ti, Ga, Y, Zr, Sn, La, Ce, Mg, Hf, or Nd) in each of the oxide insulating layers 121 and 123 is higher than that in the oxide semiconductor layer 122. Typically, the proportion of M in each of the oxide insulating layers 121 and 123 is higher than or equal to 1.5 times, preferably higher than or equal to twice, further preferably higher than or equal to three times as high as that in the oxide semiconductor layer 122. Any of the above-described elements represented by M is more strongly bonded to oxygen than indium is, and thus has a function of suppressing generation of oxygen vacancies in the oxide insulating layers 121 and 123. That is, oxygen vacancies are less likely to be generated in the oxide insulating layers 121 and 123 than in the oxide semiconductor layer 122.

The indium content in the oxide semiconductor layer 122 is preferably higher than those in the oxide insulating layers 121 and 123. In an oxide semiconductor, an s orbital of heavy metal mainly contributes to carrier transfer. When the proportion of In in the oxide semiconductor is increased, overlap of s orbitals is likely to be increased. Therefore, an oxide having a composition in which the proportion of In is higher than that of M has higher mobility than an oxide having a composition in which the proportion of In is equal to or lower than that of M. Thus, with the use of an oxide having a high content of indium for the oxide semiconductor layer 122, a transistor having high field-effect mobility can be obtained.

In the case where the oxide semiconductor layer 122 contains an In-M-Zn oxide (M is Al, Ti, Ga, Y, Zr, Sn, La, Ce, Mg, Hf, or Nd) and a target having the atomic ratio of metal elements of In:M:Zn=$x_1$:$y_1$:$z_1$ is used for forming the oxide semiconductor layer 122, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film is easily formed as the oxide semiconductor layer 122. Typical examples of the atomic ratio of metal elements of the target include In:M:Zn=1:1:1, 1:1:1.2, 2:1:1.5, 2:1:2.3, 2:1:3, 3:1:2, 4:2:3, and 4:2:4.1.

The atomic ratio is not limited to those described above, and may be appropriately set in accordance with needed semiconductor characteristics.

In the case where the oxide insulating layers 121 and 123 contain an In-M-Zn oxide (M is Al, Ti, Ga, Y, Zr, Sn, La, Ce, Mg, Hf, or Nd) and a target having the atomic ratio of metal elements of In:M:Zn=$x_2$:$y_2$:$z_2$ is used for forming the oxide insulating layers 121 and 123, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, a CAAC-OS film is easily formed as the oxide insulating layers 121 and 123. Typical examples of the atomic ratio of the metal elements of the target are In:M:Zn=1:3:2, 1:3:4, 1:3:6, 1:3:8, 1:4:4, 1:4:5, 1:4:6, 1:4:7, 1:4:8, 1:5:5, 1:5:6, 1:5:7, 1:5:8, 1:6:8, 1:6:4, and 1:9:6.

In each of the oxide insulating layers 121 and 123, the proportion of each atom in the above-described atomic ratio varies within a range of ±40% as an error.

Alternatively, the oxide insulating layer 123 can be metal oxide, such as aluminum oxide, gallium oxide, hafnium oxide, or zirconia oxide; or the metal oxide may be provided over the oxide insulating layer 123.

The oxide insulating layers 121 and 123 may have the same composition. For example, the oxide insulating layers 121 and 123 may contain an In—Ga—Zn oxide with an atomic ratio of In:Ga:Zn=1:3:2, 1:3:4, or 1:4:5.

Alternatively, the oxide insulating layers 121 and 123 may have different compositions. For example, the oxide insulating layer 121 and the oxide insulating layer 123 may be formed using an In—Ga—Zn oxide with an atomic ratio of In:Ga:Zn=1:3:4 and an In—Ga—Zn oxide with an atomic ratio of In:Ga:Zn=1:3:2, respectively, as targets used in a sputtering method.

The thickness of each of the oxide insulating layer 121, the oxide semiconductor layer 122, and the oxide insulating layer 123 is preferably greater than or equal to 3 nm and less than or equal to 100 nm or greater than or equal to 3 nm and less than or equal to 50 nm.

The thickness of the oxide semiconductor layer 122 may be greater than, equal to, or less than that of at least the oxide insulating layer 121. If the thickness of the oxide semiconductor layer 122 is greater than that of the oxide insulating layer 121, the on-state current of the transistor can be increased. The thickness of the oxide insulating layer 121 may be determined as appropriate as long as formation of an interface state at the interface with the oxide semiconductor layer 122 can be inhibited. For example, the thickness of the oxide semiconductor layer 122 is greater than that of the oxide insulating layer 121, preferably 2 or more times, further preferably 4 or more times, still further preferably 6 or more times as large as that of the oxide insulating layer 121. In the case where there is no need to increase the on-state current of the transistor, the thickness of the oxide insulating layer 121 may be greater than or equal to that of the oxide semiconductor layer 122. If oxygen is added to the insulating layer 110 or the insulating layer 175, oxygen vacancies in the oxide semiconductor layer 122 can be reduced by heat treatment, which leads to stabilization of electrical characteristics of the semiconductor device.

The thickness of the oxide insulating layer 123 may be determined as appropriate, in a manner similar to that of the oxide insulating layer 121, as long as formation of an interface state at the interface with the oxide semiconductor layer 122 is inhibited. For example, the thickness of the oxide insulating layer 123 may be set less than or equal to that of the oxide insulating layer 121. If the thickness of the oxide insulating layer 123 is large, there is a concern that the electric field from the gate electrode layer 160 (or the gate electrode layer 161 and the gate electrode layer 162) cannot reach the oxide semiconductor layer 122. For this reason, the thickness of the oxide insulating layer 123 is preferably small. To prevent oxygen contained in the oxide insulating layer 123 from diffusing to the source and drain electrode layers 130 and 140 and oxidizing the source and drain electrode layers 130 and 140, it is preferable that the thickness of the oxide insulating layer 123 be small. For example, the thickness of the oxide insulating layer 123 is less than that of the oxide semiconductor layer 122. Note that the thickness of the oxide insulating layer 123 is not limited to the above, and may be determined as appropriate in accordance with the driving voltage of the transistor in consideration of the withstand voltage of the gate insulating layer 150.

In the case where the oxide insulating layer 121, the oxide semiconductor layer 122, and the oxide insulating layer 123 have different compositions from one another, the interfaces thereof can be observed by scanning transmission electron microscopy (STEM).

<Hydrogen Concentration>

Hydrogen contained in the oxide insulating layer 121, the oxide semiconductor layer 122, and the oxide insulating layer 123 reacts with oxygen bonded to a metal atom to be water, and in addition, an oxygen vacancy is formed in a lattice from which oxygen is released (or a portion from which oxygen is released). An electron serving as a carrier can be generated due to entry of hydrogen into the oxygen vacancy or due to bonding of part of hydrogen to oxygen bonded to a metal element. Thus, a transistor including an oxide semiconductor which contains hydrogen is likely to be normally on.

Accordingly, it is preferable that hydrogen be reduced as much as possible as well as the oxygen vacancies in the oxide insulating layer 121, the oxide semiconductor layer 122, and the oxide insulating layer 123 and at the interfaces between the oxide insulating layer 121, the oxide semiconductor layer 122, and the oxide insulating layer 123. The concentrations of hydrogen in the oxide insulating layer 121, the oxide semiconductor layer 122, and the oxide insulating layer 123 and at the interfaces between the oxide insulating layer 121, the oxide semiconductor layer 122, and the oxide insulating layer 123, which are obtained by secondary ion mass spectrometry (SIMS), are desirably higher than or equal to $1 \times 10^{16}$ atoms/cm$^3$ and lower than or equal to $2 \times 10^{20}$ atoms/cm$^3$, preferably higher than or equal to $1 \times 10^{16}$ atoms/cm$^3$ and lower than or equal to $5 \times 10^{19}$ atoms/cm$^3$, further preferably higher than or equal to $1 \times 10^{16}$ atoms/cm$^3$ and lower than or equal to $1 \times 10^{19}$ atoms/cm$^3$, still further preferably higher than or equal to $1 \times 10^{16}$ atoms/cm$^3$ and lower than or equal to $5 \times 10^{18}$ atoms/cm$^3$. As a result, the transistor 10 can have positive threshold voltage (normally-off characteristics).

<Concentrations of Carbon and Silicon>

When silicon and carbon, which are elements belonging to Group 14, are contained in the oxide insulating layer 121, the oxide semiconductor layer 122, and the oxide insulating layer 123 and at the interfaces between the oxide insulating layer 121, the oxide semiconductor layer 122, and the oxide insulating layer 123, oxygen vacancies are increased and an n-type region is formed in the oxide insulating layer 121, the oxide semiconductor layer 122, and the oxide insulating layer 123. It is therefore preferable to reduce the concentrations of silicon and carbon in the oxide insulating layer 121, the oxide semiconductor layer 122, and the oxide insulating layer 123 and at the interfaces between the oxide insulating layer 121, the oxide semiconductor layer 122, and the oxide insulating layer 123. The concentrations of silicon and carbon in the oxide insulating layer 121, the oxide semiconductor layer 122, and the oxide insulating layer 123 and at the interfaces between the oxide insulating layer 121, the oxide semiconductor layer 122, and the oxide insulating layer 123, which are obtained by SIMS, are desirably higher than or equal to $1 \times 10^{16}$ atoms/cm$^3$ and lower than or equal to $1 \times 10^{19}$ atoms/cm$^3$, further preferably higher than or equal to $1 \times 10^{16}$ atoms/cm$^3$ and lower than or equal to $5 \times 10^{18}$ atoms/cm$^3$, still further preferably higher than or equal to $1 \times 10^{16}$ atoms/cm$^3$ and lower than or equal to $2 \times 10^{18}$ atoms/cm$^3$. As a result, the transistor 10 can have positive threshold voltage (normally-off characteristics).

<Concentration of Alkali Metal>

Alkali metal and alkaline earth metal can generate carriers when bonded to an oxide semiconductor, which can increase the off-state current of the transistor. It is thus preferable to reduce the concentrations of alkali metal and alkaline earth metal in the oxide insulating layer 121, the oxide semiconductor layer 122, and the oxide insulating layer 123 and at the interfaces between the oxide insulating layer 121, the oxide semiconductor layer 122, and the oxide insulating layer 123. For example, the concentrations of alkali metal and alkaline earth metal in the oxide insulating layer 121, the oxide semiconductor layer 122, and the oxide insulating layer 123 and at the interfaces between the oxide insulating layer 121, the oxide semiconductor layer 122, and the oxide insulating layer 123, which are obtained by SIMS, are preferably lower than or equal to $1\times10^{18}$ atoms/cm$^3$, more preferably lower than or equal to $2\times10^{16}$ atoms/cm$^3$. As a result, the transistor 10 can have positive threshold voltage (normally-off characteristics).

<Concentration of Nitrogen>

When nitrogen is contained in the oxide insulating layer 121, the oxide semiconductor layer 122, and the oxide insulating layer 123 and at the interfaces between the oxide insulating layer 121, the oxide semiconductor layer 122, and the oxide insulating layer 123, an electron serving as a carrier is generated and accordingly carrier density is increased, so that n-type regions are formed. Thus, when an oxide semiconductor contains nitrogen, a transistor including the oxide semiconductor is likely to be normally on. Thus, it is preferable that nitrogen be reduced as much as possible in the oxide insulating layer 121, the oxide semiconductor layer 122, and the oxide insulating layer 123 and at the interfaces between the oxide insulating layer 121, the oxide semiconductor layer 122, and the oxide insulating layer 123. For example, the concentrations of nitrogen in the oxide insulating layer 121, the oxide semiconductor layer 122, and the oxide insulating layer 123 and at the interfaces between the oxide insulating layer 121, the oxide semiconductor layer 122, and the oxide insulating layer 123, which are obtained by SIMS, are preferably higher than or equal to $1\times10^{15}$ atoms/cm$^3$ and lower than or equal to $5\times10^{19}$ atoms/cm$^3$, further preferably higher than or equal to $1\times10^{15}$ atoms/cm$^3$ and lower than or equal to $5\times10^{18}$ atoms/cm$^3$, still further preferably higher than or equal to $1\times10^{15}$ atoms/cm$^3$ and lower than or equal to $1\times10^{18}$ atoms/cm$^3$, still further preferably higher than or equal to $1\times10^{15}$ atoms/cm$^3$ and lower than or equal to $5\times10^{17}$ atoms/cm$^3$. As a result, the transistor 10 can have positive threshold voltage (normally-off characteristics).

However, in the case where excess zinc exists in the oxide semiconductor layer 122, the concentrations of nitrogen are not limited to the above range. To improve the crystallinity of the oxide semiconductor layer 122, it is effective to increase the content of zinc. However, excess zinc might cause shallow density of defect states (sDOS) in the oxide semiconductor layer 122. In order to increase the content of zinc and reduce the sDOS, the oxide semiconductor layer 122 contains nitrogen at 0.001 atomic % to 3 atomic % because the sDOS caused by excess zinc can be inactivated in some cases. Therefore, the nitrogen can reduce variations in transistor characteristics and can improve the reliability.

<Carrier Density>

The carrier densities of the oxide insulating layer 121, the oxide semiconductor layer 122, and the oxide insulating layer 123 can be lowered by reduction in impurities in the oxide insulating layer 121, the oxide semiconductor layer 122, and the oxide insulating layer 123. The carrier densities of the oxide insulating layer 121, the oxide semiconductor layer 122, and the oxide insulating layer 123 is $1\times10^{15}$/cm$^3$ or less, preferably $1\times10^{13}$/cm$^3$ or less, further preferably less than $8\times10^{11}$/cm$^3$, still further preferably less than $1\times10^{11}$/cm$^3$, and yet still further preferably less than $1\times10^{10}$/cm$^3$ and $1\times10^{-9}$/cm$^3$ or more.

When an oxide film having a low impurity concentration and a low density of defect states is used as each of the oxide insulating layer 121, the oxide semiconductor layer 122, and the oxide insulating layer 123, a transistor including the oxide semiconductor layers can have more excellent electrical characteristics. Here, the state in which the impurity concentration is low and the density of defect states is low (the amount of oxygen vacancies is small) is described as "highly purified intrinsic" or "substantially highly purified intrinsic." A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). A highly purified intrinsic or substantially highly purified intrinsic oxide semiconductor film has a low density of defect states and accordingly has a low density of trap states in some cases. Further, a highly purified intrinsic or substantially highly purified intrinsic oxide semiconductor film has an extremely low off-state current; the off-state current can be less than or equal to the measurement limit of a semiconductor parameter analyzer, i.e., less than or equal to $1\times10^{-13}$ A, at a voltage between a source electrode and a drain electrode (drain voltage) of from 1 V to 10 V. Thus, the transistor whose channel region is formed in the oxide semiconductor film has a small variation in electrical characteristics and high reliability in some cases.

A transistor in which a highly purified oxide semiconductor film is used for a channel formation region exhibits extremely low off-state current. For example, in the case where the voltage between the source and the drain is set to approximately 0.1 V, 5 V, or 10 V, the off-state current standardized on the channel width of the transistor can be as low as several yoctoamperes per micrometer to several zeptoamperes per micrometer.

The oxide insulating layer 121, the oxide semiconductor layer 122, and the oxide insulating layer 123 may have a non-single crystal structure, for example. The non-single crystal structure includes a CAAC-OS which is described later, a polycrystalline structure, a microcrystalline structure, or an amorphous structure, for example. Among the non-single crystal structure, the amorphous structure has the highest density of defect states, whereas the CAAC-OS has the lowest density of defect states.

The oxide insulating layer 121, the oxide semiconductor layer 122, and the oxide insulating layer 123 may have a microcrystalline structure, for example. The oxide insulating layer 121, the oxide semiconductor layer 122, and the oxide insulating layer 123 which have the microcrystalline structure each include a microcrystal with a size greater than or equal to 1 nm and less than 10 nm, for example. Alternatively, the oxide semiconductor films which have the microcrystalline structure have a mixed phase structure where crystal parts (each of which is greater than or equal to 1 nm and less than 10 nm) are distributed in an amorphous phase.

The oxide insulating layer 121, the oxide semiconductor layer 122, and the oxide insulating layer 123 may have an amorphous structure, for example. The oxide insulating layer 121, the oxide semiconductor layer 122, and the oxide insulating layer 123 which have the amorphous structure each have disordered atomic arrangement and no crystalline component, for example. Alternatively, the oxide semiconductor films which have an amorphous structure have, for example, an absolutely amorphous structure and no crystal part.

Note that the oxide insulating layer 121, the oxide semiconductor layer 122, and the oxide insulating layer 123 may each be a mixed film including regions having two or more of the following structures: a CAAC-OS, a microcrystalline structure, and an amorphous structure. The mixed film, for example, has a single-layer structure including a region having an amorphous structure, a region having a microcrystalline structure, and a region of a CAAC-OS. Alternatively, the mixed film may have a stacked-layer structure including a region having an amorphous structure, a region having a microcrystalline structure, and a region of a CAAC-OS, for example.

Note that the oxide insulating layer 121, the oxide semiconductor layer 122, and the oxide insulating layer 123 may have a single-crystal structure, for example.

By providing an oxide film in which oxygen vacancies are less likely to be generated than in the oxide semiconductor layer 122, over and under and in contact with the oxide semiconductor layer 122, oxygen vacancies in the oxide semiconductor layer 122 can be reduced. Further, since the oxide semiconductor layer 122 is in contact with the oxide insulating layers 121 and 123 containing one or more metal elements forming the oxide semiconductor layer 122, the density of interface states at the interface between the oxide insulating layer 121 and the oxide semiconductor layer 122 and at the interface between the oxide semiconductor layer 122 and the oxide insulating layer 123 is extremely low. For example, after oxygen is added to the oxide insulating layer 121, the oxide insulating layer 123, the gate insulating layer 150, the insulating layer 110, and the insulating layer 175, the oxygen is transferred through the oxide insulating layers 121 and 123 to the oxide semiconductor layer 122 by heat treatment; however, the oxygen is hardly trapped by the interface states at this time, and the oxygen in the oxide insulating layers 121 and 123 can be efficiently transferred to the oxide semiconductor layer 122. Accordingly, oxygen vacancies in the oxide semiconductor layer 122 can be reduced. Since oxygen is added to the oxide insulating layers 121 and 123, oxygen vacancies in the oxide insulating layers 121 and 123 can be reduced. In other words, the density of localized states of at least the oxide semiconductor layer 122 can be reduced.

In addition, when the oxide semiconductor layer 122 is in contact with an insulating film including a different constituent element (e.g., a gate insulating film including a silicon oxide film), an interface state is sometimes formed and the interface state forms a channel. At this time, a second transistor having a different threshold voltage appears, so that an apparent threshold voltage of the transistor is varied. However, since the oxide insulating layers 121 and 123 containing one or more kinds of metal elements forming the oxide semiconductor layer 122 are in contact with the oxide semiconductor layer 122, an interface state is not easily formed at the interfaces between the oxide insulating layer 121 and the oxide semiconductor layer 122 and between the oxide insulating layer 123 and the oxide semiconductor layer 122.

The oxide insulating layers 121 and 123 function as barrier films that prevent constituent elements of the insulating layer 110 and the gate insulating layer 150 from entering the oxide semiconductor layer 122 and forming an impurity state.

For example, in the case of using a silicon-containing insulating film as the insulating layer 110 or the gate insulating layer 150, silicon in the gate insulating layer 150 or carbon which might be contained in the insulating layer 110 or the gate insulating layer 150 enters the oxide insulating layer 121 or 123 to a depth of several nanometers from the interface in some cases. An impurity, such as silicon or carbon, entering the oxide semiconductor layer 122 forms an impurity state. The impurity state serves as a donor to generate an electron; thus, an n-type semiconductor might be formed.

However, when each thickness of the oxide insulating layers 121 and 123 is larger than several nanometers, the impurity such as silicon or carbon does not reach the oxide semiconductor layer 122, so that the influence of impurity states is reduced.

Thus, providing the oxide insulating layers 121 and 123 makes it possible to reduce variations in electrical characteristics of the transistor, such as threshold voltage.

In the case where the gate insulating layer 150 and the oxide semiconductor layer 122 are in contact with each other and a channel is formed at interfaces therebetween, interface scattering occurs at the interfaces and the field-effect mobility of the transistor is decreased. However, since the oxide insulating layers 121 and 123 containing one or more kinds of metal elements forming the oxide semiconductor layer 122 are provided in contact with the oxide semiconductor layer 122, scattering of carriers does not easily occur at the interfaces between the oxide semiconductor layer 122 and each of the oxide insulating layers 121 and 123, and thus the field-effect mobility of the transistor can be increased.

In this embodiment, the amount of oxygen vacancies in the oxide semiconductor layer 122, and further the amount of oxygen vacancies in the oxide insulating layers 121 and 123 in contact with the oxide semiconductor layer 122 can be reduced; thus, the density of localized states of the oxide semiconductor layer 122 can be reduced. As a result, the transistor 10 in this embodiment has small variations in threshold voltage and high reliability. Further, the transistor 10 of this embodiment has excellent electrical characteristics.

An insulating film containing silicon is often used as a gate insulating layer of a transistor. For the above-described reason, it is preferable that a region of the oxide semiconductor layer, which serves as a channel, be not in contact with the gate insulating layer as in the transistor of one embodiment of the present invention. In the case where a channel is formed at the interface between the gate insulating layer and the oxide semiconductor layer, scattering of carriers occurs at the interface, whereby the field-effect mobility of the transistor is reduced in some cases. Also from the view of the above, it is preferable that the region of the oxide semiconductor layer, which serves as a channel, be separated from the gate insulating layer.

Accordingly, with the oxide semiconductor layer 120 having a stacked-layer structure including the oxide insulating layer 121, the oxide semiconductor layer 122, and the oxide insulating layer 123, a channel can be formed in the oxide semiconductor layer 122; thus, the transistor can have a high field-effect mobility and stable electrical characteristics.

Note that the three oxide layers are not necessarily provided and can be a single layer, two layers, four layers, or five or more layers. In the case of a single layer, a layer corresponding to the oxide semiconductor layer 122, which is described in this embodiment, can be used.

<Band Diagram>

Here, a band diagram is described. For easy understanding, the band diagram is illustrated with the energy levels (Ec) at the conduction band minimum of the insulating layer 110, the oxide insulating layer 121, the oxide semiconductor layer 122, the oxide insulating layer 123, and the gate insulating layer 150.

Figure 3A:
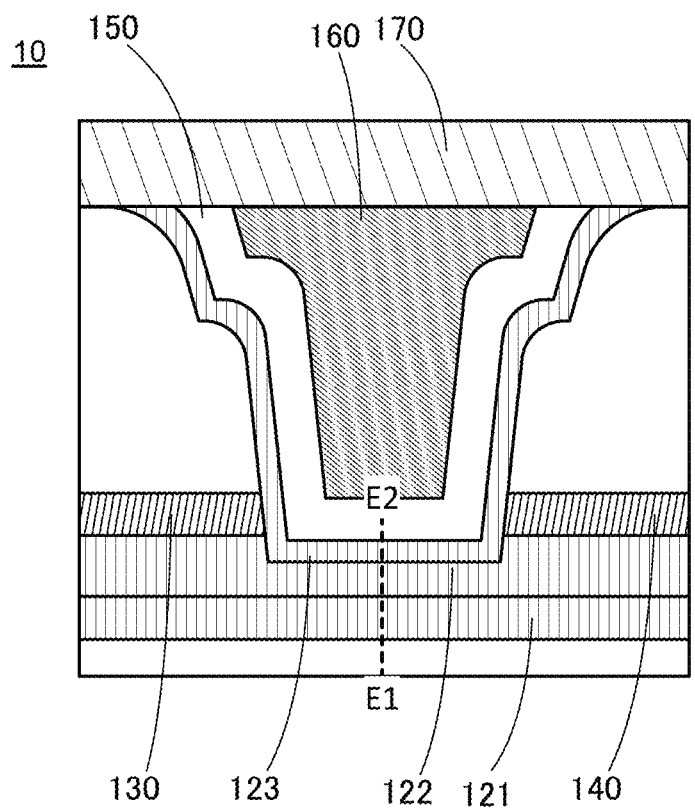
FIGS. 3A and 3B are a cross-sectional view and a band diagram of oxide layers.
Figure 3B:
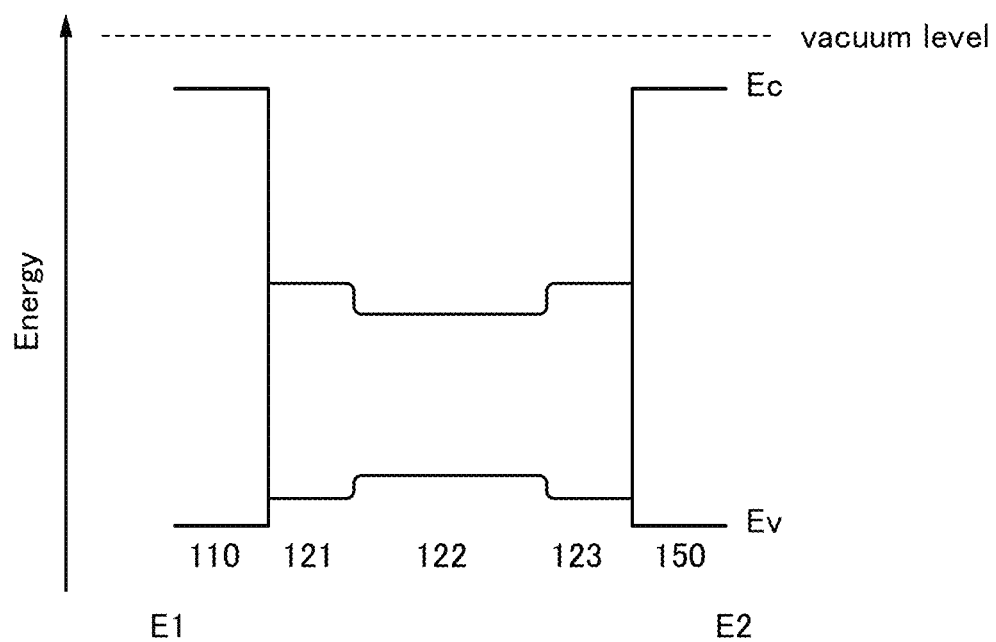
Figure 4A:
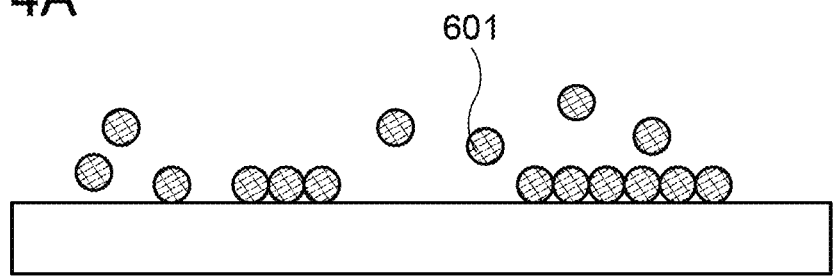
FIGS. 4A to 4D illustrate an ALD deposition mechanism.
Figure 4B:
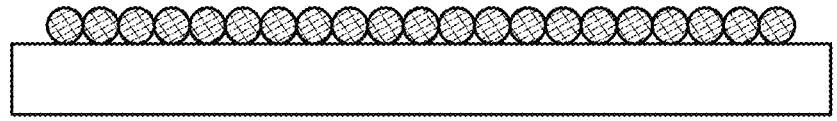
Figure 4C:
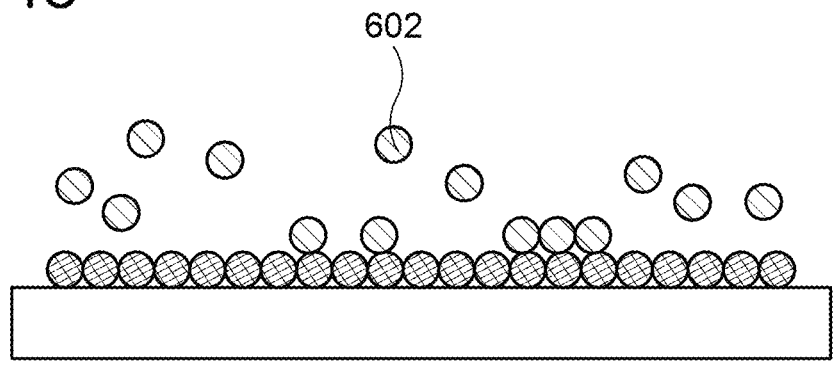
Figure 4D:
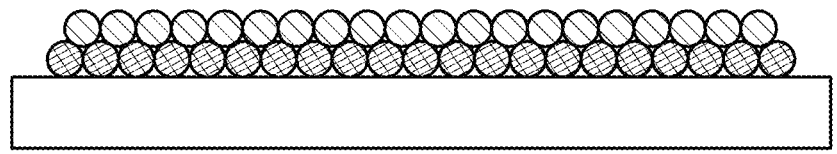

As illustrated in FIGS. 3A and 3B, the energy at the conduction band minimum changes continuously within the oxide insulating layer 121, the oxide semiconductor layer 122, and the oxide insulating layer 123. This can be understood also from the fact that the constituent elements are common among the oxide insulating layer 121, the oxide semiconductor layer 122, and the oxide insulating layer 123 and oxygen is easily diffused among them. Thus, the oxide insulating layer 121, the oxide semiconductor layer 122, and the oxide insulating layer 123 have a continuous physical property although they are a stack of films having different compositions.

The oxide semiconductor films, which contain the same main components and are stacked, are not simply stacked but formed to have continuous junction (here, particularly a U-shaped (U shape) well structure where the energy at the conduction band minimum is continuously changed between the films). In other words, a stacked-layer structure is formed such that there exists no impurities which form a defect level such as a trap center or a recombination center at each interface. If impurities are mixed between the films in the stacked multilayer film, the continuity of the energy band is lost and carriers disappear by a trap or recombination at the interface.

Although Ec of the oxide insulating layer 121 and the oxide insulating layer 123 are equal to each other in FIG. 3B, they may be different.

As illustrated in FIG. 3B, the oxide semiconductor layer 122 serves as a well and a channel of the transistor 10 is formed in the oxide semiconductor layer 122. Note that a channel having a U-shaped well structure in which the energy at the conduction band minimum continuously changes like the one formed in the oxide semiconductor layer 122, can also be referred to as a buried channel.

Note that trap levels due to impurities or defects can be formed in the vicinity of the interface between an insulating film such as a silicon oxide film and the oxide insulating layers 121 and 123. The oxide semiconductor layer 122 can be distanced away from the trap levels owing to existence of the oxide insulating layers 121 and 123. However, when the energy difference between Ec of the oxide insulating layers 121 and 123 and Ec of the oxide semiconductor layer 122 is small, an electron in the oxide semiconductor layer 122 can go over the energy difference and reach the trap level. When electrons to be negative charge are captured by the trap levels, a negative fixed charge is generated at the interface with the insulating film, whereby the threshold voltage of the transistor is shifted in the positive direction. In addition, a trap is not fixed and characteristics can be changed in a long-time preservation test of a transistor.

Thus, to reduce a change in the threshold voltage of the transistor, an energy difference between the Ec of the oxide semiconductor layer 122 and the Ec of each of the oxide insulating layers 121 and 123 is necessary. The energy difference is preferably greater than or equal to 0.1 eV, further preferably greater than or equal to 0.2 eV.

The oxide insulating layer 121, the oxide semiconductor layer 122, and the oxide insulating layer 123 preferably include a crystal. In particular, when a crystal in which c-axes are aligned is used, the transistor can have stable electrical characteristics.

In the band diagram illustrated in FIG. 3B, In—Ga oxide (e.g., with an atomic ratio of In:Ga=7:93) or gallium oxide may be provided between the oxide semiconductor layer 122 and the gate insulating layer 150 without providing the oxide insulating layer 123. Furthermore, In—Ga oxide or gallium oxide may be provided between the oxide insulating layer 123 and the gate insulating layer 150.

As the oxide semiconductor layer 122, an oxide having an electron affinity higher than those of the oxide insulating layers 121 and 123 is used. The oxide which can be used for the oxide semiconductor layer 122 has, for example, an electron affinity higher than that of each of the oxide insulating layers 121 and 123 by 0.07 eV or higher and 1.3 eV or lower, preferably 0.1 eV or higher and 0.7 eV or lower, and further preferably 0.2 eV or higher and 0.4 eV or lower.

Since the transistor described in this embodiment includes the oxide insulating layers 121 and 123 that each include one or more kinds of metal elements included in the oxide semiconductor layer 122, an interface state is less likely to formed at the interface between the oxide insulating layer 121 and the oxide semiconductor layer 122 and the interface between the oxide insulating layer 123 and the oxide semiconductor layer 122. Thus, providing the oxide insulating layers 121 and 123 makes it possible to reduce variations or changes in electrical characteristics of the transistor, such as threshold voltage.

<<Source Electrode Layer 130 and Drain Electrode Layer 140>>

The source electrode layer 130 and the drain electrode layer 140 are preferably a conductive layer having a single-layer structure or a stacked-layer structure and containing a material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a material, or a compound of oxygen, nitrogen, fluorine, or silicon containing any of these materials as its main component. For example, in the case of stacking layers, the lower conductive layer which is in contact with the oxide semiconductor layer 122 contains a material which is easily combined with oxygen, and the upper conductive layer contains a highly oxidation-resistant material. It is preferable to use a high-melting-point material, such as tungsten or molybdenum, which has both heat resistance and conductivity. In addition, the conductive layer is preferably formed using a low-resistance conductive material such as aluminum or copper. The conductive layer is further preferably formed using a Cu—Mn alloy, since in that case, manganese oxide formed at the interface with an insulator containing oxygen has a function of suppressing Cu diffusion.

When the conductive material that is easily bonded to oxygen is in contact with an oxide semiconductor layer, a phenomenon occurs in which oxygen in the oxide semiconductor layer is diffused to the conductive material that is easily bonded to oxygen. Oxygen vacancies are generated in the vicinity of a region which is in the oxide semiconductor layer and is in contact with the source electrode layer or the drain electrode layer. Hydrogen slightly contained in the film enters the oxygen vacancies, whereby the region is markedly changed to an n-type region. Accordingly, the n-type region can serve as a source or a drain of the transistor.

For example, a stacked-layer structure using W and Pt for the lower conductive layer and the upper conductive layer, respectively, can suppress oxidation of the conductive layers caused by being in contact with the insulating layer 175 while an oxide semiconductor in contact with the conductive layers becomes n-type.

<<Gate Insulating Layer 150>>

The gate insulating layer 150 can contain oxygen, nitrogen, fluorine, aluminum, magnesium, silicon, gallium, germanium, yttrium, zirconium, lanthanum, neodymium, hafnium, tantalum, titanium, or the like. For example, an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide can be used. The gate insulating layer 150 may be a stack of any of the above materials. The gate insulating layer 150 may contain lanthanum (La), nitrogen, zirconium (Zr), or the like as an impurity.

An example of a stacked-layer structure of the gate insulating layer 150 will be described. The gate insulating layer 150 contains, for example, oxygen, nitrogen, silicon, or hafnium. Specifically, the gate insulating layer 150 preferably contains hafnium oxide and silicon oxide or silicon oxynitride.

Hafnium oxide has higher dielectric constant than silicon oxide and silicon oxynitride. Therefore, by using hafnium oxide, the thickness of the gate insulating layer 150 can be larger than that of silicon oxide; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

In some cases, an interface state due to a defect exists in hafnium oxide having a crystalline structure in a formation surface where the hafnium oxide having the crystalline structure is formed. The interface state serves as a trap center in some cases. Therefore, when hafnium oxide is provided near a channel region of a transistor, the electrical characteristics of the transistor might deteriorate because of the interface state. In order to reduce the adverse effect of the interface state, in some cases, it is preferable to separate the channel region of the transistor and the hafnium oxide from each other by providing another film therebetween. The film has a buffer function. The film having a buffer function may be included in the gate insulating layer 150 or included in the oxide semiconductor film. That is, the film having a buffer function can be formed using silicon oxide, silicon oxynitride, an oxide semiconductor, or the like. Note that the film having a buffer function is formed using, for example, a semiconductor or an insulator having a larger energy gap than a semiconductor to be the channel region. Alternatively, the film having a buffer function is formed using, for example, a semiconductor or an insulator having lower electron affinity than a semiconductor to be the channel region. Further alternatively, the film having a buffer function is formed using, for example, a semiconductor or an insulator having higher ionization energy than a semiconductor to be the channel region.

In some cases, the threshold voltage of a transistor can be controlled by trapping an electric charge in an interface state (trap center) in hafnium oxide having the above-described crystalline structure in the formation surface where the hafnium oxide having the above-described crystalline structure is formed. In order to make the electric charge exist stably, for example, an insulator having a larger energy gap than hafnium oxide may be provided between the channel region and the hafnium oxide. Alternatively, a semiconductor or an insulator having lower electron affinity than hafnium oxide may be provided. The film having a buffer function may be formed using a semiconductor or an insulator having higher ionization energy than hafnium oxide. With the use of such an insulator, an electric charge trapped in the interface state is less likely to be released; accordingly, the electric charge can be held for a long period of time.

Examples of such an insulator include silicon oxide and silicon oxynitride. In order to make the interface state in the gate insulating layer 150 trap an electric charge, an electron may be transferred from an oxide semiconductor film toward the gate electrode layer 160. As a specific example, the potential of the gate electrode layer 160 is kept higher than the potential of the source electrode layer 130 or the drain electrode layer 140 under high temperature conditions (e.g., a temperature higher than or equal to 125° C. and lower than or equal to 450° C., typically higher than or equal to 150° C. and lower than or equal to 300° C.) for one second or longer, typically for one minute or longer.

The threshold voltage of a transistor in which a predetermined amount of electrons are trapped in interface states in the gate insulating layer 150 or the like shifts in the positive direction. The amount of electrons to be trapped (the amount of change in threshold voltage) can be controlled by adjusting a voltage of the gate electrode layer 160 or time in which the voltage is applied. Note that a location in which an electric charge is trapped is not necessarily limited to the inside of the gate insulating layer 150 as long as an electric charge can be trapped therein. A stacked film having a similar structure may be used as another insulating layer.

<<Gate Electrode Layer 160>>

The gate electrode layer 160 can be formed using aluminum (Al), titanium (Ti), chromium (Cr), cobalt (Co), nickel (Ni), copper (Cu), yttrium (Y), zirconium (Zr), molybdenum (Mo), ruthenium (Ru), silver (Ag), tantalum (Ta), tungsten (W), or silicon (Si), for example. The gate electrode layer 160 may have a stacked-layer structure. Any of these materials may be used for the gate electrode layer 162. A conductive film containing nitrogen, such as a nitride of any of the above materials, may be used for the gate electrode layer 161. For the gate electrode layer 160, an oxide having conductivity may be used.

<<Insulating Layer 170>>

The insulating layer 170 can contain at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

An aluminum oxide film is preferably included in the insulating layer 170. The aluminum oxide film can prevent the passage of both oxygen and impurities such as hydrogen and moisture. Thus, during and after the manufacturing process of the transistor, the aluminum oxide film can suitably function as a protective film that has effects of preventing entry of impurities such as hydrogen and moisture, which cause variations in the electrical characteristics of the transistor, into the oxide insulating layer 121, the oxide semiconductor layer 122, and the oxide insulating layer 123, preventing release of oxygen, which is a main component, from the oxide insulating layer 121, the oxide semiconductor layer 122, and the oxide insulating layer 123, and preventing unnecessary release of oxygen from the insulating layer 110.

The insulating layer 170 is preferably a film having oxygen supply capability. Oxygen is supplied to other oxide layers when the insulating layer 170 is formed, the oxygen is diffused into an oxide semiconductor by heat treatment performed after that, and the oxygen can be supplied to oxygen vacancies in the oxide semiconductor; therefore, the transistor characteristics (e.g., threshold voltage and reliability) can be improved.

Further, the insulating layer 170 may be a single layer or a stacked layer. Alternatively, another insulating layer may be provided over or under the insulating layer 170. The insulating layer 170 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide, for example. The insulating layer 170 preferably contains oxygen more than that in the stoichiometric composition. Oxygen released from the insulating layer 170 can be diffused into the channel formation region in the oxide semiconductor layer 120 through the gate insulating layer 150, so that oxygen vacancies formed in the channel formation region can be filled with the oxygen. In this manner, stable electrical characteristics of the transistor can be achieved.

<<Insulating Layer 175>>

The insulating layer 175 can be formed using an insulating film containing one or more of magnesium oxide ($MgO_x$), silicon oxide ($SiO_x$), silicon oxynitride ($SiN_xO_x$), silicon nitride oxide ($SiN_xO_x$), silicon nitride ($SiN_x$), gallium oxide ($GaO_x$), germanium oxide ($GeO_x$), yttrium oxide ($YO_x$), zirconium oxide ($ZrO_x$), lanthanum oxide ($RaO_x$), neodymium oxide ($NdO_x$), hafnium oxide ($HfO_x$), tantalum oxide ($TaO_x$), and aluminum oxide ($AlO_x$). The insulating layer 175 may be a stack of any of the above materials. The insulating layer 175 preferably contains oxygen more than that in the stoichiometric composition. Oxygen released from the insulating layer 175 can be diffused into the channel formation region in the oxide semiconductor layer 120 through the gate insulating layer 150, so that oxygen vacancies formed in the channel formation region can be filled with the oxygen. In this manner, stable electrical characteristics of the transistor can be achieved.

<Manufacturing Method of Transistor>

Next, a manufacturing method of a semiconductor device of this embodiment is described with reference to FIGS. 6A and 6B, FIGS. 7A and 7B, FIGS. 8A and 8B, FIGS. 9A and 9B, FIGS. 10A and 10B, FIGS. 11A and 11B, and FIGS. 12A and 12B. Note that the same parts as those in the above transistor structure are not described here. The direction of A1-A2 and that of A3-A4 in FIGS. 6A and 6B, FIGS. 7A and 7B, FIGS. 8A and 8B, FIGS. 9A and 9B, FIGS. 10A and 10B, FIGS. 11A and 11B, and FIGS. 12A and 12B are respectively referred to as a channel length direction and a channel width direction in FIGS. 1A and 1B in some cases.

In this embodiment, the layers included in the transistor (i.e., the insulating layer, the oxide semiconductor layer, the conductive layer, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example. As the sputtering method, a combination of a long throw sputtering method and a collimated sputtering method is employed, whereby the embeddability can be improved.

<Thermal CVD Method>

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in a chamber is set to an atmospheric pressure or a reduced pressure, and reaction is caused in the vicinity of the substrate or over the substrate.

The variety of films such as the metal film, the semiconductor film, and the inorganic insulating film which have been disclosed in the above embodiments can be formed by a thermal CVD method, such as a MOCVD method or an ALD method. For example, in the case where an In—Ga—Zn—O film is formed, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

<ALD Method>

In a conventional deposition apparatus utilizing a CVD method, one or more kinds of source gases (precursors) for reaction are supplied to a chamber at the same time at the time of deposition. In a deposition apparatus utilizing an ALD method, precursors for reaction are sequentially introduced into a chamber, and then the sequence of the gas introduction is repeated. For example, two or more kinds of precursors are sequentially supplied to the chamber by switching respective switching valves (also referred to as high-speed valves). For example, a first precursor is introduced, an inert gas (e.g., argon or nitrogen) or the like is introduced after the introduction of the first precursor so that the plural kinds of precursors are not mixed, and then a second precursor is introduced. Alternatively, the first precursor may be exhausted by vacuum evacuation instead of the introduction of the inert gas, and then the second precursor may be introduced.

FIGS. 4A to 4D illustrate a deposition process by an ALD method. First precursors 601 are adsorbed onto a substrate surface (see FIG. 4A), whereby a first monolayer is formed (see FIG. 4B). At this time, metal atoms and the like included in the precursors can be bonded to hydroxyl groups that exist at the substrate surface. The metal atoms may be bonded to alkyl groups such as methyl groups or ethyl groups. The first monolayer reacts with second precursors 602 introduced after the first precursors 601 are evacuated (see FIG. 4C), whereby a second monolayer is stacked over the first monolayer. Thus, a thin film is formed (see FIG. 4D). For example, in the case where an oxidizer is included in the second precursors, the oxidizer chemically reacts with metal atoms included in the first precursors or an alkyl group bonded to metal atoms, whereby an oxide film can be formed.

An ALD method is a deposition method based on a surface chemical reaction, by which precursors are adsorbed onto a surface and adsorbing is stopped by a self-terminating mechanism, whereby a layer is formed. For example, precursors such as trimethylaluminum react with hydroxyl groups (OH groups) that exist at the surface. At this time, only a surface reaction due to heating occurs; therefore, the precursors come into contact with the surface and metal atoms or the like in the precursors can be adsorbed onto the surface through thermal energy. The precursors have characteristics of, for example, having a high vapor pressure, being thermally stable before being deposited and not dissolving, and being chemically adsorbed onto a substrate at a high speed. Since the precursors are introduced in a state of a gas, when the precursors, which are alternately introduced, have enough time to be diffused, a film can be formed with good coverage even onto a region having unevenness with a high aspect ratio.

In an ALD method, the sequence of the gas introduction is repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness. The deposition rate can be increased and the impurity concentration in the film can be reduced by improving the evacuation capability.

ALD methods include an ALD method using heating (thermal ALD method) and an ALD method using plasma (plasma ALD method). In the thermal ALD method, precursors react using thermal energy, and in the plasma ALD method, precursors react in a state of a radical.

By an ALD method, an extremely thin film can be formed with high accuracy. In addition, the coverage of an uneven surface with the film and the film density of the film are high.

<Plasma ALD>

Alternatively, when the plasma ALD method is employed, the film can be formed at a lower temperature than when the thermal ALD method is employed. With the plasma ALD method, for example, the film can be formed without decreasing the deposition rate even at 100° C. or lower. Moreover, in the plasma ALD method, nitrogen radicals can be formed by plasma; thus, a nitride film as well as an oxide film can be formed.

In addition, oxidizability of an oxidizer can be enhanced by the plasma ALD method. Thus, precursors remaining in a plasma ALD film or organic components released from precursors can be reduced. In addition, carbon, chlorine, hydrogen, and the like in the film can be reduced. Therefore, a film with low impurity concentration can be formed.

In the case of using the plasma ALD method, when radical species are generated, plasma can be generated from a place apart from the substrate like inductively coupled plasma (ICP) or the like, so that plasma damage to the substrate or a film on which the protective film is formed can be inhibited.

As described above, with the plasma ALD method, the film can be deposited in the state where the process temperature can be lowered and the coverage of the surface can be increased as compared with other deposition methods. Thus, entry of water and hydrogen from the outside can be inhibited, leading to an improvement of the reliability of characteristics of the transistor.

<ALD Apparatus>

Figure 5A:
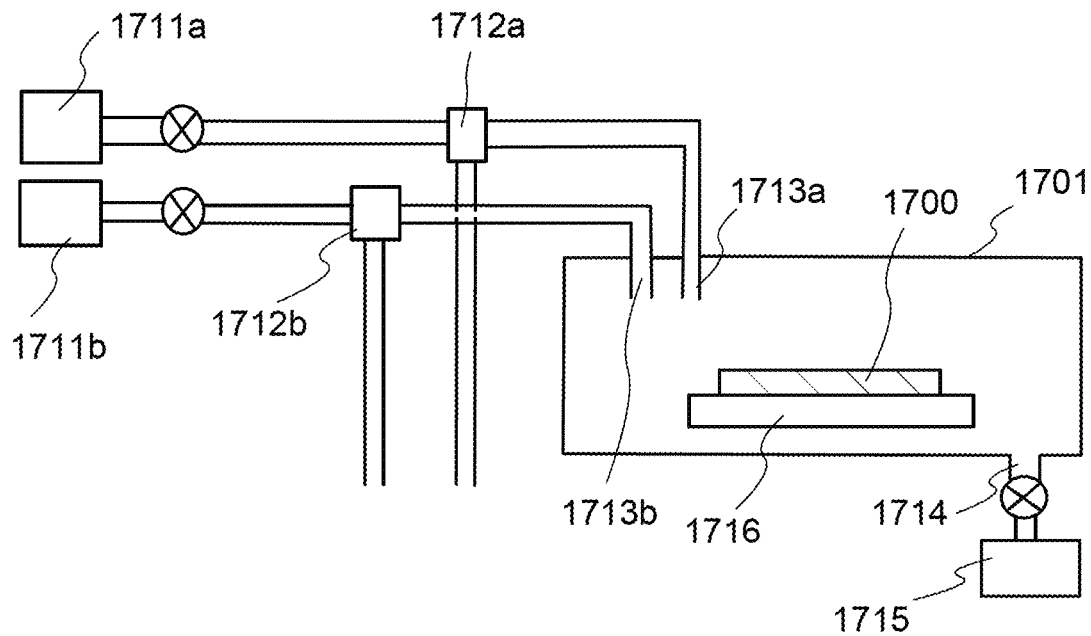
FIGS. 5A and 5B are schematic views of an ALD apparatus.

FIG. 5A illustrates an example of a deposition apparatus utilizing an ALD method. The deposition apparatus utilizing an ALD method includes a deposition chamber (chamber 1701), source material supply portions 1711a and 1711b, high-speed valves 1712a and 1712b which are flow rate controllers, source material introduction ports 1713a and 1713b, a source material exhaust port 1714, and an evacuation unit 1715. The source material introduction ports 1713a and 1713b provided in the chamber 1701 are connected to the source material supply portions 1711a and 1711b, respectively, through supply tubes and valves. The source material exhaust port 1714 is connected to the evacuation unit 1715 through an exhaust tube, a valve, and a pressure controller.

A substrate holder 1716 with a heater is provided in the chamber, and a substrate 1700 over which a film is formed is provided over the substrate holder.

In the source material supply portions 1711a and 1711b, a source gas is formed from a solid source material or a liquid source material by using a vaporizer, a heating unit, or the like. Alternatively, the source material supply portions 1711a and 1711b may supply a source gas.

Although two source material supply portions 1711a and 1711b are provided as an example, without limitation thereon, three or more source material supply portions may be provided. The high-speed valves 1712a and 1712b can be accurately controlled by time, and a source gas and an inert gas are supplied by the high-speed valves 1712a and 1712b. The high-speed valves 1712a and 1712b are flow rate controllers for a source gas, and can also be referred to as flow rate controllers for an inert gas.

In the deposition apparatus illustrated in FIG. 5A, a thin film is formed over a surface of the substrate 1700 in the following manner: the substrate 1700 is transferred to put on the substrate holder 1716, the chamber 1701 is sealed, the substrate 1700 is heated to a desired temperature (e.g., higher than or equal to 100° C. or higher than or equal to 150° C.) by heating the substrate holder 1716 with a heater; and supply of a source gas, evacuation with the evacuation unit 1715, supply of an inert gas, and evacuation with the evacuation unit 1715 are repeated.

In the deposition apparatus illustrated in FIG. 5A, an insulating layer formed using an oxide (including a composite oxide) containing one or more elements selected from hafnium, aluminum, tantalum, zirconium, and the like can be formed by selecting a source material (e.g., a volatile organometallic compound) used for the source material supply portions 1711a and 1711b appropriately. Specifically, it is possible to use an insulating layer formed using hafnium oxide, an insulating layer formed using aluminum oxide, an insulating layer formed using hafnium silicate, or an insulating layer formed using aluminum silicate. Alternatively, a thin film, e.g., a metal layer such as a tungsten layer or a titanium layer, or a nitride layer such as a titanium nitride layer can be formed by selecting a source material (e.g., a volatile organometallic compound) used for the source material supply portions 1711a and 1711b appropriately.

For example, in the case where a hafnium oxide layer is formed by a deposition apparatus using an ALD method, two kinds of gases, i.e., ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH)) are used. In this case, the first source gas supplied from the source material supply portion 1711a is TDMAH, and the second source gas supplied from the source material supply portion 1711b is ozone. Note that the chemical formula of tetrakis(dimethylamide)hafnium is $Hf[N(CH_3)_2]_4$. Examples of another material include tetrakis(ethylmethylamide)hafnium. Note that nitrogen has a function of eliminating charge trap states. Therefore, when the source gas contains nitrogen, a hafnium oxide film having low density of charge trap states can be formed.

In the case where an aluminum oxide layer is formed by a deposition apparatus utilizing an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. In this case, the first source gas supplied from the source material supply portion 1711a is TMA, and the second source gas supplied from the source material supply portion 1711*b* is $H_2O$. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3, 5-heptanedionate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas) are sequentially introduced plural times to form an In—O layer, a $Ga(CH_3)_3$ gas and an $O_3$ gas) are introduced at a time to form a GaO layer, and then a $Zn(CH_3)_2$ gas and an $O_3$ gas) are introduced at a time to form a ZnO layer. Note that the order of these layers is not limited to this example. A mixed compound layer such as an In—Ga—O layer, an In—Zn—O layer, or a Ga—Zn—O layer may be formed by mixing these gases. Note that although an $H_2O$ gas which is obtained by bubbling water with an inert gas such as Ar may be used instead of an $O_3$ gas), it is preferable to use an $O_3$ gas), which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. A $Zn(CH_3)_2$ gas may be used.

<<Multi-Chamber Manufacturing Apparatus>>

Figure 5B:
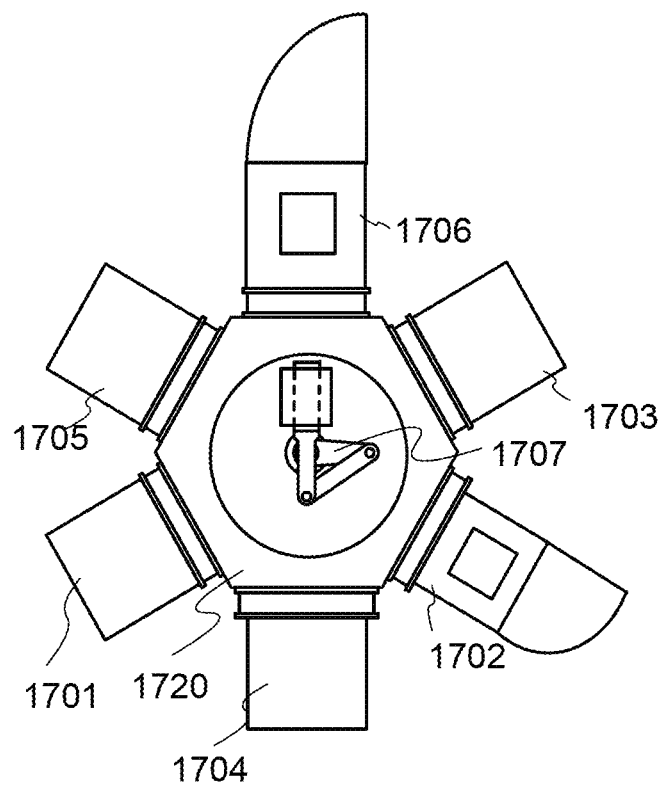
Figure 6A:
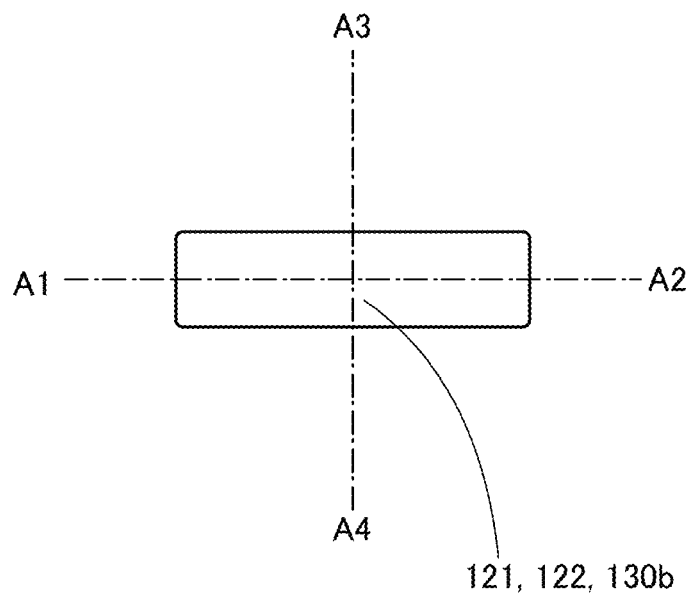
FIGS. 6A and 6B are a top view and a cross-sectional view illustrating a method for manufacturing a transistor.
Figure 6B:
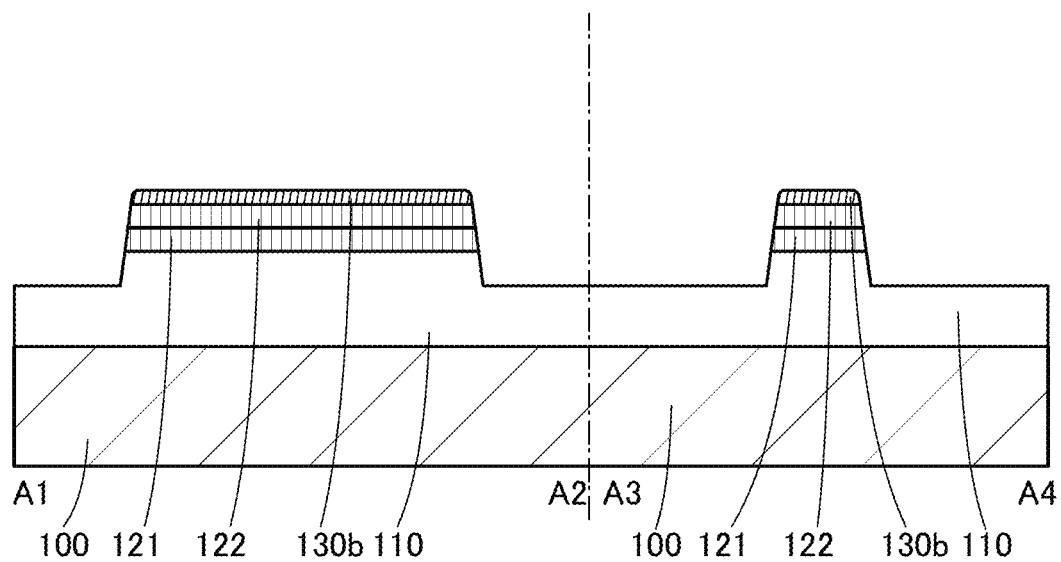

FIG. 5B illustrates an example of a multi-chamber manufacturing apparatus including at least one deposition apparatus illustrated in FIG. 5A.

In the manufacturing apparatus illustrated in FIG. 5B, a stack of films can be successively formed without exposure to the air, and entry of impurities is prevented and throughput is improved.

The manufacturing apparatus illustrated in FIG. 5B includes at least a load chamber 1702, a transfer chamber 1720, a pretreatment chamber 1703, a chamber 1701 which is a deposition chamber, and an unload chamber 1706. Note that in order to prevent attachment of moisture, the chambers of the manufacturing apparatus (including the load chamber, the treatment chamber, the transfer chamber, the deposition chamber, the unload chamber, and the like) are preferably filled with an inert gas (such as a nitrogen gas) whose dew point is controlled, more preferably maintain reduced pressure.

The chambers 1704 and 1705 may be deposition apparatuses utilizing an ALD method like the chamber 1701, deposition apparatuses utilizing a plasma CVD method, deposition apparatuses utilizing a sputtering method, or deposition apparatuses utilizing a metal organic chemical vapor deposition (MOCVD) method.

For example, an example in which a stack of films is formed under a condition that the chamber 1704 is a deposition apparatus utilizing a plasma CVD method and the chamber 1705 is a deposition apparatus utilizing an MOCVD method is shown below.

Although FIG. 5B shows an example in which a top view of the transfer chamber 1720 is a hexagon, a manufacturing apparatus in which the top surface shape is set to a polygon having more than six corners and more chambers are connected depending on the number of layers of a stack may be used. The top surface shape of the substrate is rectangular in FIG. 5B; however, there is no particular limitation on the top surface shape of the substrate. Although FIG. 5B shows an example of the single wafer type, a batch-type deposition apparatus in which films are deposited on a plurality of substrates at a time may be used.

<Formation of Insulating Layer 110>

First, the insulating layer 110 is formed over the substrate 100. The insulating layer 110 can be formed by a plasma CVD method, a thermal CVD method (an MOCVD method, an ALD method), a sputtering method, or the like with use of an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a mixed material of any of these. Alternatively, these materials may be stacked, in which case at least an upper layer of the stacked layer which is in contact with a first oxide insulating film to be the oxide insulating layer 121 later is preferably formed using a material containing excess oxygen that can serve as a supply source of oxygen to the oxide semiconductor layer 122.

As the insulating layer 110, for example, a 100-nm-thick silicon oxynitride film can be formed by a plasma CVD method.

Next, first heat treatment may be performed to release water, hydrogen, or the like contained in the insulating layer 110. As a result, the concentration of water, hydrogen, or the like contained in the insulating layer 110 can be reduced. The heat treatment can reduce the amount of water, hydrogen, or the like diffused into the first oxide insulating film that is to be formed later.

<Formation of First Oxide Insulating Film and Oxide Semiconductor Film>

Then, the first oxide insulating film to be the oxide insulating layer 121 later and an oxide semiconductor film to be the oxide semiconductor layer 122 later are formed over the insulating layer 110. The first oxide insulating film and the oxide semiconductor film can be formed by a sputtering method, an MOCVD method, a PLD method, or the like, and especially, a sputtering method is preferable. As a sputtering method, an RF sputtering method, a DC sputtering method, an AC sputtering method, or the like can be used. In addition, a facing-target-type sputtering method (also referred to as a counter-electrode-type sputtering method, a gas phase sputtering method, and a vapor deposition sputtering (VDSP) method) is used, whereby plasma damage at the deposition can be reduced.

When the first oxide insulating film is formed by a sputtering method, it is preferable that each chamber of the sputtering apparatus be able to be evacuated to a high vacuum (about $5\times10^{-7}$ Pa to $1\times10^{-4}$ Pa) by an adsorption vacuum pump such as a cryopump and that the chamber be able to heat a substrate over which a film is to be deposited to 100° C. or higher, preferably 400° C. or higher so that water and the like acting as impurities in the oxide semiconductor can be removed as much as possible. Alternatively, a combination of a turbo molecular pump and a cold trap is preferably used to prevent back-flow of a gas containing a carbon component, moisture, or the like from an exhaust system into the chamber. Alternatively, a combination of a turbo molecular pump and a cryopump may be used as an exhaust system.

Not only high vacuum evacuation in a chamber but also high purity of a sputtering gas is necessary to obtain a high-purity intrinsic oxide semiconductor. When a highly purified gas having a dew point of −40° C. or lower, preferably −80° C. or lower, more preferably −100° C. or lower is used as an oxygen gas or an argon gas used as a sputtering gas, moisture or the like can be prevented from entering an oxide semiconductor as much as possible.

As a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased.

Note that, for example, in the case where the oxide semiconductor film is formed by a sputtering method at a substrate temperature higher than or equal to 150° C. and lower than or equal to 750° C., preferably higher than or equal to 150° C. and lower than or equal to 450° C., further preferably higher than or equal to 200° C. and lower than or equal to 420° C., the oxide semiconductor film can be a CAAC-OS film.

The material of the first oxide insulating film is selected so that the first oxide insulating film can have a lower electron affinity than the oxide semiconductor film.

The indium content of the oxide semiconductor film is preferably higher than those of the first oxide insulating film and a second oxide insulating film. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Thus, with the use of an oxide having a high indium content for the oxide semiconductor layer 122, a transistor having high mobility can be achieved.

When a sputtering method is used to form the first oxide insulating film and the oxide semiconductor film, the first oxide insulating film and the oxide semiconductor film can be successively formed without exposing to the air with use of a multi-chamber sputtering apparatus. In that case, entry of unnecessary impurities and the like into the interface between the first oxide insulating film and the oxide semiconductor film can be prevented and the density of interface states can be reduced accordingly. Thus, the electrical characteristics of a transistor can be stabilized, particularly in a reliability test.

If the oxide semiconductor film is damaged, the oxide semiconductor layer 122, which is a main conduction path, can keep a distance from the damaged part thanks to the existence of the oxide insulating layer 121. Thus, the electrical characteristics of a transistor can be stabilized, particularly in a reliability test.

As the first oxide insulating film, a 20-nm-thick oxide insulating film which is formed by a sputtering method using a target having an atomic ratio of In:Ga:Zn=1:3:4 can be used. In addition, as the oxide semiconductor film, a 15-nm-thick oxide semiconductor film which is formed by a sputtering method using a target having an atomic ratio of In:Ga:Zn=1:1:1 can be used.

The amount of oxygen vacancies in the oxide semiconductor film can be reduced by performing second heat treatment after the first oxide insulating film and the oxide semiconductor film are formed.

The temperature of the second heat treatment is higher than or equal to 250° C. and lower than the strain point of the substrate, preferably higher than or equal to 300° C. and lower than or equal to 650° C., further preferably higher than or equal to 350° C. and lower than or equal to 550° C.

The second heat treatment is performed under an inert gas atmosphere containing nitrogen or a rare gas such as helium, neon, argon, xenon, or krypton. Further, after heat treatment performed in an inert gas atmosphere, heat treatment may be additionally performed in an oxygen atmosphere or a dry air atmosphere (air whose dew point is lower than or equal to −80° C., preferably lower than or equal to −100° C., further preferably lower than or equal to −120° C.). The treatment may be performed under reduced pressure. Note that it is preferable that hydrogen, water, and the like be not contained in an inert gas and oxygen, like the dry air, and the dew point is preferably lower than or equal to −80° C., further preferably lower than or equal to −100° C. The treatment time is 3 minutes to 24 hours.

In the heat treatment, instead of an electric furnace, any device for heating an object by heat conduction or heat radiation from a heating element, such as a resistance heating element, may be used. For example, an RTA (rapid thermal annealing) apparatus, such as a GRTA (gas rapid thermal annealing) apparatus or an LRTA (lamp rapid thermal annealing) apparatus, can be used. The LRTA apparatus is an apparatus for heating an object to be processed by radiation of light (an electromagnetic wave) emitted from a lamp, such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the high-temperature gas, an inert gas, such as nitrogen or a rare gas like argon, is used.

Note that the second heat treatment may be performed after etching for forming the oxide insulating layer 121 and the oxide semiconductor layer 122 described later.

For example, after heat treatment is performed at 450° C. for one hour in a nitrogen atmosphere, heat treatment is performed at 450° C. for one hour in an oxygen atmosphere.

Through the above-described steps, oxygen vacancies and impurities such as hydrogen and water in the oxide semiconductor films can be reduced. The oxide semiconductor films can have low density of localized states.

<Formation of First Conductive Film>

Next, a first conductive film to be the source electrode layer 130 and the drain electrode layer 140 is formed over the oxide semiconductor layer 122. The first conductive film is formed by a sputtering method, a chemical vapor deposition (CVD) method such as a metal organic chemical vapor deposition (MOCVD) method, a metal chemical deposition method, an atomic layer deposition (ALD) method, or a plasma-enhanced chemical vapor deposition (PECVD) method, an evaporation method, a pulsed laser deposition (PLD) method, or the like.

As a preferable material of the first conductive film, a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. For example, in the case of stacking layers, the lower conductive layer which is in contact with the oxide semiconductor layer 122 contains a material which is easily combined with oxygen, and the upper conductive layer contains a highly oxidation-resistant material. It is preferable to use a high-melting-point material which has both heat resistance and conductivity, such as tungsten or molybdenum. In addition, a low-resistance conductive material, such as aluminum or copper, is preferable. A Cu—Mn alloy is also preferable, in which case manganese oxide formed at the interface with an insulator containing oxygen has a function of preventing Cu diffusion.

As the first conductive film, for example, a tungsten film having a thickness of 20 nm to 100 nm can be formed by a sputtering method.

A conductive layer 130b formed by processing the first conductive film can have a function of a hard mask in the subsequent step and a function of a source electrode and a drain electrode; thus, the number of steps can be reduced. Thus, the semiconductor manufacturing process can be shortened.

<Formation of Oxide Insulating Layer 121 and Oxide Semiconductor Layer 122>

Then, a resist mask is formed through a lithography process. The first conductive film is selectively etched using the resist mask, so that the conductive layer 130b is formed. The resist over the conductive layer 130b is removed. The oxide semiconductor film and the first oxide insulating film are selectively etched using the conductive layer 130b as a hard mask, so that the island-shaped oxide semiconductor layer 122 and oxide insulating layer 121 can be formed (see FIGS. 6A and 6B). Dry etching can be used here. Note that the use of the conductive layer 130b as a hard mask for etching for the oxide semiconductor layer can reduce edge roughness of the etched oxide semiconductor layer as compared with the case of using a resist mask.

<Formation of Second Insulating Film>

Next, a second insulating film to be the insulating layer 175 later is formed over the insulating layer 110 and the conductive layer 130b. The second insulating film can be formed in a manner similar to that of the insulating layer 110.

The second insulating film can be formed by a plasma CVD method, a thermal CVD method (an MOCVD method, an ALD method), a sputtering method, or the like with use of an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a mixed material of any of these. Alternatively, a stack of any of the above materials may be used.

<Planarization of Second Insulating Film>

Then, planarization treatment is performed on the second insulating film, so that an insulating layer 175b is formed. The planarization treatment can be performed by a chemical mechanical polishing (CMP) method, a dry etching method, a reflow method, or the like. In the case where the CMP method is used, a film whose composition is different from that of the second insulating film is formed over the second insulating film, whereby the thickness of the insulating layer 175b in the substrate surface after the CMP treatment can be uniform.

<Formation of Groove Portion, Source Electrode Layer 130, and Drain Electrode Layer 140>

Figure 7A:
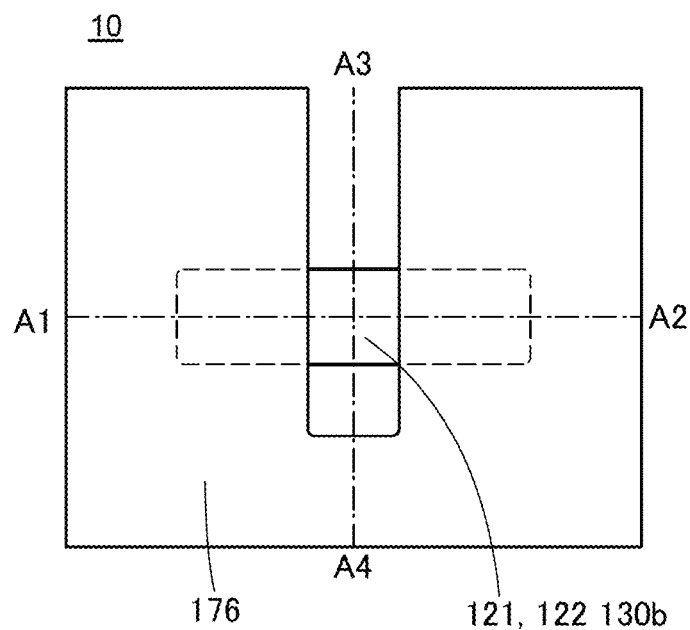
FIGS. 7A and 7B are a top view and a cross-sectional view illustrating a method for manufacturing a transistor.
Figure 7B:
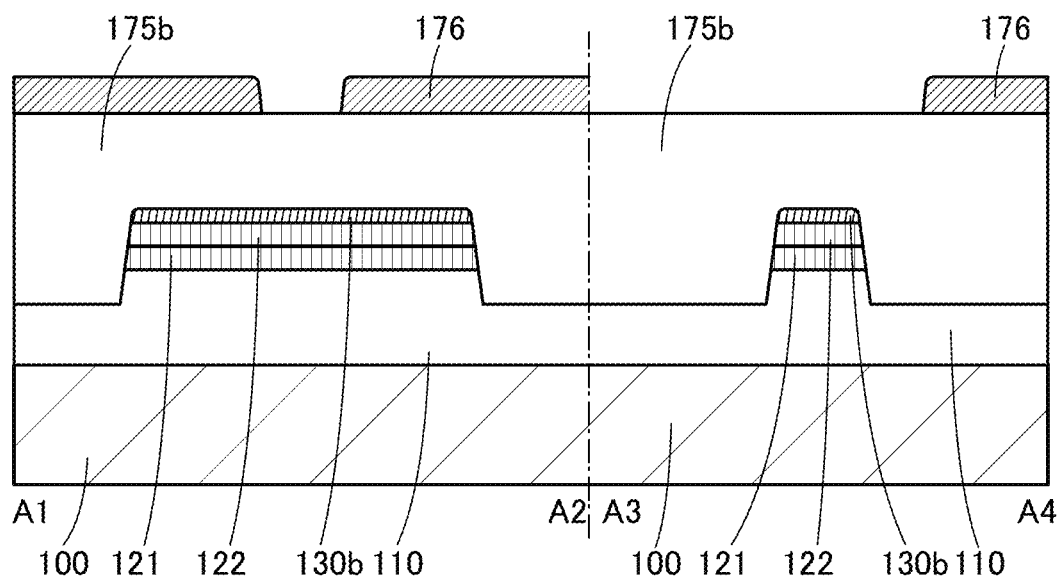

Next, a resist mask 176 is formed over the insulating layer 175b by a lithography process (see FIGS. 7A and 7B). Note that the lithography process may be performed after an organic film is applied to the insulating layer 175b or an organic film is applied to the resist. The organic film can contain propylene glycolmonomethyl ether, ethyl lactate, or the like. The use of the organic film leads to, in addition to an anti-reflection effect during light exposure, an improvement in adhesion between a resist and a film, an improvement in resolution, and the like. The organic film can be used in another process.

Note that in the case where a transistor having an extremely short channel length is formed, at least the conductive layer 130b in a region to divide the conductive layer 130b to be the source electrode layer 130 and the drain electrode layer 140 is etched using a resist mask that is processed by a method suitable for micropatterning, such as electron beam exposure, liquid immersion exposure, or extreme ultraviolet (EUV) exposure. Note that in the case of forming the resist mask by electron beam exposure, a positive resist mask is used, so that an exposed region can be minimized and throughput can be improved. In the above manner, a transistor having a channel length of 100 nm or less, further, 30 nm or less can be formed. Alternatively, minute processing may be performed by an exposure technology which uses X-rays or the like.

With the resist mask, groove processing is performed on the insulating layer 175b by a dry etching method. Through the groove processing, the resist mask gradually recedes to become a resist mask 177 (see FIGS. 8A and 8B). Furthermore, the shape of the resist is changed by heat generated due to the dry etching process to have a protrusion like eaves (the resist mask 178). In this state, the etching process further proceeds, whereby the groove portion 174 is formed in the insulating layer 175b.

Figure 9A:
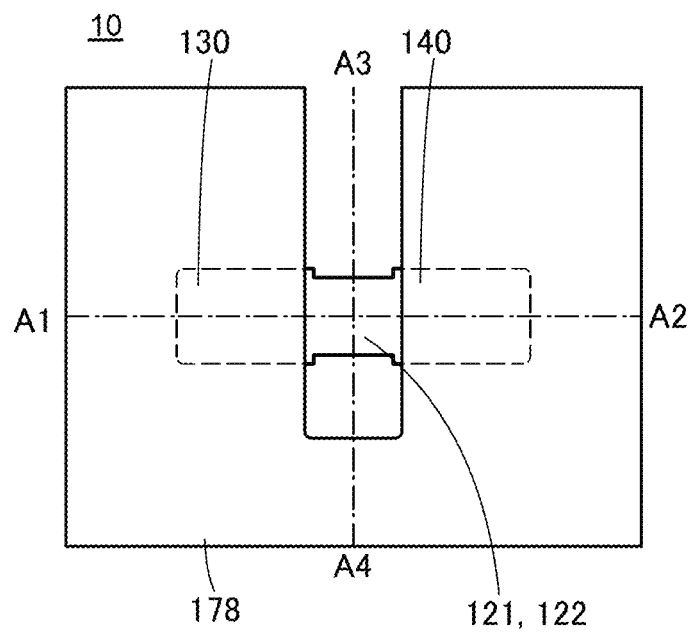
FIGS. 9A and 9B are a top view and a cross-sectional view illustrating a method for manufacturing a transistor.
Figure 9B:
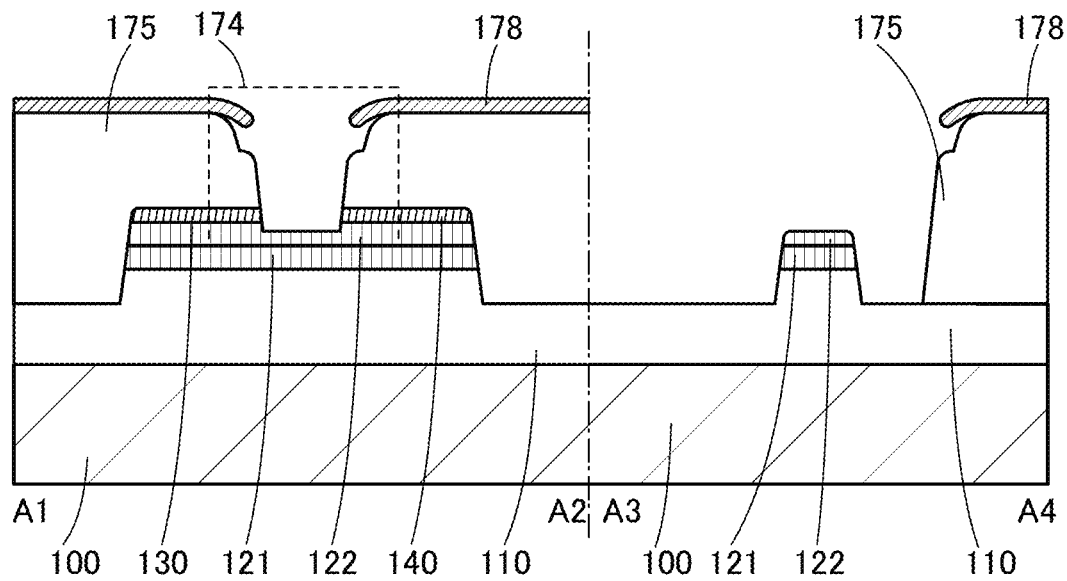

Then, the exposed conductive layer 130b is selectively etched to be divided, so that the source electrode layer 130 and the drain electrode layer 140 can be formed (see FIGS. 9A and 9B).

Note that the processing method of the groove portion 174 is not limited to the above method. For example, not only the resist mask but also a hard mask may be used, or a half-tone mask may be used in a lithography process to control the shape of the resist mask. Alternatively, the shape of the mask may be controlled by nanoimprint lithography. The nanoimprint lithography can be used in another process.

After the source electrode layer 130 and the drain electrode layer 140 are formed, cleaning treatment may be performed to remove an etching residue. The cleaning treatment can prevent a short circuit between the source electrode layer 130 and the drain electrode layer 140. The cleaning treatment can be performed using an alkaline solution such as a tetramethylammonium hydroxide (TMAH) solution, an acidic solution such as hydrofluoric acid, an oxalic acid solution, or a phosphoric acid solution. By the cleaning treatment, part of the oxide semiconductor layer 122 is etched to have a depression.

For example, the silicon oxynitride film formed as the second insulating film is planarized, a resist mask is formed over the silicon oxynitride film by a lithography method, and an opening is formed in the silicon oxynitride film with the resist mask by a dry etching method using a gas containing carbon, fluorine, or the like. Then, dry etching using a gas containing chlorine, fluorine, or the like is performed, whereby the source electrode layer 130 and the drain electrode layer 140 can be formed.

<Formation of Second Oxide Insulating Film 123a>

Next, a second oxide insulating film 123a to be the oxide insulating layer 123 is formed over the oxide semiconductor layer 122 and the insulating layer 175. The second oxide insulating film 123a can be formed in a manner similar to that of the first oxide insulating film. The materials can be selected such that the electron affinity of the second oxide insulating film 123a is smaller than that of the oxide semiconductor film.

Furthermore, if the second oxide insulating film 123a is formed by a long throw sputtering method, the embeddability of the second oxide insulating film 123a in the groove portion 174 can be improved.

For example, as the second oxide insulating film 123a, a 5-nm-thick oxide insulating film which is formed by a sputtering method using a target having an atomic ratio of In:Ga:Zn=1:3:2 can be used.

<Formation of Third Insulating Film 150a>

Next, a third insulating film 150a to be the gate insulating layer 150 is formed over the second oxide insulating film 123a. The third insulating film 150a can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The third insulating film 150a may be a stack containing any of these materials. The third insulating film 150a can be formed by a sputtering method, a CVD method (e.g., a plasma CVD method, an MOCVD method, or an ALD method), an MBE method, or the like. The third insulating film 150a can be formed by a method similar to that of the insulating layer 110 as appropriate.

For example, as the third insulating film 150a, a 10-nm-thick silicon oxynitride film can be formed by a plasma CVD method.

<Formation of Second Conductive Film 160a>

Figure 10A:
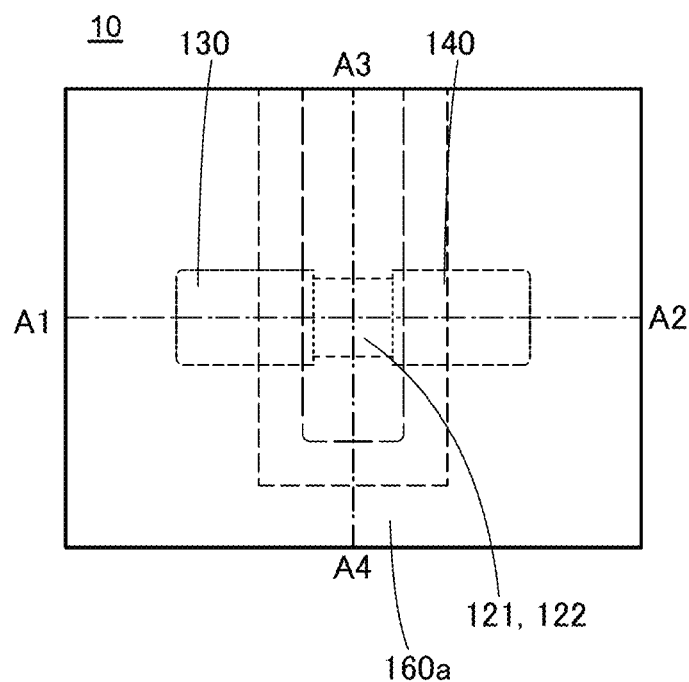
FIGS. 10A and 10B are a top view and a cross-sectional view illustrating a method for manufacturing a transistor.
Figure 10B:
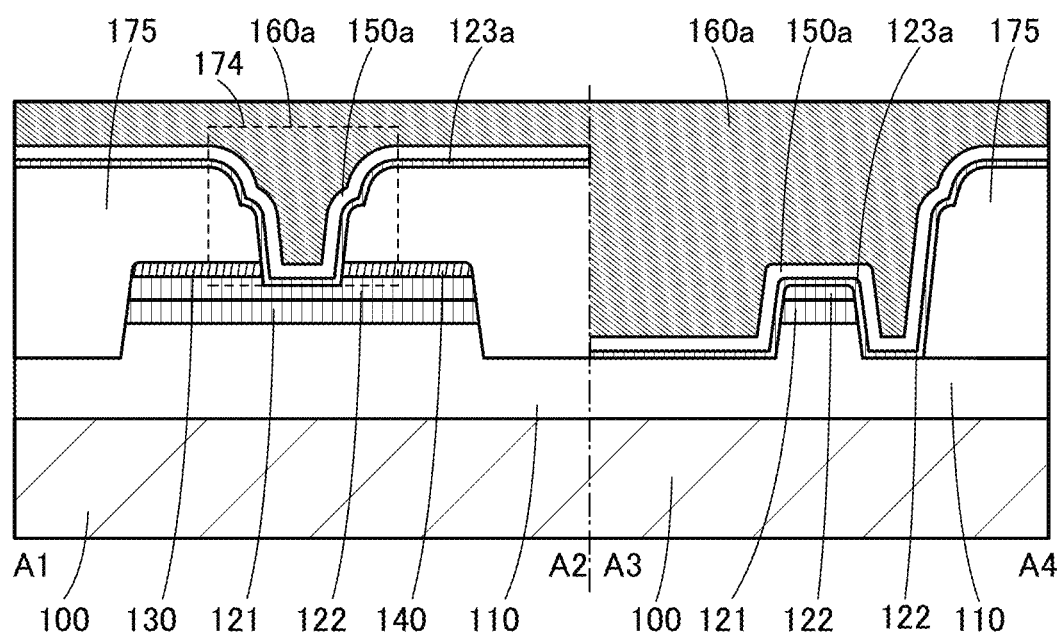
Figure 11A:
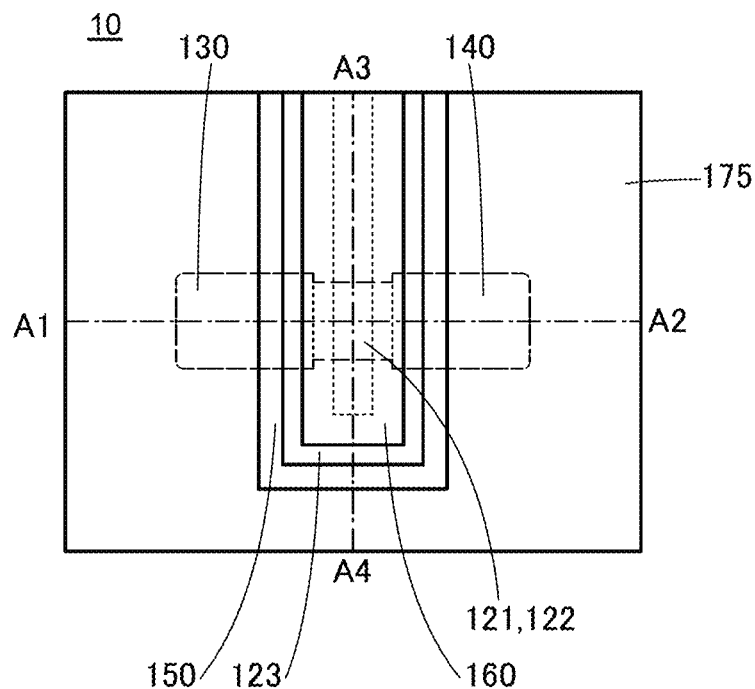
FIGS. 11A and 11B are a top view and a cross-sectional view illustrating a method for manufacturing a transistor.
Figure 11B:
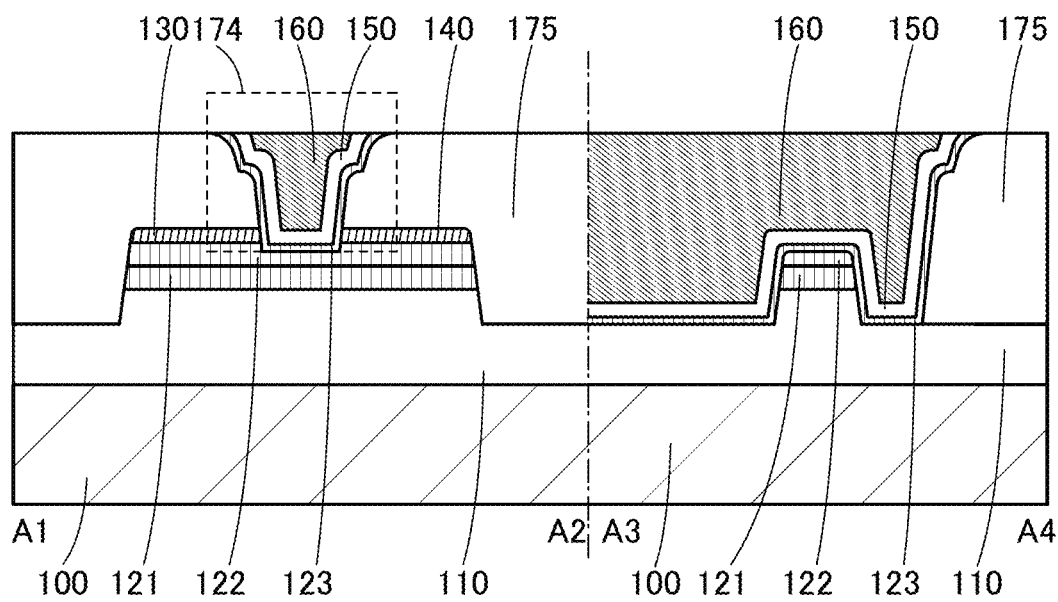

Next, a second conductive film 160a to be the gate electrode layer 160 is formed over the third insulating film 150a (see FIGS. 10A and 10B). For example, aluminum (Al), titanium (Ti), chromium (Cr), cobalt (Co), nickel (Ni), copper (Cu), yttrium (Y), zirconium (Zr), molybdenum (Mo), ruthenium (Ru), silver (Ag), tantalum (Ta), and tungsten (W), or an alloy material containing any of these as its main component can be used for the second conductive film 160a. The second conductive film 160a can be formed by a sputtering method, a CVD method (e.g., a plasma CVD method, an MOCVD method, or an ALD method), an MBE method, an evaporation method, a plating method, or the like. The second conductive film 160a may be formed using a conductive film containing nitrogen or a stack including the above conductive film and a conductive film containing nitrogen.

For example, a stack of a 10-nm-thick titanium nitride film formed by an ALD method and a 150-nm-thick tungsten film formed by a metal CVD method can be used.

<Planarization Treatment>

Then, planarization treatment is performed. The planarization treatment can be performed by a CMP method, a dry etching method, or the like. The planarization treatment may be terminated at the time when the third insulating film 150a is exposed, may be terminated at the time when the second oxide insulating film 123a is exposed, or may be terminated at the time when the insulating layer 175 is exposed. Accordingly, the gate electrode layer 160, the gate insulating layer 150, and the oxide insulating layer 123 can be formed (see FIGS. 11A and 11B).

In the case where the second oxide insulating film 123a or the third insulating film 150a is provided over the insulating layer 175 that has been planarized, another resist mask may be used for the processing. The resist mask is formed over the second oxide insulating film 123a or the third insulating film 150a by a lithography process. The mask has a larger area than that of the top surface portion of the gate electrode layer 160. The third insulating film 150a and the second oxide insulating film 123a are selectively etched using the mask, so that the gate insulating layer 150 and the oxide insulating layer 123 can be formed.

In the transistor 10, by providing the oxide insulating layer 123 in which oxygen vacancies are unlikely to occur, release of oxygen from side surfaces of the oxide semiconductor layer 122 in the channel width direction is suppressed, so that generation of oxygen vacancies can be suppressed. As a result, a transistor which has improved electrical characteristics and high reliability can be provided.

<Formation of Insulating Layer 170>

Figure 12A:
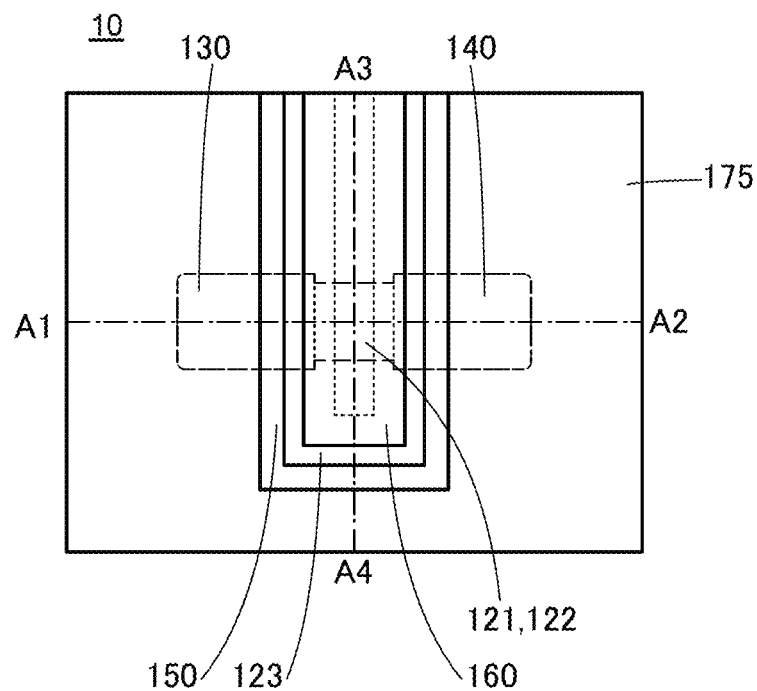
FIGS. 12A and 12B are a top view and a cross-sectional view illustrating a method for manufacturing a transistor.
Figure 12B:
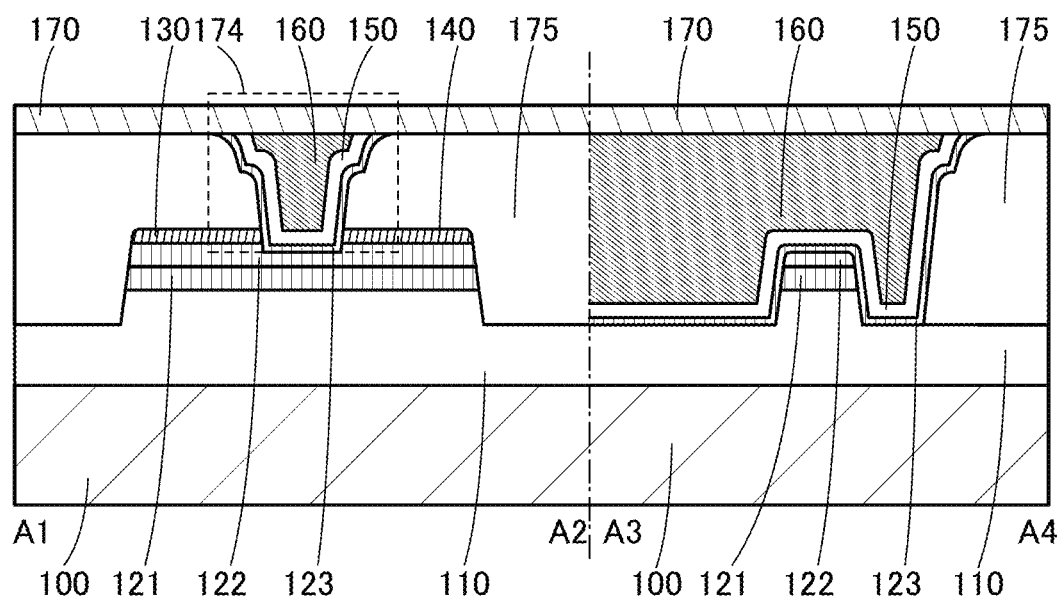

Next, the insulating layer 170 is formed over the insulating layer 175, the oxide insulating layer 123, the gate insulating layer 150, and the gate electrode layer 160 (see FIGS. 12A and 12B). The insulating layer 170 may have a single-layer structure or a stacked-layer structure. The insulating layer 170 can be formed using a material, a method, and the like similar to those of the insulating layer 110.

The insulating layer 170 is preferably an aluminum oxide film formed by a sputtering method. A sputtering gas used for forming the aluminum oxide film preferably contains an oxygen gas. The oxygen gas is contained at 1 vol. % or more and 100 vol. % or less, preferably 4 vol. % or more and 100 vol. % or less, further preferably 10 vol. % or more and 100 vol. % or less. When oxygen is contained at 1 vol. % or more, the insulating layer 170 can contain excess oxygen or excess oxygen can be supplied to insulating layers in contact with the insulating layer 170.

For example, the insulating layer 170 having a thickness from 20 nm to 40 nm can be formed using aluminum oxide as a sputtering target and a sputtering gas that contains 50 vol. % of oxygen gas.

Next, heat treatment may be performed. The temperature of the heat treatment is typically higher than or equal to 150° C. and lower than the strain point of the substrate, preferably higher than or equal to 250° C. and lower than or equal to 500° C., further preferably higher than or equal to 300° C. and lower than or equal to 450° C. By the heat treatment, oxygen added to an insulating layer (e.g., the insulating layer 175) is diffused and moved to the oxide semiconductor layer 122, and oxygen vacancies in the oxide semiconductor layer 122 can be filled with the oxygen.

In this embodiment, heat treatment is performed at 400° C. in an oxygen atmosphere for one hour.

Note that heat treatment may be performed in other processes. Through heat treatment, defects in a film can be repaired, and the density of interface states can be reduced.

<Addition of Oxygen>

Oxygen may be added to the insulating layer 110 and the insulating layer 175, the first oxide insulating film and the second oxide insulating film 123a, or another insulating layer. As the oxygen that is added, at least one kind selected from oxygen radicals, oxygen atoms, oxygen atomic ions, oxygen molecular ions, and the like is used. As a method for adding the oxygen, an ion doping method, an ion implantation method, a plasma immersion ion implantation method, or the like can be used.

In the case of using an ion implantation method as the method for adding oxygen, oxygen atomic ions or oxygen molecular ions can be used. The use of oxygen molecular ions can reduce damage to a film to which oxygen is added. Oxygen molecular ions are broken down into oxygen atomic ions at the surface of the film to which oxygen is added, and the oxygen atomic ions are added. Since energy for breaking oxygen molecules down into oxygen atoms is used, the energy per oxygen atomic ion in the case of adding oxygen molecular ions to the film to which oxygen is added is lower than that in the case of adding oxygen atomic ions to the film to which oxygen is added. Therefore, damage to the film to which oxygen is added can be reduced.

By using oxygen molecular ions, the energy of each oxygen atomic ion injected to the film to which oxygen is added is lowered, which makes the injected oxygen atomic ion be positioned in a shallow region. Accordingly, oxygen atoms easily move by later heat treatment, so that more oxygen can be supplied to an oxide semiconductor film.

In the case of injecting oxygen molecular ions, the energy per oxygen atomic ion is low as compared with the case of injecting oxygen atomic ions. Thus, by using oxygen molecular ions for injection, the acceleration voltage can be increased and throughput can be increased. Moreover, by using oxygen molecular ions for injection, the dose can be half of the amount that is necessary in the case of using oxygen atomic ions. As a result, throughput can be increased.

In the case of adding oxygen to the film to which oxygen is added, it is preferable that oxygen be added to the film to which oxygen is added so that a peak of the concentration profile of oxygen atomic ions is located in the film to which oxygen is added. In that case, the acceleration voltage for implantation can be lowered as compared to the case where oxygen atomic ions are implanted, and damage to the film to which oxygen is added can be reduced. In other words, defects in the film to which oxygen is added can be reduced, and variations in electrical characteristics of the transistor can be suppressed. Furthermore, in the case where oxygen is added to the film to which oxygen is added so that the amount of added oxygen atoms at the interface between the insulating layer 110 and the oxide insulating layer 121 is less than $1 \times 10^{21}$ atoms/cm$^3$, less than $1 \times 10^{20}$ atoms/cm$^3$, or less than $1 \times 10^{19}$ atoms/cm$^3$, the amount of oxygen added to the insulating layer 110 can be reduced. As a result, damage to the film to which oxygen is added can be reduced, suppressing variation in the electrical characteristics of the transistor.

Plasma treatment (plasma immersion ion implantation method) in which the film to which oxygen is added is exposed to plasma generated in an atmosphere containing oxygen may be performed, to add oxygen to the film to which oxygen is added. As the atmosphere containing oxygen, an atmosphere containing an oxidation gas such as oxygen, ozone, dinitrogen monoxide, or nitrogen dioxide can be given. Note that it is preferable that the film to which oxygen is added be exposed to plasma generated in a state where bias is applied on the substrate 100 side because the amount of oxygen added to the film to which oxygen is added can be increased. As an example of an apparatus with which such plasma treatment is performed, an ashing apparatus is given.

For example, oxygen molecular ions can be added to the first oxide insulating film by an ion implantation method with a dose of $1 \times 10^{16}$/cm$^2$ at an acceleration voltage of 5 kV.

Through the above-described steps, the density of localized states of the oxide semiconductor films is lowered, and thus a transistor with excellent electrical characteristics can be manufactured. In addition, a highly reliable transistor in which variations in electrical characteristics with time or variations in electrical characteristics due to a stress test are reduced can be manufactured.

Note that the shape of the transistor is not limited to the above-described structure. Modification examples of the transistor 10 and a structure example different from that of the transistor 10 are described below.

<Modification Example 1 of Transistor 10: Transistor 11>

A transistor 11 with a shape different from that of the transistor 10 illustrated in FIGS. 1A and 1B will be described with reference to FIGS. 13A and 13B.

Figure 13A:
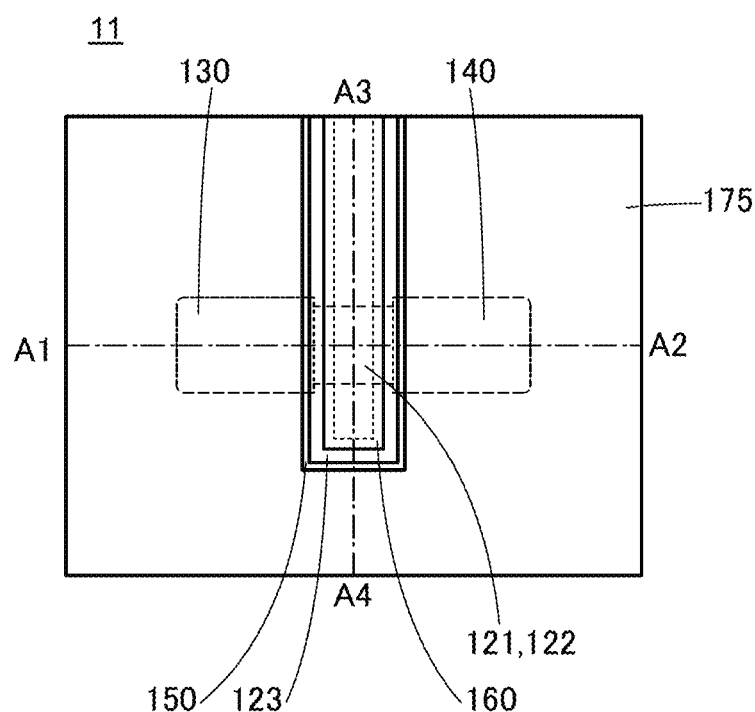
FIGS. 13A and 13B are a top view and a cross-sectional view illustrating a transistor.
Figure 13B:
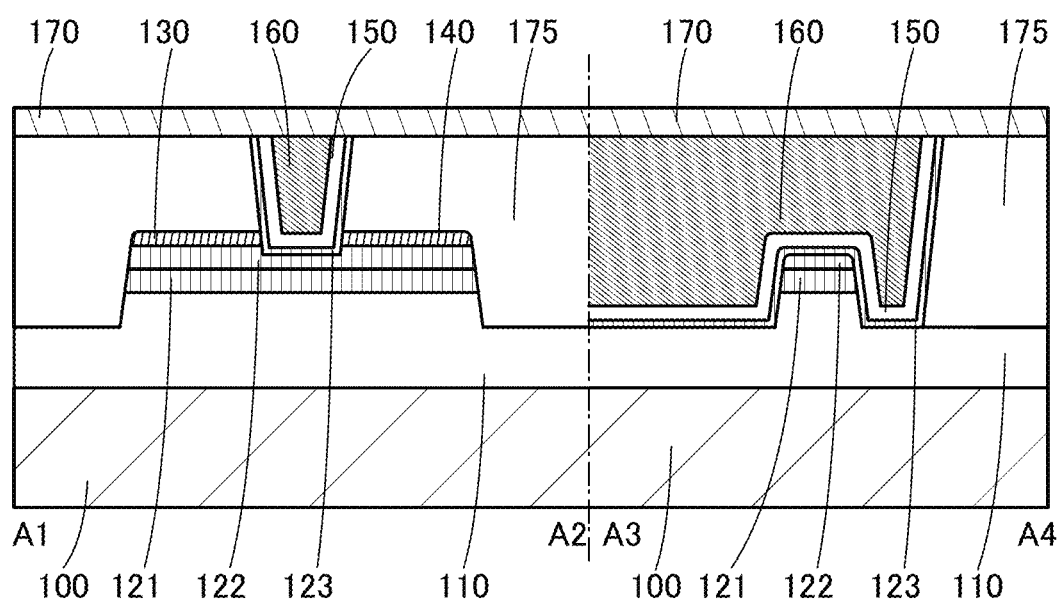

FIGS. 13A and 13B are a top view and a cross-sectional view of the transistor 11. FIG. 13A is a top view of the transistor 11 and FIG. 13B is a cross-sectional view taken along dashed-dotted line A1-A2 and dashed-dotted line A3-A4 in FIG. 13A.

Figure 15A:
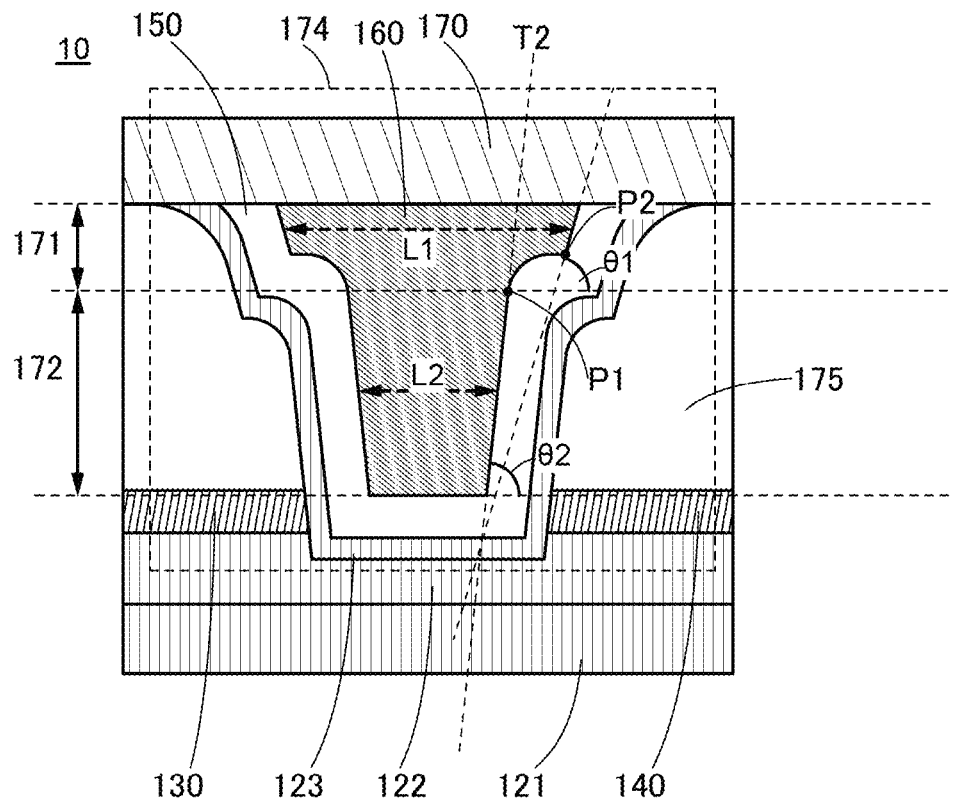
FIGS. 15A to 15C are enlarged cross-sectional views of transistors.
Figure 15B:
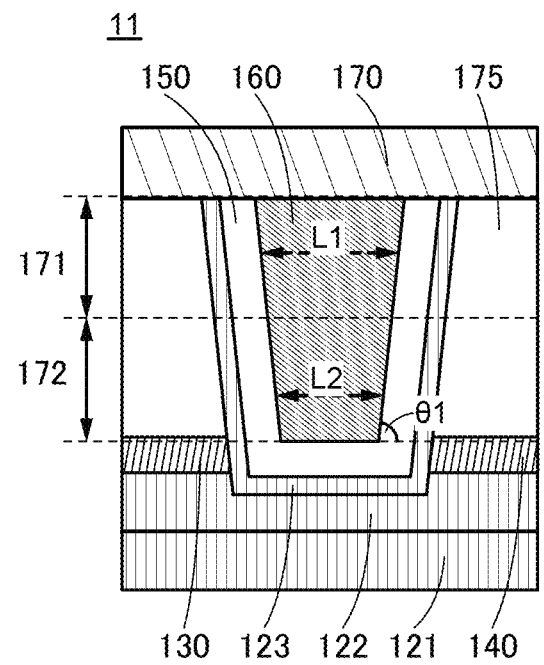

As illustrated in FIG. 15B, which is an enlarged view, the transistor 11 is different from the transistor 10 (see FIG. 15A) in that the side surface portion of the gate electrode layer 160 has a taper angle θ1 and does not have an inflection point. With such a structure, the embeddability of each layer can be improved.

<Modification Example 2 of Transistor 10: Transistor 12>

A transistor 12 with a different shape from that of the transistor 10 illustrated in FIGS. 1A and 1B will be described with reference to FIGS. 14A and 14B.

Figure 14A:
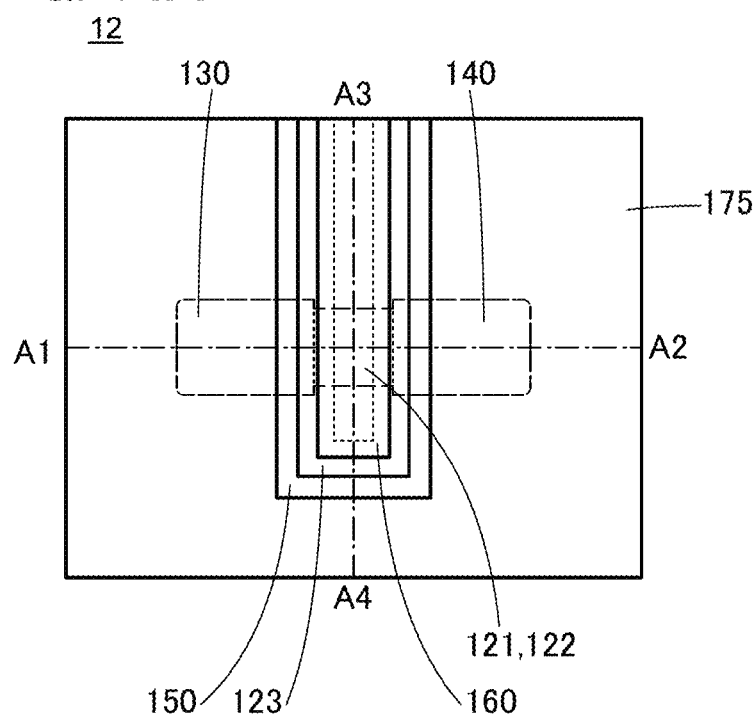
FIGS. 14A and 14B are a top view and a cross-sectional view illustrating a transistor.
Figure 14B:
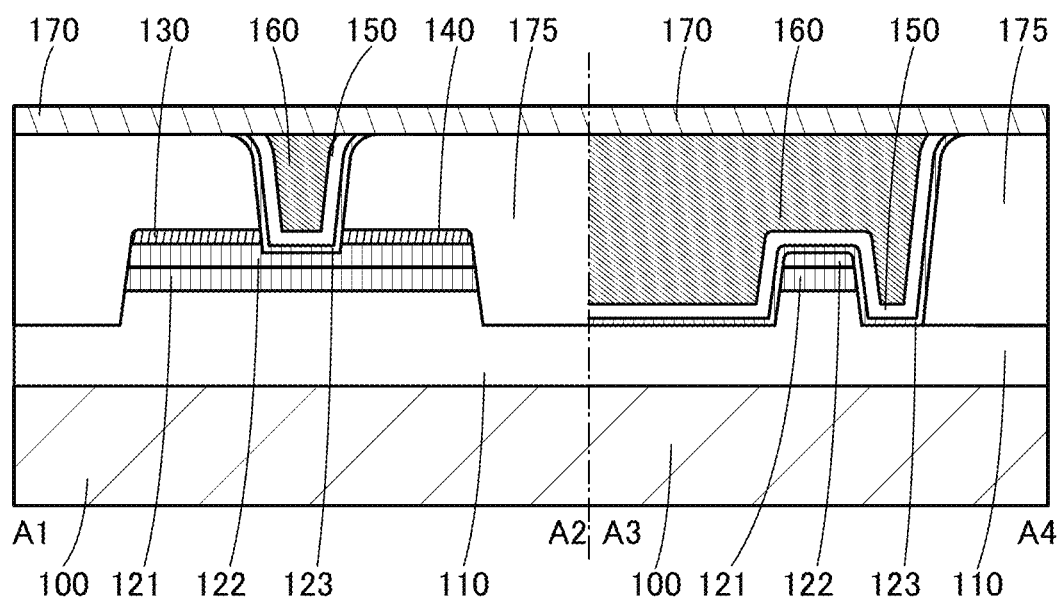

FIGS. 14A and 14B are a top view and a cross-sectional view of the transistor 12. FIG. 14A is a top view of the transistor 12 and FIG. 14B is a cross-sectional view taken along dashed-dotted line A1-A2 and dashed-dotted line A3-A4 in FIG. 14A.

Figure 15C:
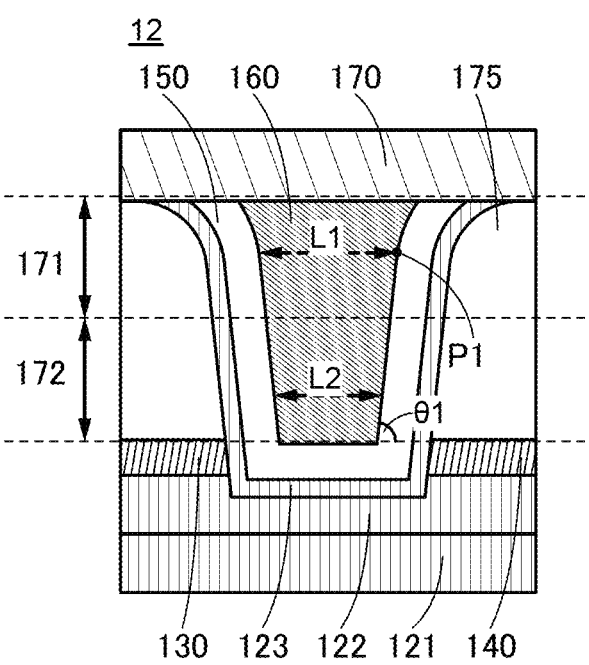

As illustrated in FIG. 15C, which is an enlarged view, the transistor 12 is different from the transistor 10 in that the side surface portion of the gate electrode layer 160 has the taper angle θ1 and an inflection point P1 and a width L1 in an upper region of the gate electrode layer 160 is larger than a width L2 in a lower region of the gate electrode layer 160.

The manufacturing method of the transistor described in this embodiment can be easily introduced into the conventional semiconductor manufacturing facilities.

This embodiment can be combined as appropriate with any of the other embodiments and examples in this specification.

Embodiment 2

In this embodiment, a transistor 13 having a structure which is different from the structures of the transistor 10, the transistor 11, and the transistor 12 described in Embodiment 1 and a method for manufacturing the transistor 13 will be described.

Figure 16A:
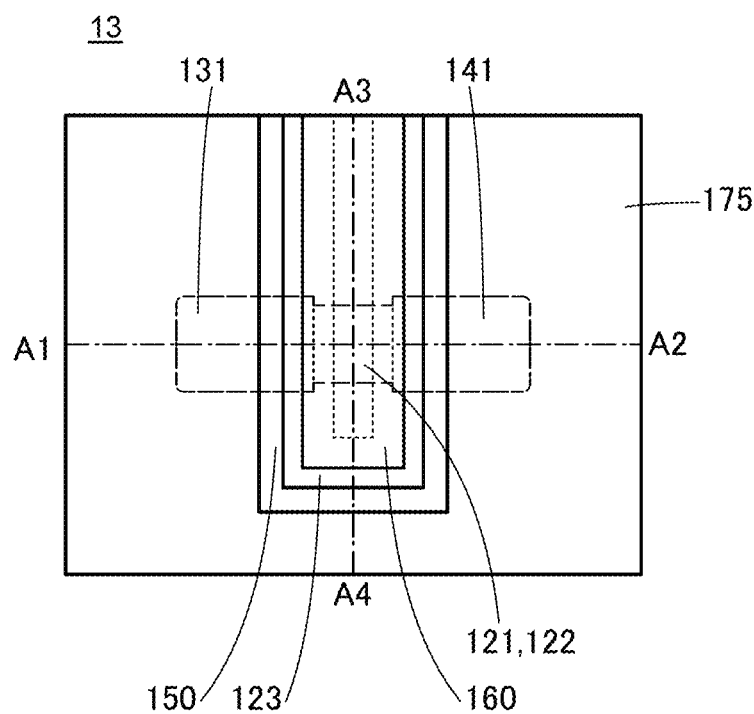
FIGS. 16A and 16B are a top view and a cross-sectional view illustrating a transistor.
Figure 16B:
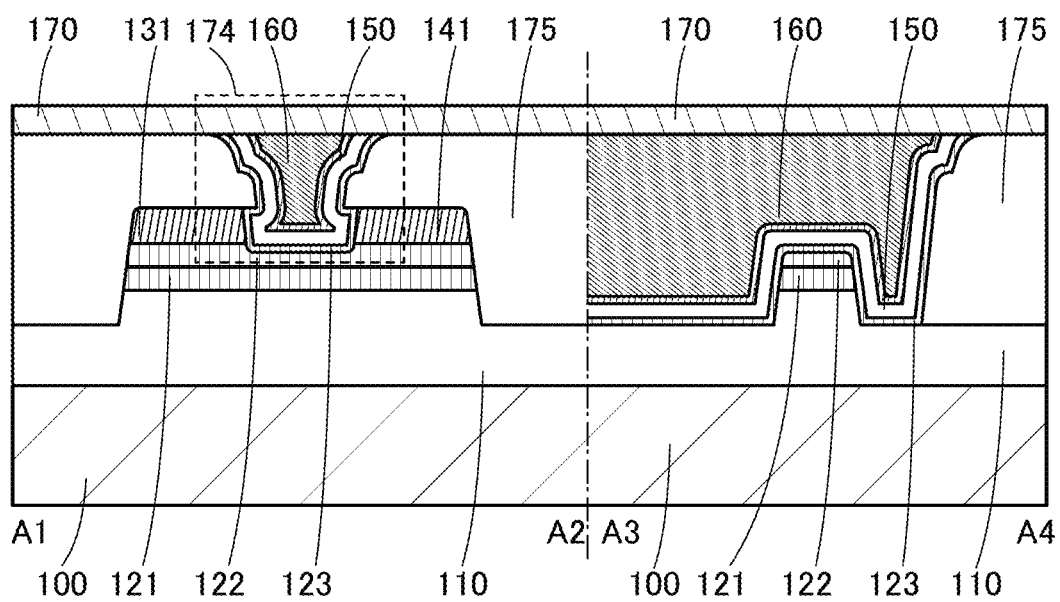

FIGS. 16A and 16B are a top view and a cross-sectional view of the transistor 13 of one embodiment of the present invention. FIG. 16A is a top view and FIG. 16B is a cross-sectional view taken along dashed-dotted line A1-A2 and dashed-dotted line A3-A4 in FIG. 16A. In FIG. 16A, some components are scaled up or down in size or omitted for easy understanding. In addition, the direction of dashed-dotted line A1-A2 and the direction of dashed-dotted line A3-A4 are sometimes referred to as a channel length direction and a channel width direction, respectively.

The transistor 13 is different from the transistor 10 in that in the groove portion 174, the end portions of the bottom surface of the insulating layer 175 protrudes from the end portion of each of the source electrode layer 131 and the drain electrode layer 141 as illustrated in FIGS. 16A and 16B.

Figure 17A:
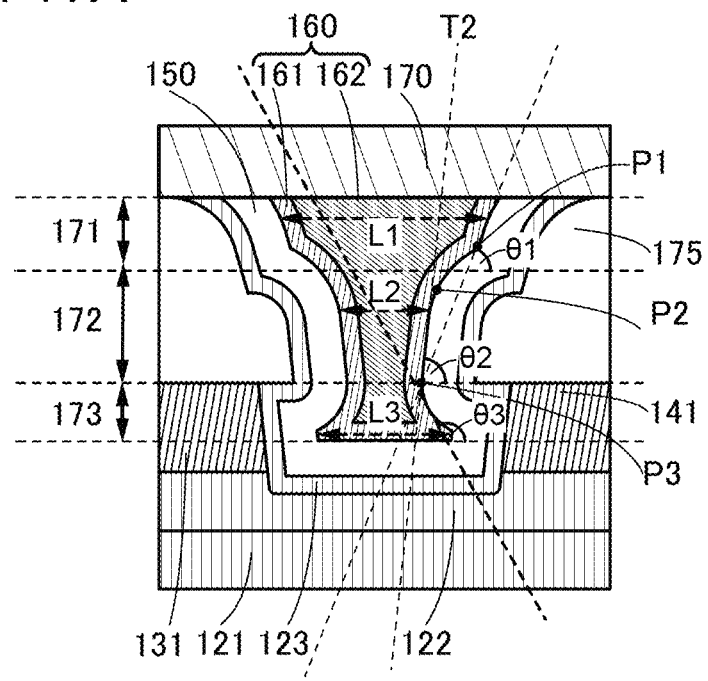
FIGS. 17A and 17B are enlarged cross-sectional views of transistors.
Figure 17B:
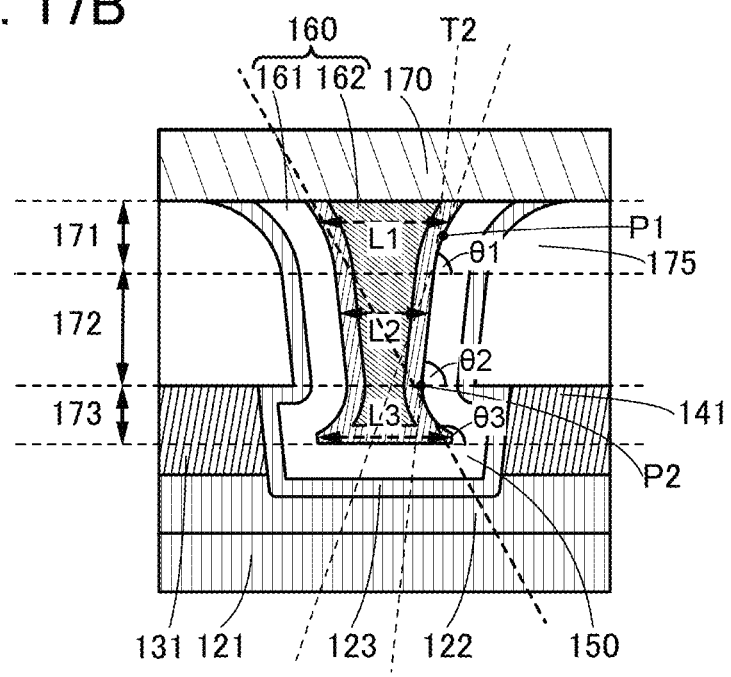

FIGS. 17A and 17B are enlarged views of the transistor 13. The transistor 13 includes the oxide insulating layer 123, the gate insulating layer 150, and the gate electrode layer 160 (e.g., the gate electrode layer 161 and the gate electrode layer 162) in the groove portion 174. The gate electrode layer 160 includes a first region 171, a second region 172, and a third region 173 that have different widths in the groove portion 174. The first region 171 is positioned over the second region 172 and the third region 173, and the second region 172 is positioned over the third region 173. The width L1 in the first region can be larger than or the same as the width L2 in the second region. In addition, a width L3 in the third region can be larger or smaller than or the same as the width L2 in the second region.

Furthermore, in the case where an angle formed by a plane which is parallel to a substrate and a side surface portion of the gate electrode layer 160 is referred to as a taper angle, the transistor 13 has a taper angle θ1 in the first region, a taper angle θ2 in the second region, and a taper angle θ3 in the third region. In addition, in the transistor 13, the gate electrode layer 160 has an inflection point P1, an inflection point P2, and an inflection point P3. Note that the transistor 13 can have a shape including the inflection point P1 and the inflection point P2 as illustrated in FIG. 17B.

Moreover, in the transistor 13, the side surface portions in the first region 171 and the third region 173 of the gate electrode layer 160 can extend beyond the tangent T2 obtained in the second region 172.

Furthermore, the gate electrode layer 160 has a shape which is narrow in the middle. Alternatively, the gate electrode layer 160 of the transistor 13 may have a round shape or a linear shape.

In the transistor 13 with such a shape, parasitic capacitance generated between the gate electrode layer 160 and the source electrode layer 131 or between the gate electrode layer 160 and the drain electrode layer 141 can be further reduced. Thus, the cut-off frequency characteristics of the transistor 13 are improved. That is, the high-speed response of the transistor 13 can be achieved.

<Manufacturing Method of Transistor 13>

A manufacturing method of the transistor 13 will be described below. Note that for steps similar to those of the transistor 10 described in Embodiment 1, the description of the transistor is referred to.

Figure 8A:
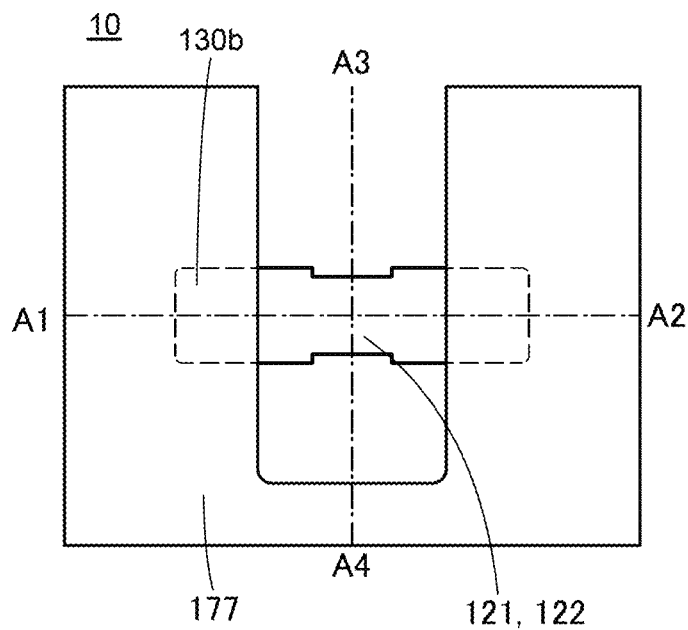
FIGS. 8A and 8B are a top view and a cross-sectional view illustrating a method for manufacturing a transistor.
Figure 8B:
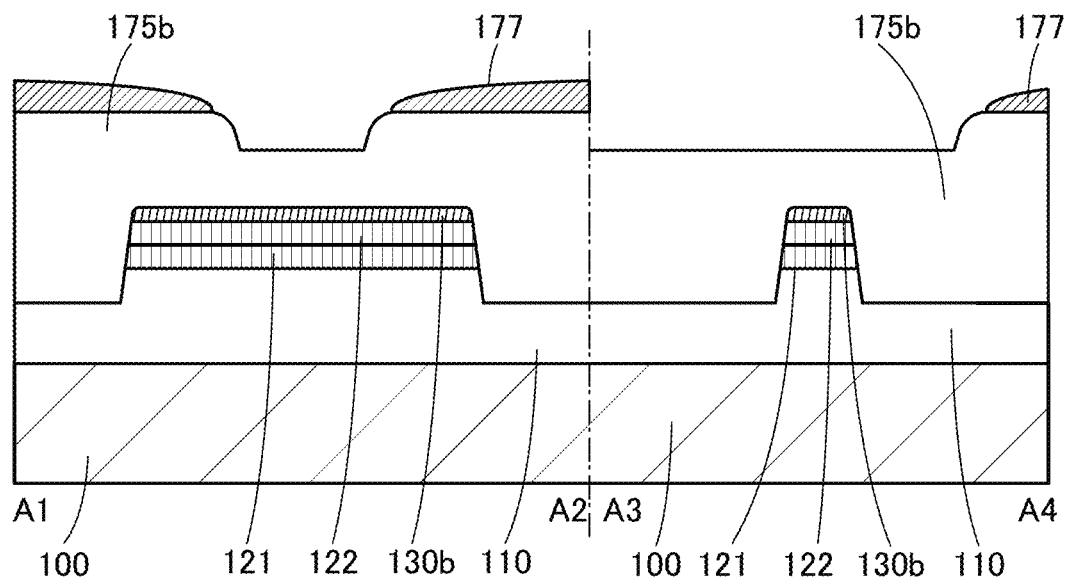

As illustrated in FIGS. 8A and 8B, steps up to the formation of the insulating layer 175b and the conductive layer 130b are performed.

Figure 18A:
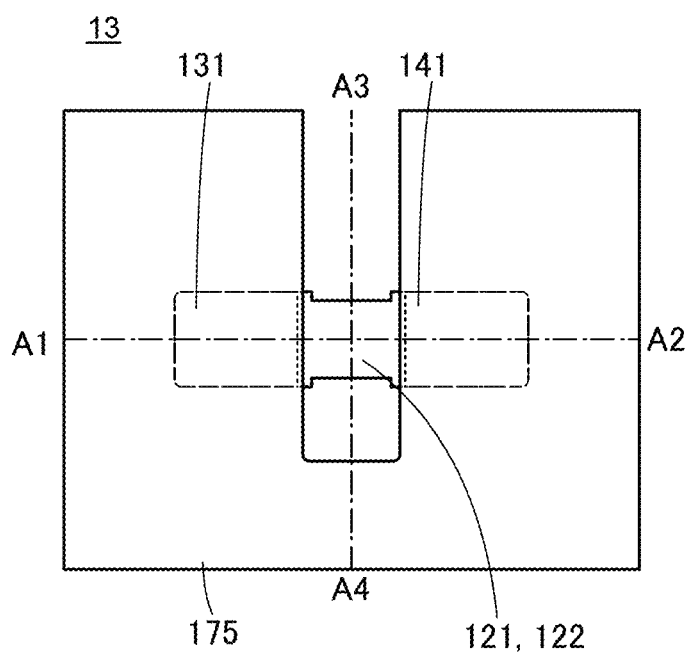
FIGS. 18A and 18B are a top view and a cross-sectional view illustrating a method for manufacturing a transistor.
Figure 18B:
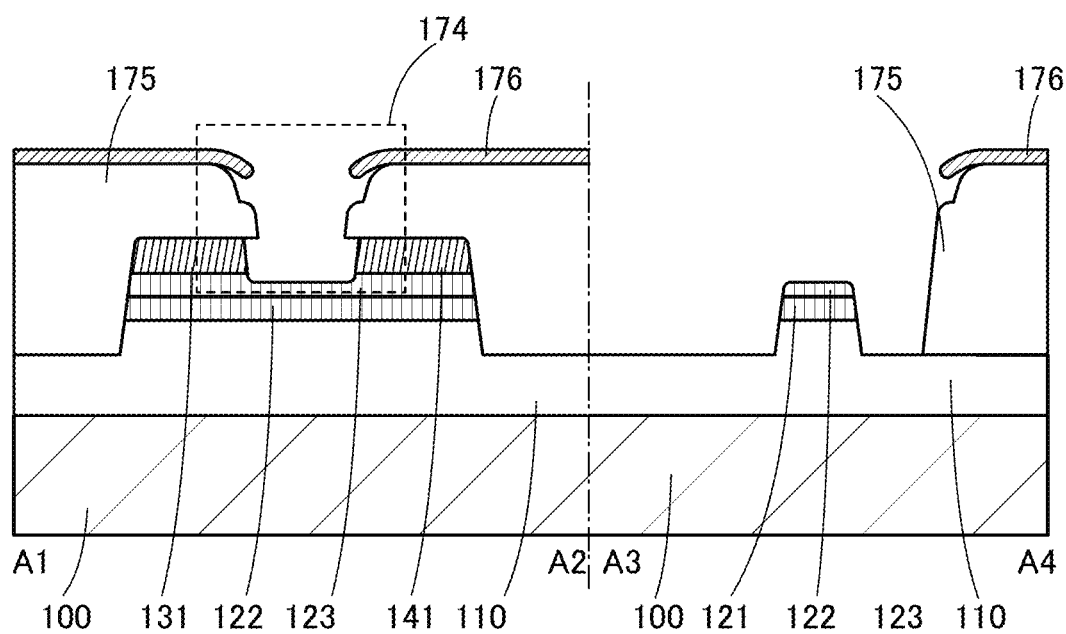

Next, as illustrated in FIGS. 18A and 18B, the conductive layer 130b is etched in the direction substantially perpendicular to a substrate surface to form the source electrode layer 131 and the drain electrode layer 141. At this time, the oxide semiconductor layer 122 may be slightly etched or may be hardly etched.

Figure 19A:
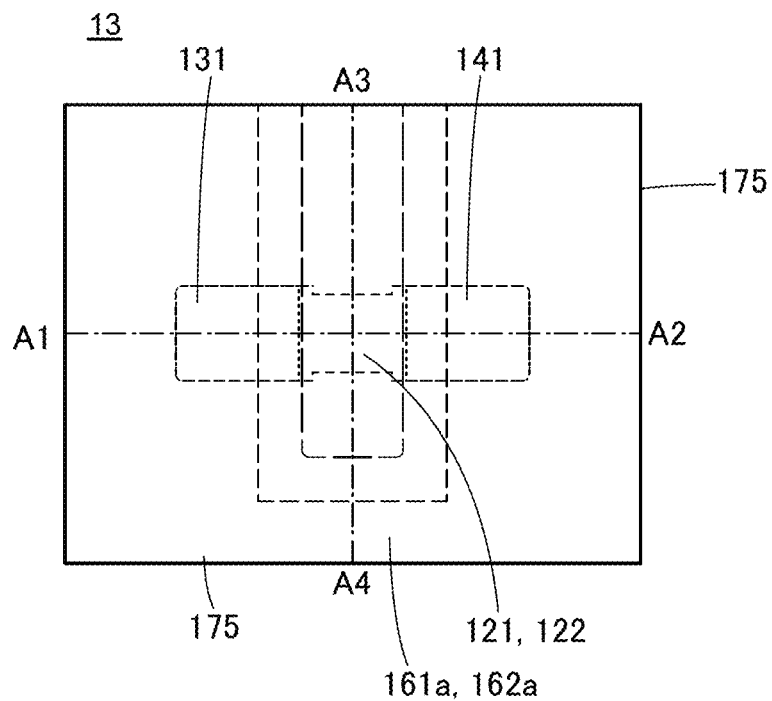
FIGS. 19A and 19B are a top view and a cross-sectional view illustrating a method for manufacturing a transistor.
Figure 19B:
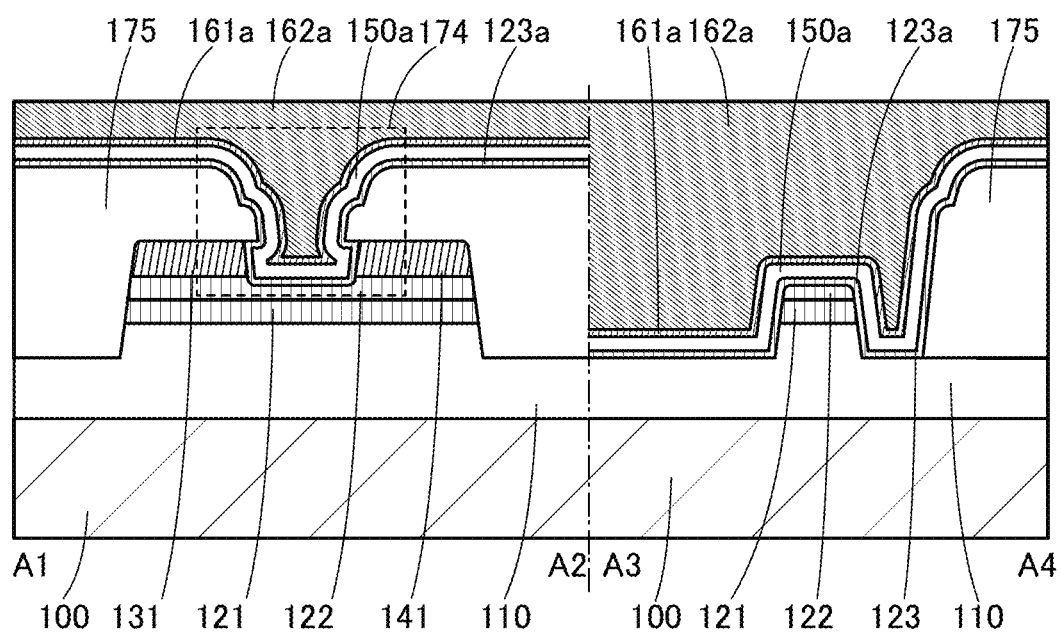
Figure 20A:
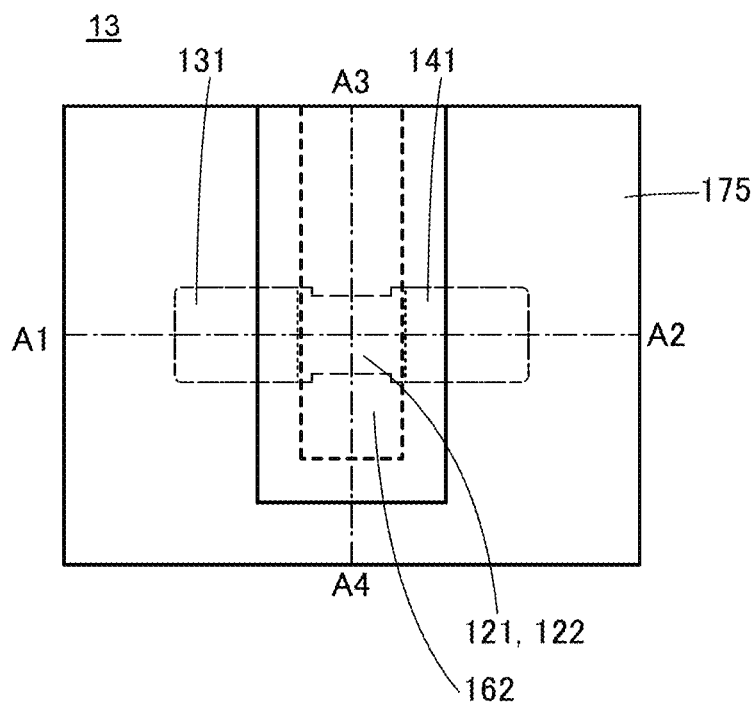
FIGS. 20A and 20B are a top view and a cross-sectional view illustrating a method for manufacturing a transistor.
Figure 20B:
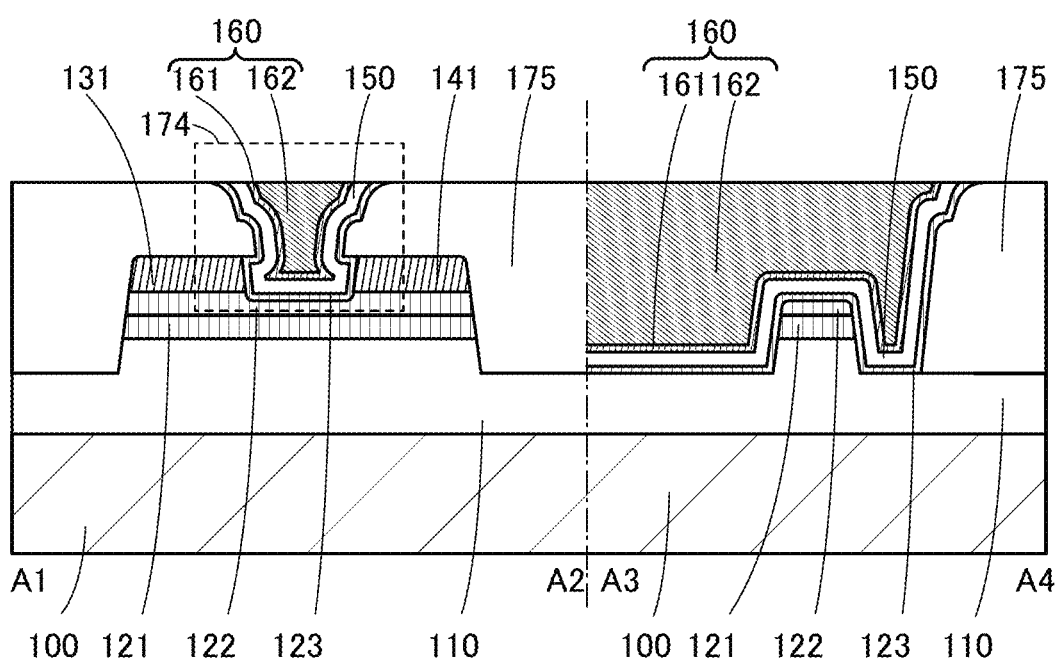
Figure 21A:
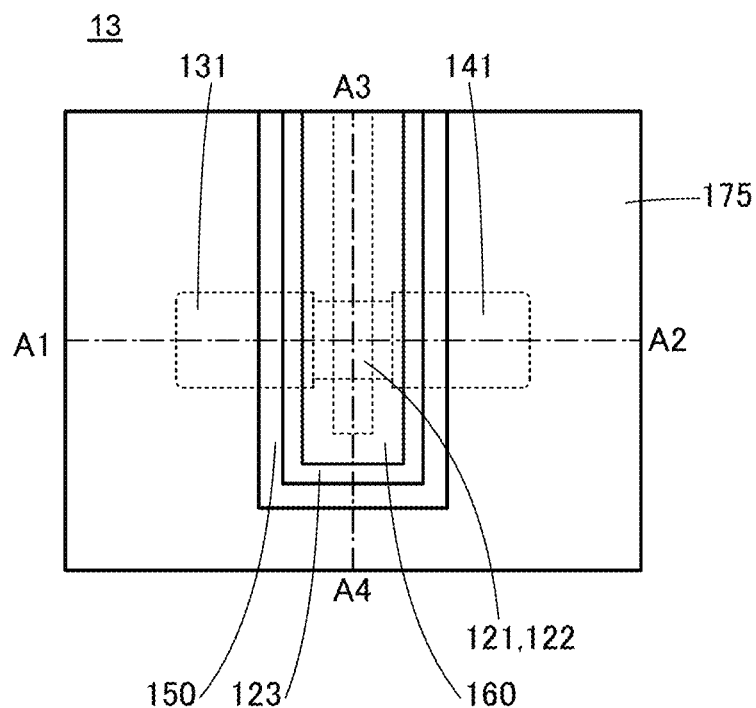
FIGS. 21A and 21B are a top view and a cross-sectional view illustrating a method for manufacturing a transistor.
Figure 21B:
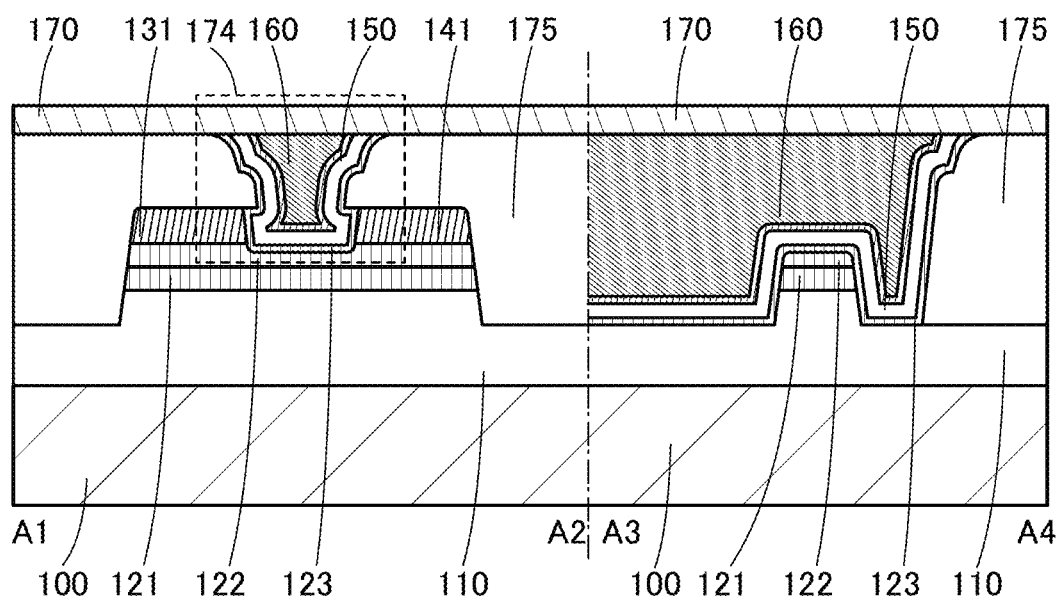

Then, the second oxide insulating film 123a, the third insulating film 150a, a conductive film 161a, and a conductive film 162a are sequentially formed (see FIGS. 19A and 19B), planarization treatment is performed (see FIGS. 20A and 20B), and the insulating layer 170 is formed, whereby the transistor 13 is formed (see FIGS. 21A and 21B).

This embodiment can be combined as appropriate with any of the other embodiments and examples in this specification.

Embodiment 3

<Oxide Semiconductor Structure>

The structure of an oxide semiconductor is described in this embodiment.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 22A:
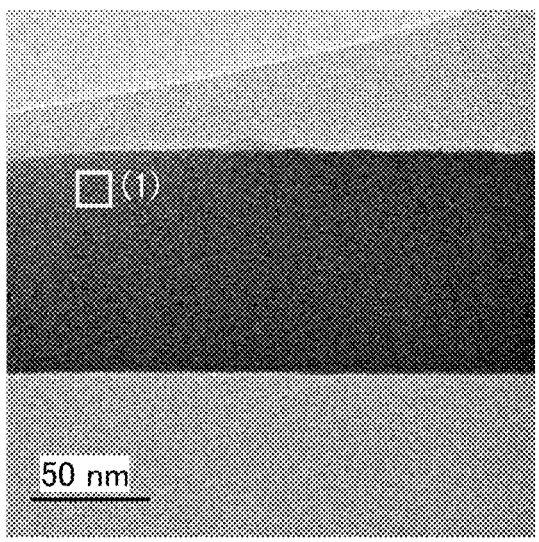
FIGS. 22A to 22D are Cs-corrected high-resolution TEM images of a cross section of a CAAC-OS and a cross-sectional schematic view of the CAAC-OS.

The CAAC-OS observed with a TEM is described below. FIG. 22A shows a high-resolution TEM image of a cross section of the CAAC-OS layer which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 22B:
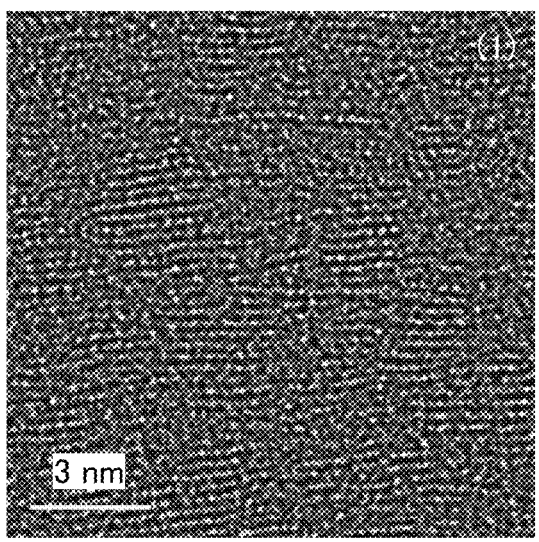

FIG. 22B is an enlarged Cs-corrected high-resolution TEM image of a region (1) in FIG. 22A. FIG. 22B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 22C:
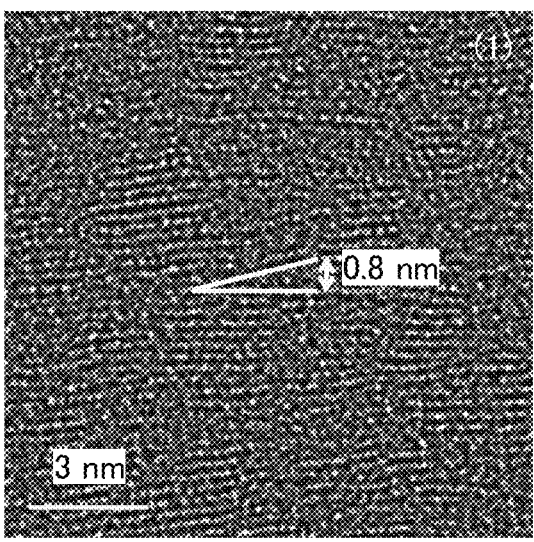

As shown in FIG. 22B, the CAAC-OS film has a characteristic atomic arrangement. The characteristic atomic arrangement is denoted by an auxiliary line in FIG. 22C. FIGS. 22B and 22C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 22D:
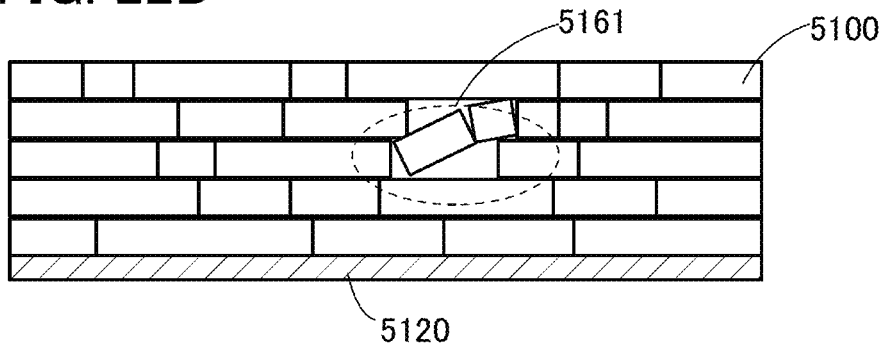

Here, according to the Cs-corrected high-resolution TEM images, the schematic arrangement of pellets 5100 of a CAAC-OS layer over a substrate 5120 is illustrated by such a structure in which bricks or blocks are stacked (see FIG. 22D). The part in which the pellets are tilted as observed in FIG. 22C corresponds to a region 5161 shown in FIG. 22D.

FIG. 23A shows a Cs-corrected high-resolution TEM image of a plane of the CAAC-OS observed from a direction substantially perpendicular to the sample surface. FIGS. 23B, 23C, and 23D are enlarged Cs-corrected high-resolution TEM images of regions (1), (2), and (3) in FIG. 23A, respectively. FIGS. 23B, 23C, and 23D indicate that metal atoms are arranged in a triangular, quadrangular, or hexagonal configuration in a pellet. However, there is no regularity of arrangement of metal atoms between different pellets.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 24A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 24B, a peak is not clearly observed. In contrast, in the case of a single crystal oxide semiconductor of InGaZnO$_4$, when f scan is performed with 2θ fixed at around 56°, as shown in FIG. 24C, six peaks which are derived from crystal planes equivalent to the (110) plane are observed. Accordingly, the structural analysis using XRD shows that the directions of a-axes and b-axes are irregularly oriented in the CAAC-OS.

Figure 25A:
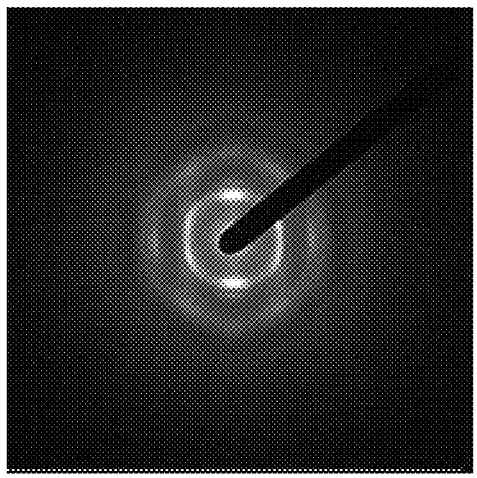
FIGS. 25A and 25B show electron diffraction patterns of a CAAC-OS.
Figure 25B:
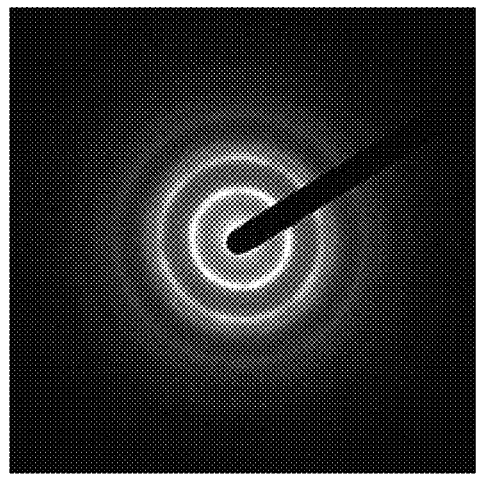

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 25A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 25B shows a diffraction pattern obtained in such a manner that an electron beam with a probe diameter of 300 nm is incident on the same sample in a direction perpendicular to the sample surface. As shown in FIG. 25B, a ring-like diffraction pattern is observed. Thus, the electron diffraction also indicates that the a-axes and b-axes of the pellets included in the CAAC-OS do not have regular alignment. The first ring in FIG. 25B is considered to be derived from the (010) plane, the (100) plane, and the like of the InGaZnO$_4$ crystal. Furthermore, it is supposed that the second ring in FIG. 25B is derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. Furthermore, oxygen vacancy in the oxide semiconductor serves as a carrier trap or serves as a carrier generation source when hydrogen is captured therein.

The CAAC-OS having small amounts of impurities and oxygen vacancy is an oxide semiconductor with low carrier density (specifically, lower than $8\times10^{11}/cm^3$, preferably lower than $1\times10^{11}/cm^3$, further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS.

Thus, the orientation of the whole film is not observed. Accordingly, the nc-OS cannot be distinguished from an a-like OS and an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS layer, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS is an oxide semiconductor having a structure between the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 26:
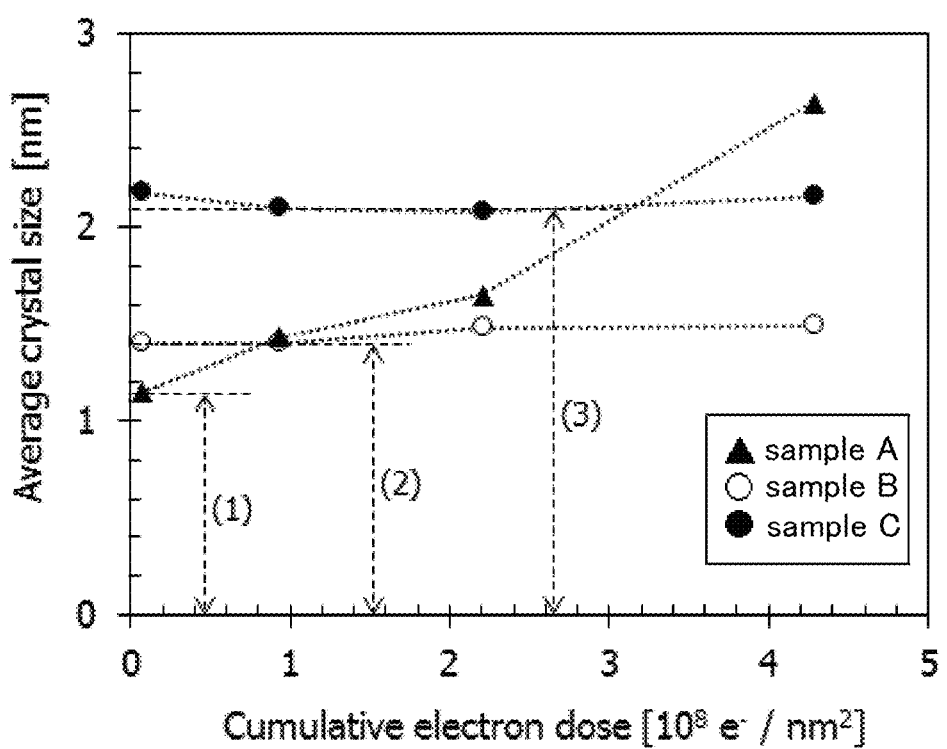
FIG. 26 shows a change of crystal parts of In—Ga—Zn oxide owing to electron irradiation.

FIG. 26 shows change in the average size of crystal parts (at 22 points to 45 points) in each sample. Note that the crystal part size corresponds to the length of a lattice fringe.

FIG. 26 indicates that the crystal part size in the a-like OS increases with an increase in the cumulative electron dose. Specifically, as shown by (1) in FIG. 26, a crystal part of approximately 1.2 nm at the start of TEM observation (the crystal part is also referred to as an initial nucleus) grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 26, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

Embodiment 4

In this embodiment, an example of a circuit including the transistor of one embodiment of the present invention is described with reference to drawings.

<Cross-Sectional Structure>

Figure 27A:
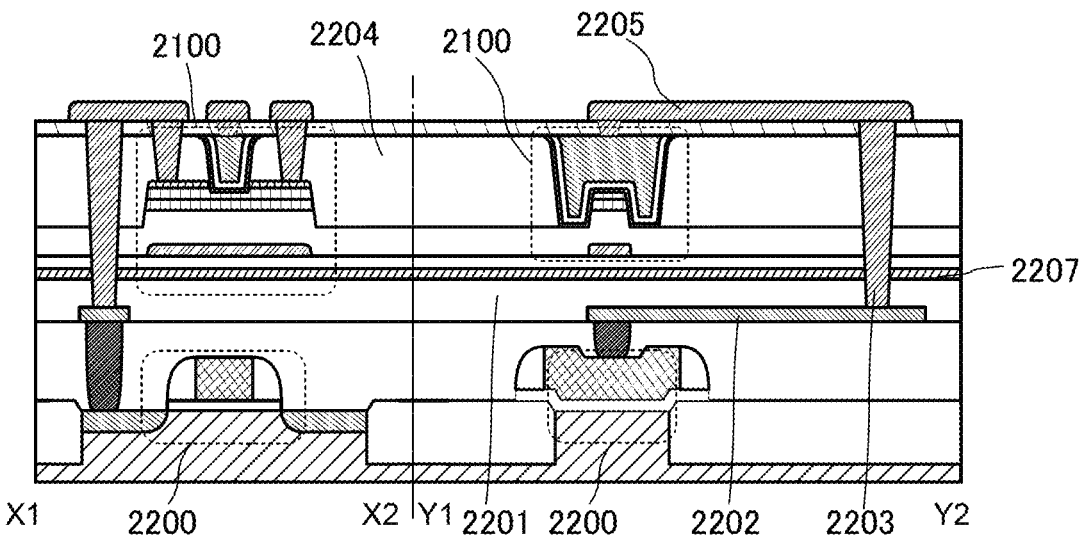
FIGS. 27A to 27D are cross-sectional views and circuit diagrams of a semiconductor device.

FIG. 27A is a cross-sectional view of a semiconductor device of one embodiment of the present invention. In FIG. 27A, X1-X2 direction and Y1-Y2 direction represent a channel length direction and a channel width direction, respectively. The semiconductor device illustrated in FIG. 27A includes a transistor 2200 containing a first semiconductor material in a lower portion and a transistor 2100 containing a second semiconductor material in an upper portion. In FIG. 27A, an example is described in which the transistor described in the above embodiment as an example is used as the transistor 2100 containing the second semiconductor material. A cross-sectional view of the transistors in a channel length direction is on the left side of a dashed-dotted line, and a cross-sectional view of the transistors in a channel width direction is on the right side of the dashed-dotted line.

Here, the first semiconductor material and the second semiconductor material are preferably materials having different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. In contrast, a transistor using an oxide semiconductor and described in the above embodiment as an example has excellent subthreshold characteristics and a minute structure. Furthermore, the transistor can operate at a high speed because of its high switching speed and has low leakage current because of its low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which uses an oxide semiconductor.

FIG. 27A illustrates a structure in which the transistor 2100 is provided over the transistor 2200 with an insulator 2201 and an insulator 2207 provided therebetween. A plurality of wirings 2202 are provided between the transistor 2200 and the transistor 2100. Furthermore, wirings and electrodes provided over and under the insulators are electrically connected to each other through a plurality of plugs 2203 embedded in the insulators. An insulator 2204 covering the transistor 2100 and a wiring 2205 over the insulator 2204 are provided.

The stack of the two kinds of transistors reduces the area occupied by the circuit, allowing a plurality of circuits to be highly integrated.

Here, in the case where a silicon-based semiconductor material is used for the transistor 2200 provided in a lower portion, hydrogen in an insulator provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulator provided in the vicinity of the semiconductor film of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulator 2207 having a function of preventing diffusion of hydrogen is provided between the transistors 2100 and 2200. The insulator 2207 makes hydrogen remain in the lower portion, thereby improving the reliability of the transistor 2200. In addition, since the insulator 2207 suppresses diffusion of hydrogen from the lower portion to the upper portion, the reliability of the transistor 2100 can also be improved.

The insulator 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film having a function of preventing diffusion of hydrogen is preferably formed over the transistor 2100 to cover the transistor 2100 including an oxide semiconductor film. For the blocking film, a material that is similar to that of the insulator 2207 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the blocking film covering the transistor 2100, release of oxygen from the oxide semiconductor film included in the transistor 2100 can be prevented and entry of water and hydrogen into the oxide semiconductor film can be prevented. Note that as the block film, the insulator 2204 having a stacked-layer structure may be used, or the block film may be provided under the insulator 2204.

Note that the transistor 2200 can be a transistor of various types without being limited to a planar type transistor. For example, the transistor 2200 can be a fin-type transistor, a tri-gate transistor, or the like. An example of a cross-sectional view in this case is shown in FIG. 27D. An insulator 2212 is provided over a semiconductor substrate 2211. The semiconductor substrate 2211 includes a projecting portion with a thin tip (also referred to a fin). Note that an insulator may be provided over the projecting portion. The insulator functions as a mask for preventing the semiconductor substrate 2211 from being etched when the projecting portion is formed. The projecting portion does not necessarily have the thin tip; a projecting portion with a cuboid-like projecting portion and a projecting portion with a thick tip are permitted, for example. A gate insulator 2214 is provided over the projecting portion of the semiconductor substrate 2211, and a gate electrode 2213 is provided over the gate insulator 2214. Source and drain regions 2215 are formed in the semiconductor substrate 2211. Note that here is shown an example in which the semiconductor substrate 2211 includes the projecting portion; however, a semiconductor device of one embodiment of the present invention is not limited thereto. For example, a semiconductor region having a projecting portion may be formed by processing an SOI substrate.

<Circuit Configuration Example>

In the above structure, electrodes of the transistor 2100 and the transistor 2200 can be connected as appropriate; thus, a variety of circuits can be formed. Examples of circuit configurations which can be achieved by using a semiconductor device of one embodiment of the present invention are shown below.

<CMOS Inverter Circuit>

Figure 27B:
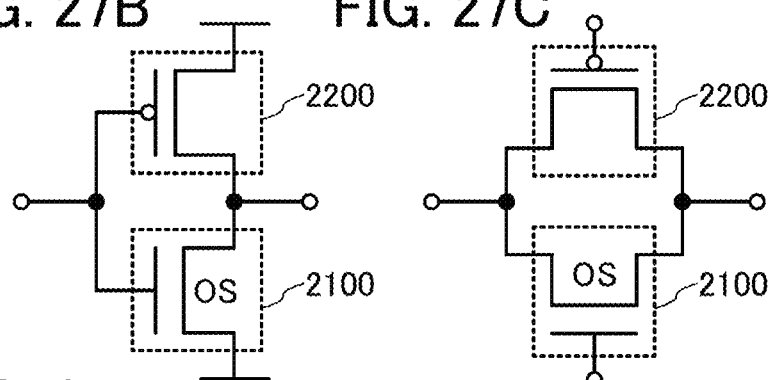

A circuit diagram in FIG. 27B shows a configuration of a CMOS inverter in which the p-channel transistor 2200 and the n-channel transistor 2100 are connected to each other in series and in which gates of them are connected to each other.

<CMOS Analog Switch>

Figure 27C:
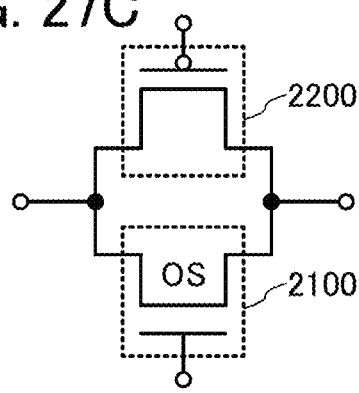
Figure 27D:
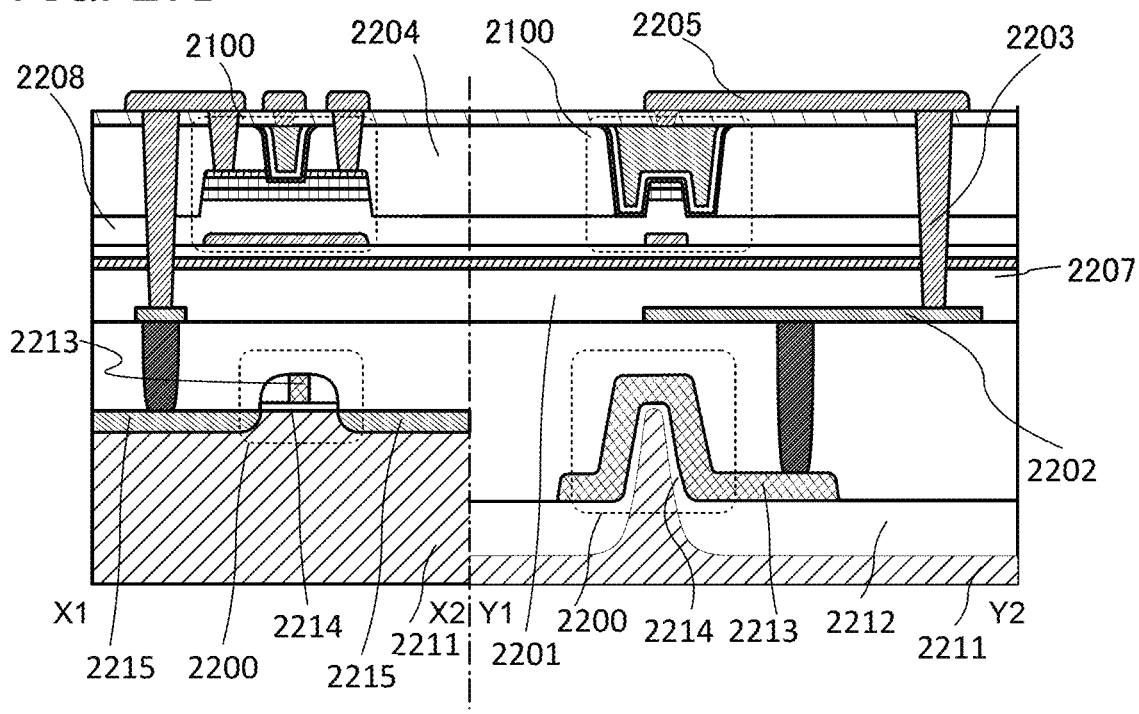

A circuit diagram in FIG. 27C shows a configuration in which sources of the transistors 2100 and 2200 are connected to each other and drains of the transistors 2100 and 2200 are connected to each other. With such a configuration, the transistors can function as a CMOS analog switch.

<Memory Device Example>

Figure 28A:
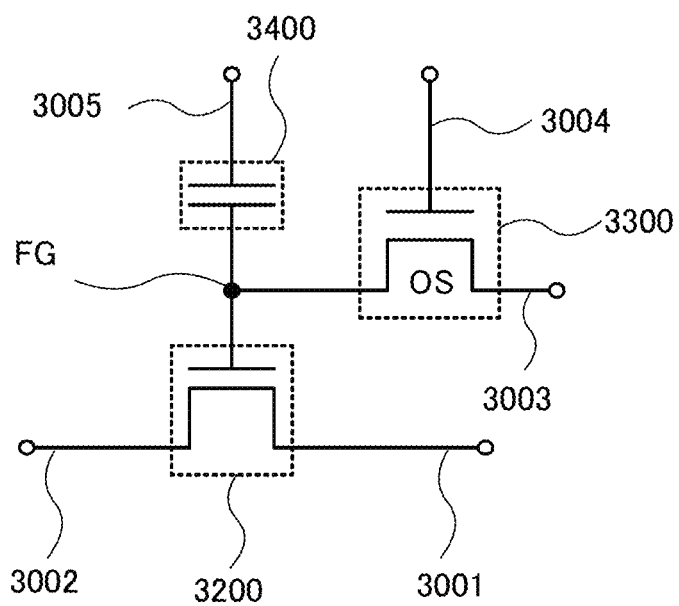
FIGS. 28A to 28C are a cross-sectional view and circuit diagrams of a semiconductor device.
Figure 28B:
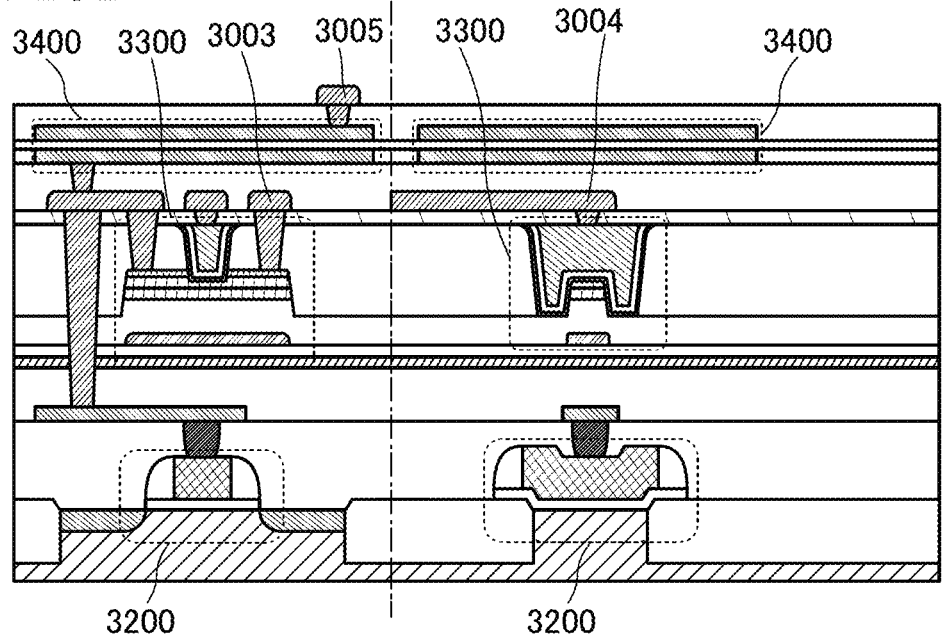
Figure 28C:
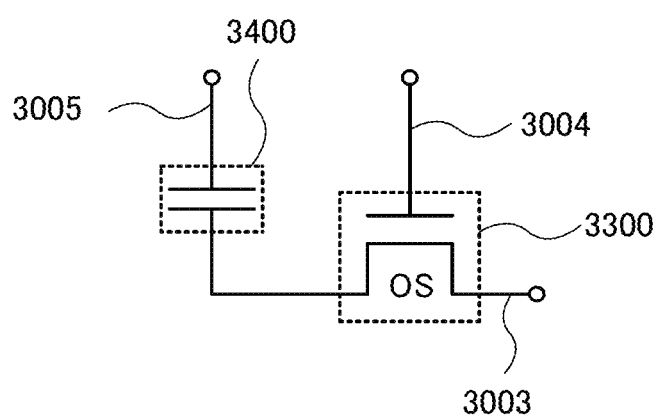

An example of a semiconductor device (memory device) which includes the transistor of one embodiment of the present invention, which can retain stored data even when not powered, and which has an unlimited number of write cycles is shown in FIGS. 28A to 28C.

The semiconductor device illustrated in FIG. 28A includes a transistor 3200 using a first semiconductor material, a transistor 3300 using a second semiconductor material, and a capacitor 3400. Note that any of the transistors in Embodiments 1 and 2 can be used as the transistor 3300.

FIG. 28B is a cross-sectional view of the semiconductor device illustrated in FIG. 28A. The semiconductor device in the cross-sectional view has a structure in which the transistor 3300 is provided with a back gate; however, a structure without a back gate may be employed.

The transistor 3300 is a transistor in which a channel is formed in a semiconductor layer including an oxide semiconductor. Since the off-state current of the transistor 3300 is low, stored data can be retained for a long period. In other words, power consumption can be sufficiently reduced because a semiconductor memory device in which refresh operation is unnecessary or the frequency of refresh operation is extremely low can be provided.

In FIG. 28A, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 is electrically connected to the other of the source electrode and the drain electrode of the transistor 3300 and a first terminal of the capacitor 3400. A fifth wiring 3005 is electrically connected to a second terminal of the capacitor 3400.

The semiconductor device in FIG. 28A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely low, the charge of the gate of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. In the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed to be used, it is necessary that only data of a desired memory cell be able to be read. For example, the fifth wiring 3005 of memory cells from which data is not read may be supplied with a potential at which the transistor 3200 is turned off regardless of the state of the gate electrode, that is, a potential lower than $V_{th\_H}$, whereby only data of a desired memory cell can be read. Alternatively, the fifth wiring 3005 of the memory cells from which data is not read may be supplied with a potential at which the transistor 3200 is turned on regardless of the state of the gate, that is, a potential higher than $V_{th\_L}$, whereby only data of a desired memory cell can be read.

The semiconductor device illustrated in FIG. 28C is different from the semiconductor device illustrated in FIG. 28A in that the transistor 3200 is not provided. Also in this case, writing and retaining operation of data can be performed in a manner similar to the semiconductor device illustrated in FIG. 28A.

Next, reading of data is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in the potential of the third wiring 3003 varies depending on the potential of a first terminal of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the first terminal of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the first terminal of the capacitor 3400 is $V_1$ and $V_0$ ($V_1 > V_0$), the potential of the third wiring 3003 in the case of retaining the potential $V_1$ ($= (C_B \times V_{B0} + C \times V_1)/(C_B + C)$) is higher than the potential of the third wiring 3003 in the case of retaining the potential $V_0$ ($=(C_B \times V_{B0}+C \times V_0)/(C_B+C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating layer is not caused. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the invention can be clear. Furthermore, it can be determined that one embodiment of the invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided.

<Imaging Device>

An imaging device of one embodiment of the present invention is described below.

Figure 29A:
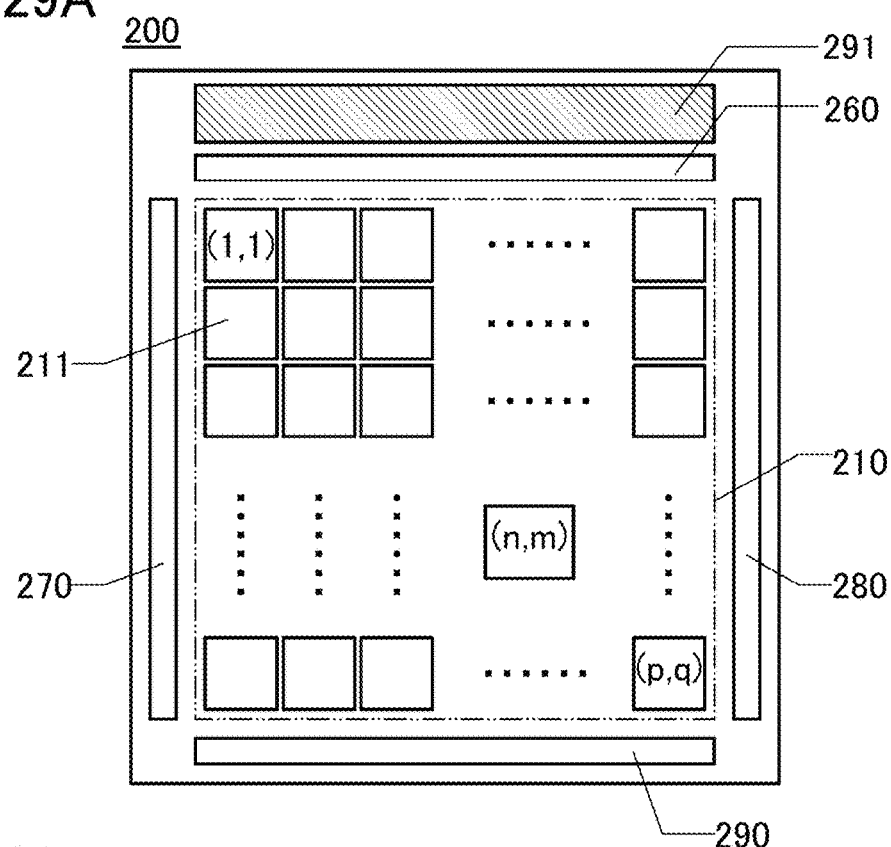
FIGS. 29A and 29B are plan views of an imaging device.

FIG. 29A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each a natural number greater than or equal to 2). The peripheral circuit 260, the peripheral circuit 270, the peripheral circuit 280, and the peripheral circuit 290 are each connected to a plurality of pixels 211, and a signal for driving the plurality of pixels 211 is supplied. In this specification and the like, in some cases, "a peripheral circuit" or "a driver circuit" indicates all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be provided over a substrate where the pixel portion 210 is formed. Part or the whole of the peripheral circuit may be mounted using a semiconductor device such as an IC. Note that as the peripheral circuit, one or more of the peripheral circuits 260, 270, 280, and 290 may be omitted.

Figure 29B:
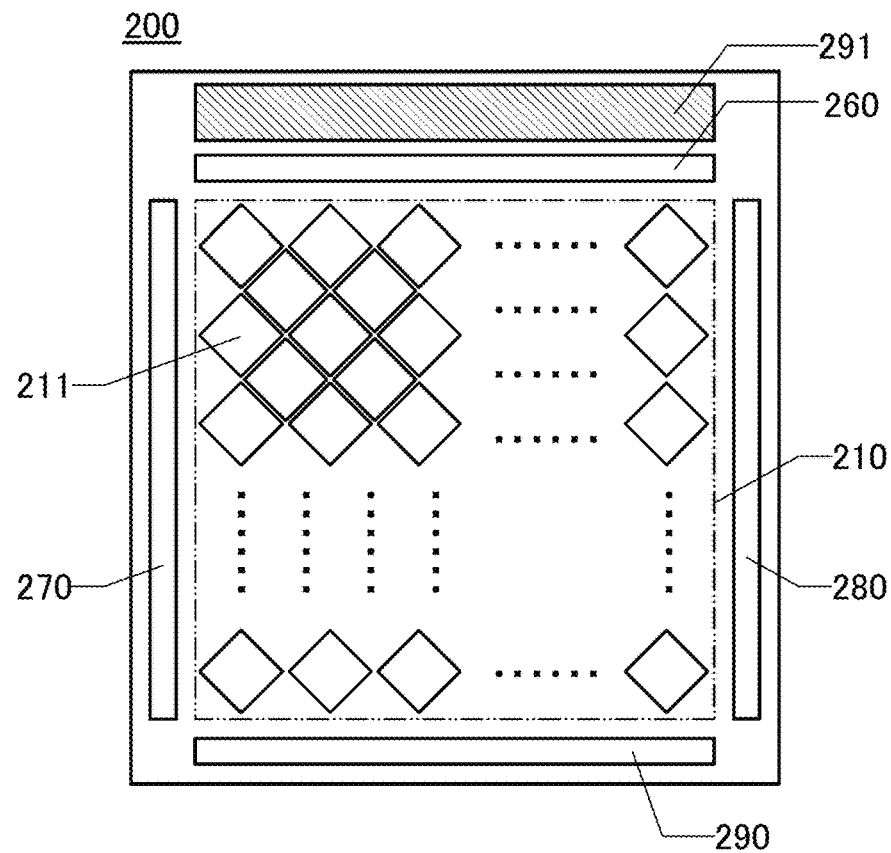

As illustrated in FIG. 29B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

<Configuration Example 1 of Pixel>

The pixel 211 included in the imaging device 200 is formed with a plurality of subpixels 212, and each subpixel 212 is combined with a filter which transmits light with a specific wavelength band (color filter), whereby data for achieving color image display can be obtained.

Figure 30A:
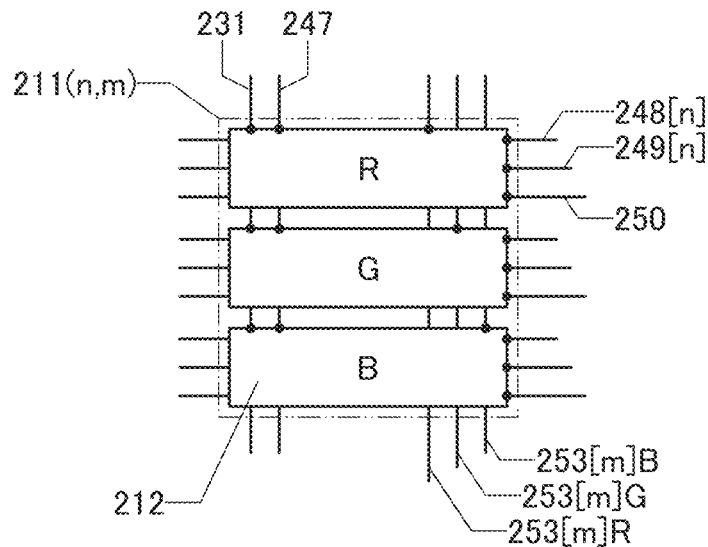
FIGS. 30A and 30B are plan views of pixels of an imaging device.

FIG. 30A is a plan view showing an example of the pixel 211 with which a color image is obtained. The pixel 211 illustrated in FIG. 30A includes a subpixel 212 provided with a color filter transmitting light with a red (R) wavelength band (also referred to as a subpixel 212R), a subpixel 212 provided with a color filter transmitting light with a green (G) wavelength band (also referred to as a subpixel 212G), and a subpixel 212 provided with a color filter transmitting light with a blue (B) wavelength band (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independent from one another. In this specification and the like, for example, the wiring 248 and the wiring 249 that are connected to the pixel 211 in the n-th row (n is an integer greater than or equal to 1 and less than or equal top) are referred to as a wiring 248[n] and a wiring 249[n]. For example, the wiring 253 connected to the pixel 211 in the m-th column (m is an integer greater than or equal to 1 and less than or equal to q) is referred to as a wiring 253[m]. Note that in FIG. 30A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B. The subpixels 212 are electrically connected to the peripheral circuit through the above wirings.

Figure 30B:
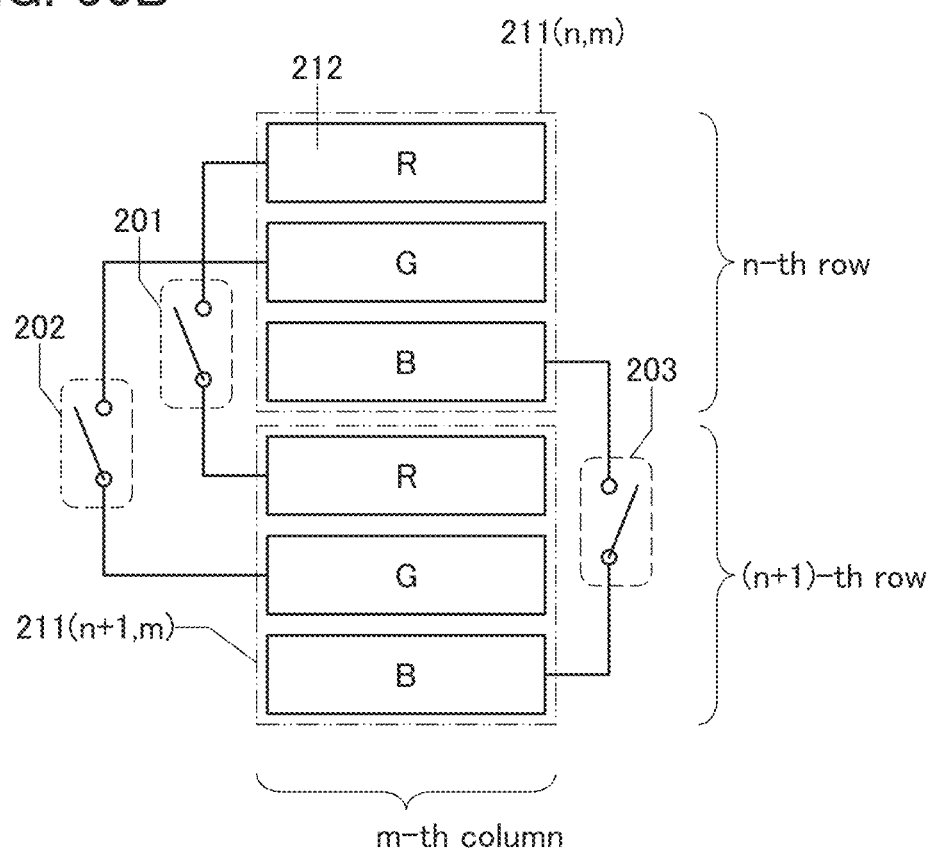

The imaging device 200 has a structure in which the subpixel 212 is electrically connected to the subpixel 212 in an adjacent pixel 211 which is provided with a color filter transmitting light with the same wavelength band as the subpixel 212, via a switch. FIG. 30B shows a connection example of the subpixels 212: the subpixel 212 in the pixel 211 arranged in an n-th row and an m-th column and the subpixel 212 in the adjacent pixel 211 arranged in an (n+1)-th row and the m-th column. In FIG. 30B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light with three different wavelength bands in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light with four different wavelength bands are provided in one pixel 211, the reproducibility of colors of an obtained image can be increased.

For example, in FIG. 30A, in regard to the subpixel 212 sensing a red wavelength band, the subpixel 212 sensing a green wavelength band, and the subpixel 212 sensing a blue wavelength band, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 sensing the same wavelength band are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 31A and 31B. With the lens 255, the photoelectric conversion element can receive incident light efficiently. Specifically, as illustrated in FIG. 31A, light 256 enters a photoelectric conversion element 220 through the lens 255, the filter 254 (a filter 254R, a filter 254G, and a filter 254B), a pixel circuit 230, and the like which are provided in the pixel 211.

However, as indicated by a region surrounded with dashed-dotted lines, part of the light 256 indicated by arrows might be blocked by some wirings 257. Thus, a preferable structure is that the lens 255 and the filter 254 are provided on the photoelectric conversion element 220 side, so that the photoelectric conversion element 220 can efficiently receive the light 256 as illustrated in FIG. 31B. When the light 256 enters the photoelectric conversion element 220 from the photoelectric conversion element 220 side, the imaging device 200 with high sensitivity can be provided.

Figure 31A:
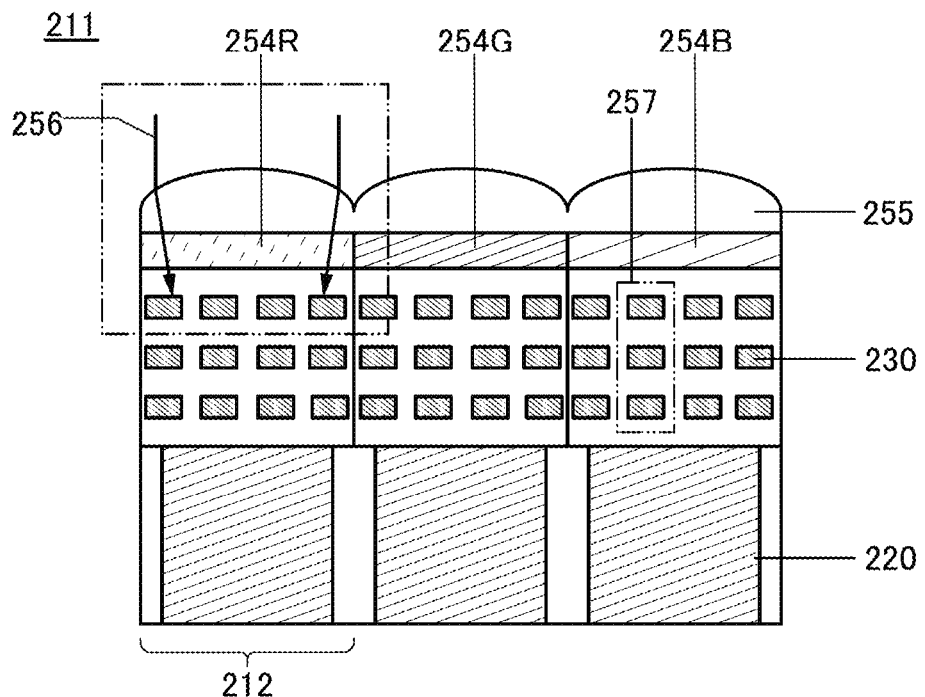
FIGS. 31A and 31B are cross-sectional views of an imaging device.
Figure 31B:
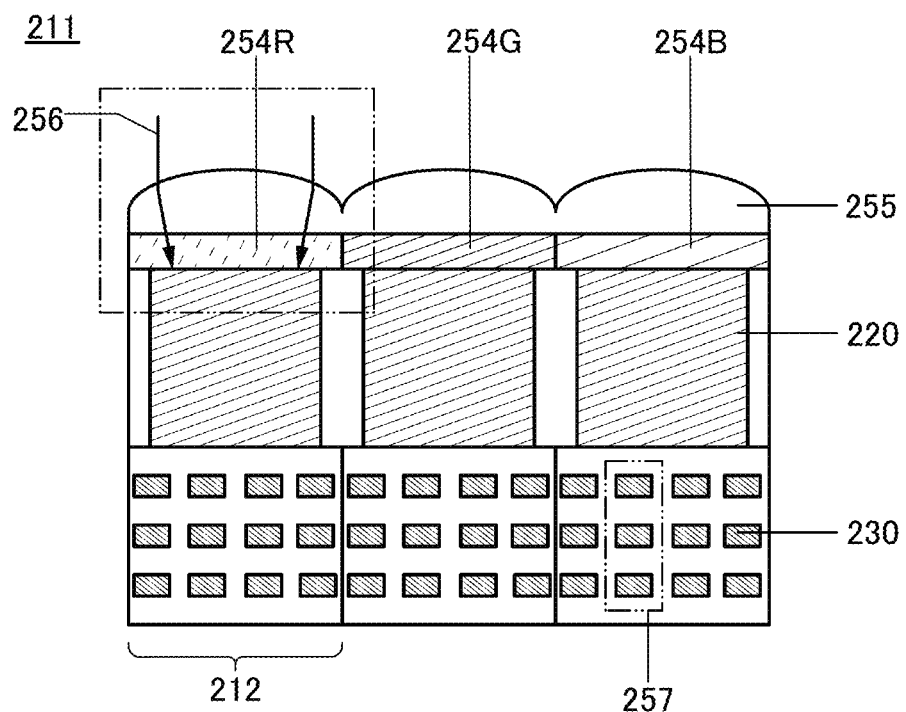

As the photoelectric conversion element 220 illustrated in FIGS. 31A and 31B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 220, the photoelectric conversion element 220 can have a light absorption coefficient in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 31A and 31B.

<Configuration Example 2 of Pixel>

An example of a pixel including a transistor using silicon and a transistor using an oxide semiconductor is described below.

Figure 32A:
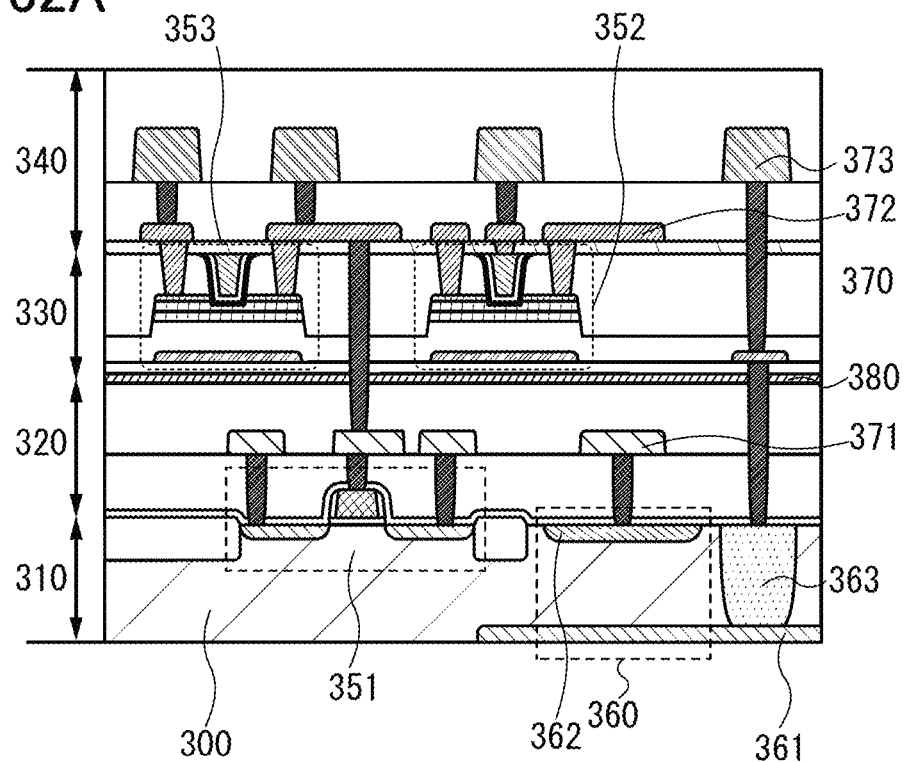
FIGS. 32A and 32B are cross-sectional views of an imaging device.
Figure 32B:
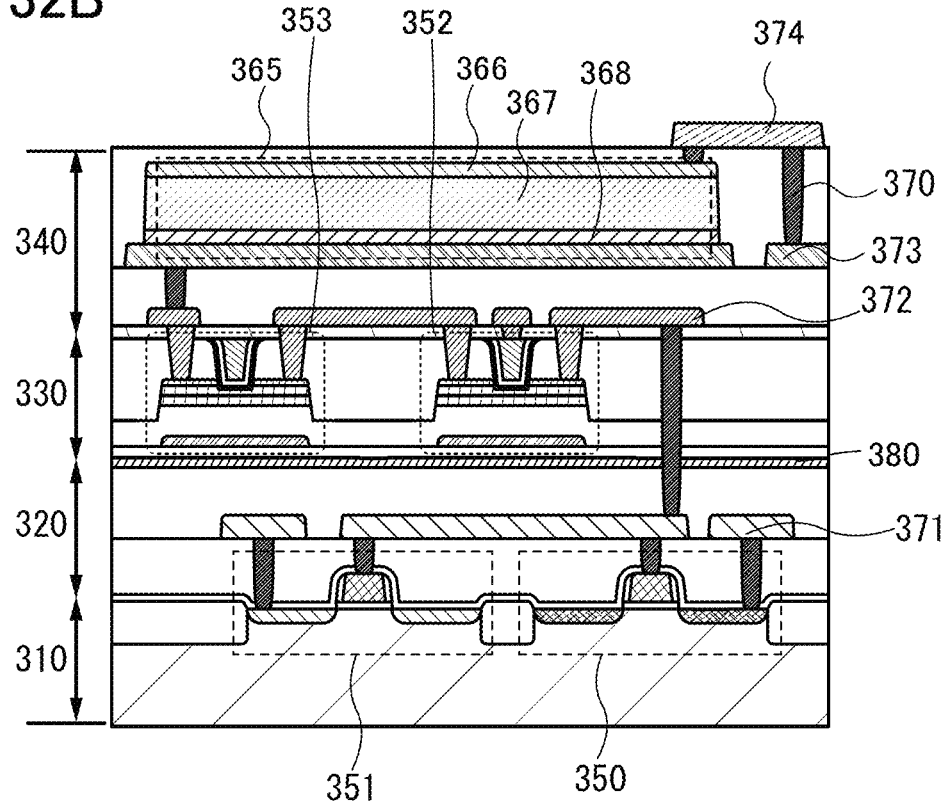

FIGS. 32A and 32B are each a cross-sectional view of an element included in an imaging device.

The imaging device illustrated in FIG. 32A includes a transistor 351 including silicon over a silicon substrate 300, transistors 352 and 353 which include an oxide semiconductor and are stacked over the transistor 351, and a photodiode 360 provided in a silicon substrate 300 and including an anode 361 and a cathode 362. The transistors and the photodiode 360 are electrically connected to various plugs 370 and wirings 371. In addition, an anode 361 of the photodiode 360 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

Note that in the example of cross-sectional view in FIG. 32A, a light-receiving surface of the photodiode 360 is provided on the side opposite to a surface of the silicon substrate 300 where the transistor 351 is formed. With the structure, an optical path can be obtained without the influence by the transistors or wirings, and therefore, a pixel with a high aperture ratio can be formed. Thus, a pixel with a high aperture ratio can be formed. Note that the light-receiving surface of the photodiode 360 can be the same as the surface where the transistor 351 is formed.

In the case where a pixel is formed with use of only transistors using an oxide semiconductor, the layer 310 may include the transistor using an oxide semiconductor. Alternatively, the layer 310 may be omitted, and the pixel may include only transistors using an oxide semiconductor.

In addition, in the cross-sectional view in FIG. 32A, the photodiode 360 in the layer 310 and the transistor in the layer 330 can be formed so as to overlap with each other. Thus, the degree of integration of pixels can be increased. In other words, the resolution of the imaging device can be increased.

An imaging device shown in FIG. 32B includes a photodiode 365 in the layer 340 and over the transistor. In FIG. 32B, the layer 310 includes a transistor 350 and the transistor 351 using silicon, the layer 320 includes the wiring 371, the layer 330 includes the transistor 352 and the transistor 353 using an oxide semiconductor layer, and the layer 340 includes the photodiode 365. The photodiode 365 includes a semiconductor layer 366, a semiconductor layer 367, and a semiconductor layer 368, and is electrically connected to the wiring 373 and a wiring 374 through the plug 370.

The element structure shown in FIG. 32B can increase the aperture ratio.

Alternatively, a PIN diode element formed using an amorphous silicon film, a microcrystalline silicon film, or the like may be used as the photodiode 365. In the photodiode 365, an n-type semiconductor layer 368, an i-type semiconductor layer 367, and a p-type semiconductor layer 366 are stacked in this order. The i-type semiconductor layer 367 is preferably formed using amorphous silicon. The p-type semiconductor layer 366 and the n-type semiconductor layer 368 can each be formed using amorphous silicon, microcrystalline silicon, or the like which includes a dopant imparting the corresponding conductivity type. A photodiode in which the photodiode 365 is formed using amorphous silicon has high sensitivity in a visible light wavelength region, and therefore can easily sense weak visible light.

This embodiment can be combined as appropriate with any of the other embodiments and examples in this specification.

Embodiment 5

<RF Tag>

In this embodiment, an RF tag that includes the transistor described in the above embodiments or the memory device described in the above embodiment is described with reference to FIG. 33.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have extremely high reliability in order to be used for this purpose.

A configuration of the RF tag will be described with reference to FIG. 33. FIG. 33 is a block diagram illustrating a configuration example of an RF tag.

Figure 33:
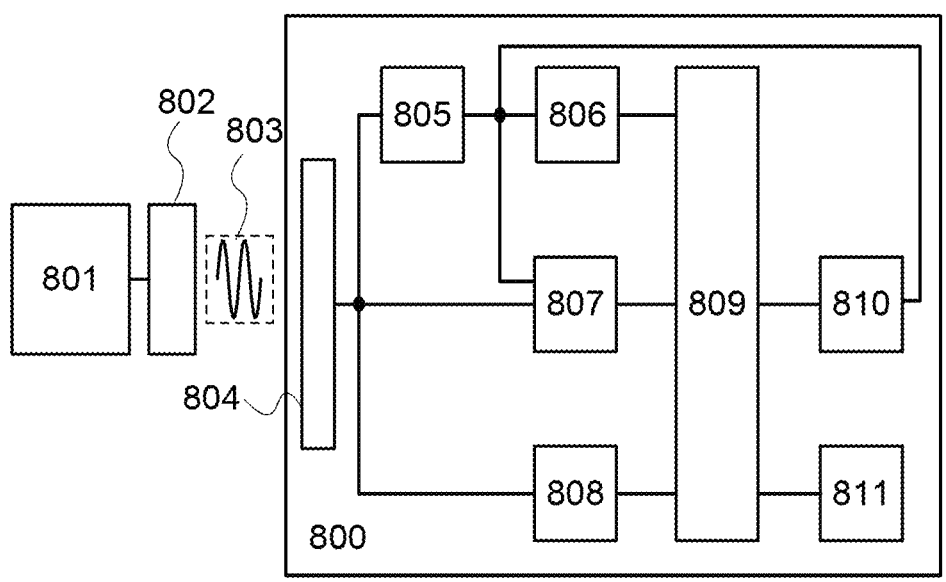
FIG. 33 illustrates a configuration example of an RF tag.

As shown in FIG. 33, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RF tag. Furthermore, the memory circuit of one embodiment of the present invention needs power (voltage) needed for data writing significantly lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

This embodiment can be combined as appropriate with any of the other embodiments and examples in this specification.

Embodiment 6

In this embodiment, a CPU that includes the memory device described in the above embodiment is described.

Figure 34:
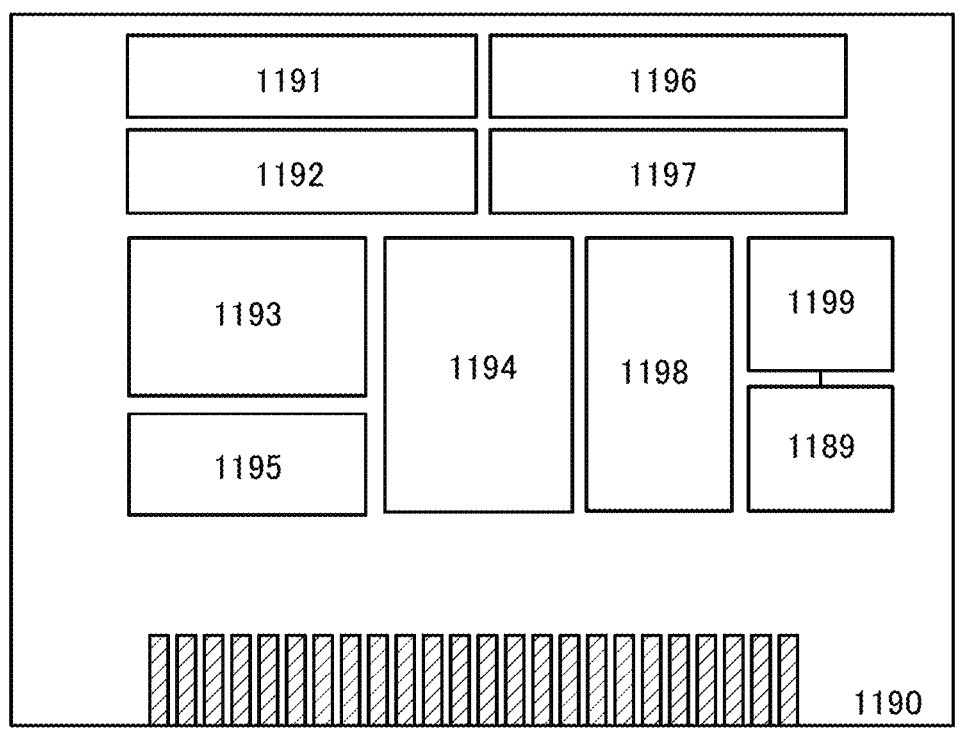
FIG. 34 illustrates a structure example of a CPU.

FIG. 34 is a block diagram illustrating a configuration example of a CPU at least partly including any of the transistors described in the above embodiments as a component.

<Circuit Diagram of CPU>

The CPU illustrated in FIG. 34 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The rewritable ROM 1199 and the ROM interface 1189 may be provided over a separate chip. Needless to say, the CPU in FIG. 34 is just an example in which the configuration is simplified, and an actual CPU may have a variety of configurations depending on the application. For example, the CPU may have the following configuration: a structure including the CPU illustrated in FIG. 34 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 34, a memory cell is provided in the register 1196. For the memory cell of the register 1196, any of the transistors described in Embodiments 1 and 2 can be used.

In the CPU illustrated in FIG. 34, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

<Memory Circuit>

Figure 35:
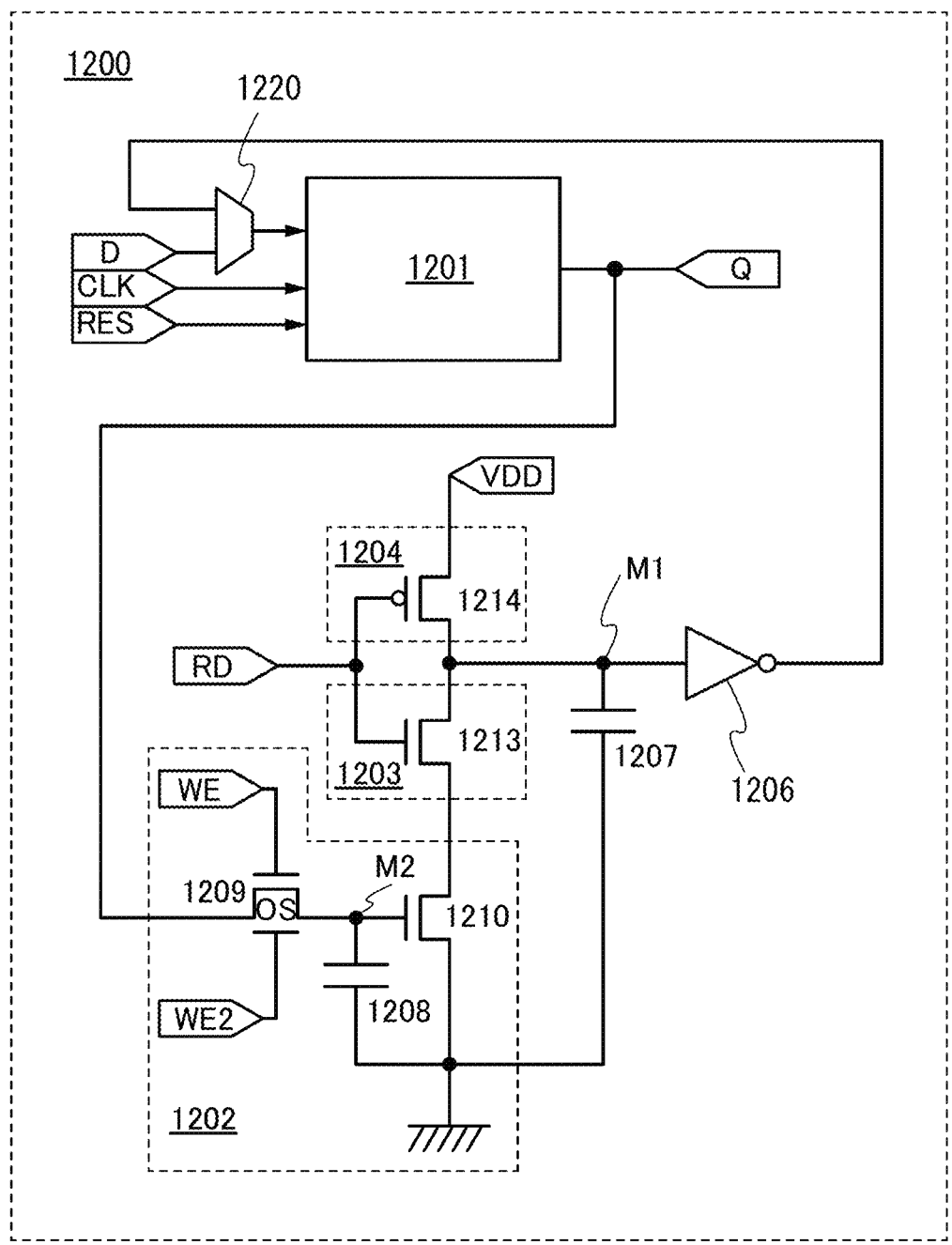
FIG. 35 is a circuit diagram of a memory element.

FIG. 35 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, a first gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

Note that the transistor 1209 in FIG. 35 has a structure with a second gate (second gate electrode: back gate). The control signal WE can be input to the first gate and the control signal WE2 can be input to the second gate. The control signal WE2 is a signal having a constant potential. As the constant potential, for example, a ground potential GND or a potential lower than a source potential of the transistor 1209 is selected. The control signal WE2 is a potential signal for controlling the threshold voltage of the transistor 1209, and a current when a gate voltage VG is 0 V can be further reduced. The control signal WE2 may be a signal having the same potential as that of the control signal WE. Note that as the transistor 1209, a transistor without a second gate may be used.

A signal corresponding to data retained in the circuit 1201 is input to the other of the source and the drain of the transistor 1209. FIG. 35 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 35, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 35, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor layer. Further alternatively, in the memory element 1200, a transistor in which a channel is formed in an oxide semiconductor layer can be included besides the transistor 1209, and a transistor in which a channel is formed in a layer including a semiconductor other than an oxide semiconductor or the substrate 1190 can be used for the rest of the transistors.

As the circuit 1201 in FIG. 35, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency (RF) tag.

This embodiment can be combined as appropriate with any of the other embodiments and examples in this specification.

Embodiment 7

In this embodiment, configuration examples of a display device using a transistor of one embodiment of the present invention are described.

<Circuit Configuration Example of Display Device>

Figure 36A:
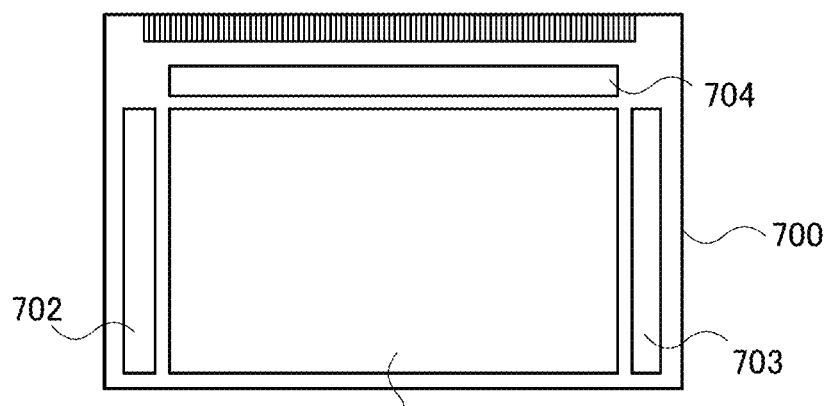
FIGS. 36A to 36C illustrate a configuration example of a display device and circuit diagrams of pixels.
Figure 36B:
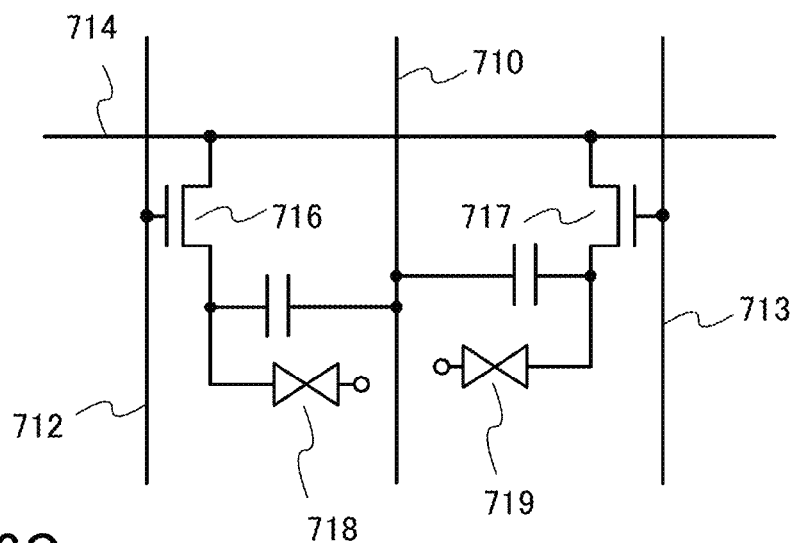
Figure 36C:
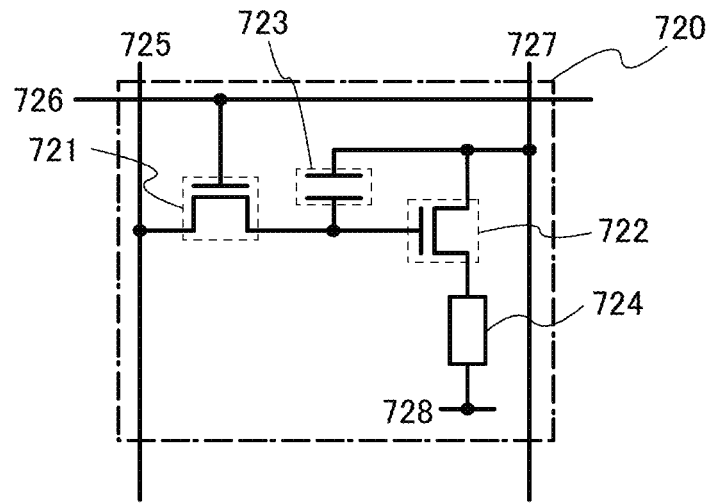

FIG. 36A is a top view of the display device of one embodiment of the present invention. FIG. 36B is a circuit diagram illustrating a pixel circuit that can be used in the case where a liquid crystal element is used in a pixel in the display device of one embodiment of the present invention. FIG. 36C is a circuit diagram illustrating a pixel circuit that can be used in the case where an organic EL element is used in a pixel in the display device of one embodiment of the present invention.

The transistor in the pixel portion can be formed in accordance with Embodiments 1 to 3. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 36A illustrates an example of a top view of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 36A, the first scan line driver circuit 702, the second scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved. One or more of the first scan line driver circuit 702, the second scan line driver circuit 703, and the signal line driver circuit 704 may be mounted on the substrate 700 or provided outside the substrate 700.

<Liquid Crystal Display Device>

FIG. 36B illustrates an example of a circuit configuration of the pixel. Here, a pixel circuit which is applicable to a pixel of a VA liquid crystal display device is illustrated as an example.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A scan line 712 of a transistor 716 and a scan line 713 of a transistor 717 are separated so that different gate signals can be supplied thereto. In contrast, a data line 714 is shared by the transistors 716 and 717. The transistor described in any of Embodiments 1 to 3 can be used as appropriate as each of the transistors 716 and 717. Thus, a highly reliable liquid crystal display device can be provided.

A first pixel electrode layer is electrically connected to the transistor 716 and a second pixel electrode is electrically connected to the transistor 717. The first pixel electrode and the second pixel electrode are separated. There is no particular limitation on the shapes of the first pixel electrode and the second pixel electrode. For example, the first pixel electrode may have a V-like shape.

A gate electrode of the transistor 716 is connected to the scan line 712, and a gate electrode of the transistor 717 is connected to the scan line 713. When different gate signals are supplied to the scan line 712 and the scan line 713, operation timings of the transistor 716 and the transistor 717 can be varied. As a result, alignment of liquid crystals can be controlled.

Further, a storage capacitor may be formed using a capacitor wiring 710, a gate insulating layer functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 36B. For example, a switch, a resistor, a capacitor, a transistor, a sensor, a logic circuit, or the like may be added to the pixel circuit illustrated in FIG. 36B.

<Organic EL Display Device>

FIG. 36C illustrates another example of a circuit configuration of the pixel. Here, a pixel structure of a display device using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 36C illustrates an applicable example of a pixel circuit. Here, one pixel includes two n-channel transistors. Furthermore, digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, the transistor described in any of Embodiments 1 to 3 can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage $V_{th}$ of the driver transistor 722 is applied to the signal line 725.

In the case of performing analog grayscale driving, a voltage greater than or equal to a voltage which is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 36C. For example, a switch, a resistor, a capacitor, a sensor, a transistor, a logic circuit, or the like may be added to the pixel circuit illustrated in FIG. 36C.

In the case where the transistor shown in any of the above embodiments is used for the circuit shown in FIGS. 36A to 36C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

For example, in this specification and the like, a display element, a display device which is a device including a display element, a light-emitting element, and a light-emitting device which is a device including a light-emitting element can employ a variety of modes or can include a variety of elements. A display element, a display device, a light-emitting element, or a light-emitting device include at least one of the following, for example: an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), micro electro mechanical systems (MEMS), a digital micromirror device (DMD), a digital micro shutter (DMS), MIRASOL (registered trademark), an interferometric modulator display (IMOD) element, an electrowetting element, a piezoelectric ceramic display, and a display element using a carbon nanotube. Other than the above, display media whose contrast, luminance, reflectivity, transmittance, or the like is changed by electric or electromagnetic action may be included. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices including electronic ink or electrophoretic elements include electronic paper.

This embodiment can be combined as appropriate with any of the other embodiments and examples in this specification.

Embodiment 8

In this embodiment, a display module using a semiconductor device of one embodiment of the present invention is described with reference to FIG. 37.

<Display Module>

Figure 37:
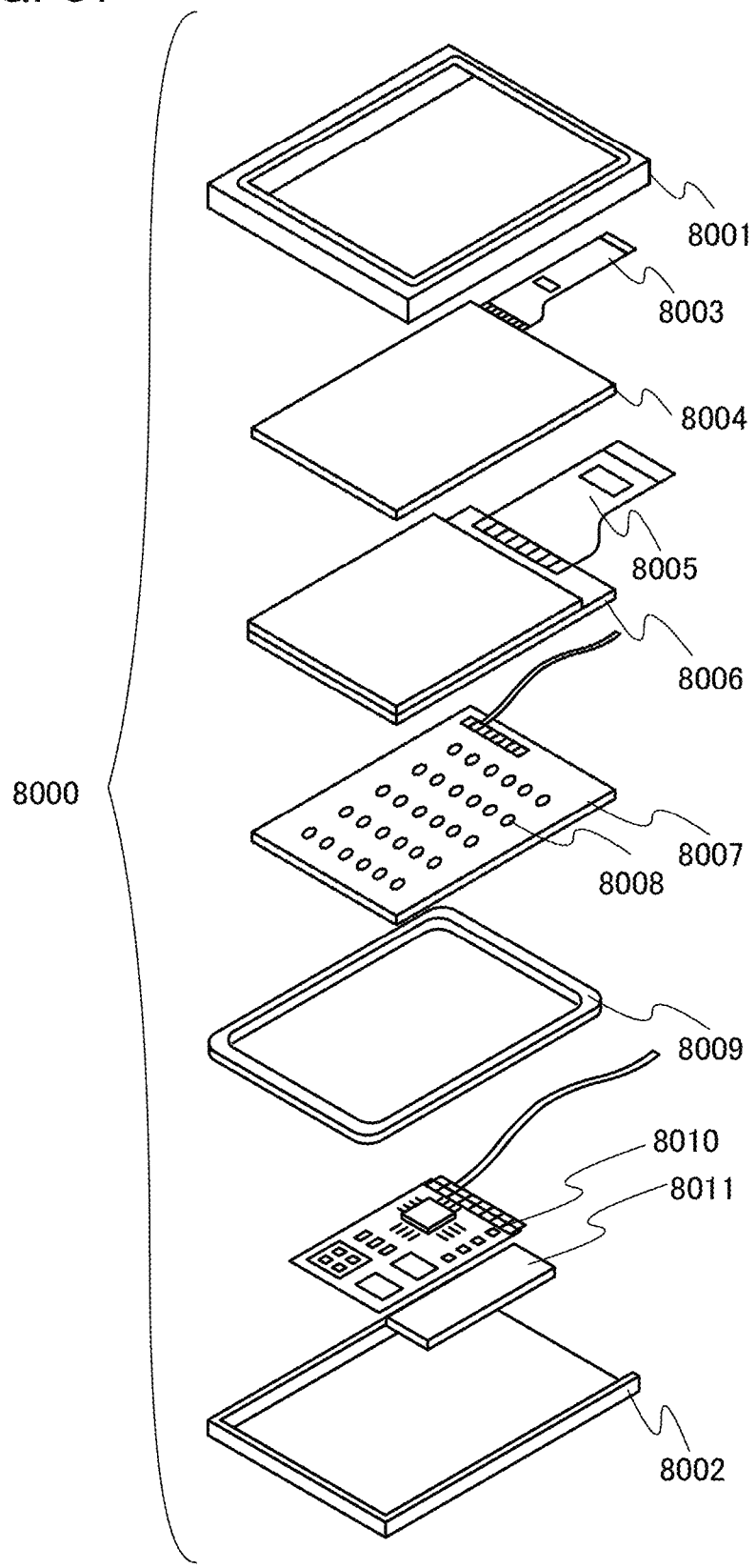
FIG. 37 illustrates a display module.

In a display module 6000 in FIG. 37, a touch panel 6004 connected to an FPC 6003, a display panel 6006 connected to an FPC 6005, a backlight unit 6007, a frame 6009, a printed board 6010, and a battery 6011 are provided between an upper cover 6001 and a lower cover 6002. Note that the backlight unit 6007, the battery 6011, the touch panel 6004, and the like are not provided in some cases.

The semiconductor device of one embodiment of the present invention can be used for, for example, the display panel 6006 and an integrated circuit mounted on a printed circuit board.

The shapes and sizes of the upper cover 6001 and the lower cover 6002 can be changed as appropriate in accordance with the sizes of the touch panel 6004 and the display panel 6006.

The touch panel 6004 can be a resistive touch panel or a capacitive touch panel and may be formed to overlap with the display panel 6006. A counter substrate (sealing substrate) of the display panel 6006 can have a touch panel function. A photosensor may be provided in each pixel of the display panel 6006 so that an optical touch panel function is added. An electrode for a touch sensor may be provided in each pixel of the display panel 6006 so that a capacitive touch panel function is added.

The backlight unit 6007 includes a light source 6008. The light source 6008 may be provided at an end portion of the backlight unit 6007 and a light diffusing plate may be used.

The frame 6009 protects the display panel 6006 and also functions as an electromagnetic shield for blocking electromagnetic waves generated from the printed board 6010. The frame 6009 may function as a radiator plate.

The printed board 6010 has a power supply circuit and a signal processing circuit for outputting a video signal and a clock signal. As a power source for supplying power to the power supply circuit, an external commercial power source or the battery 6011 provided separately may be used. Note that the battery 6011 is not necessary in the case where a commercial power source is used.

The display module 6000 can be additionally provided with a member such as a polarizing plate, a retardation plate, or a prism sheet.

This embodiment can be combined as appropriate with any of the other embodiments and examples in this specification.

Embodiment 9

In this embodiment, application examples of the semiconductor device in one embodiment of the present invention will be described.

<Package Using a Lead Frame Interposer>

Figure 38A:
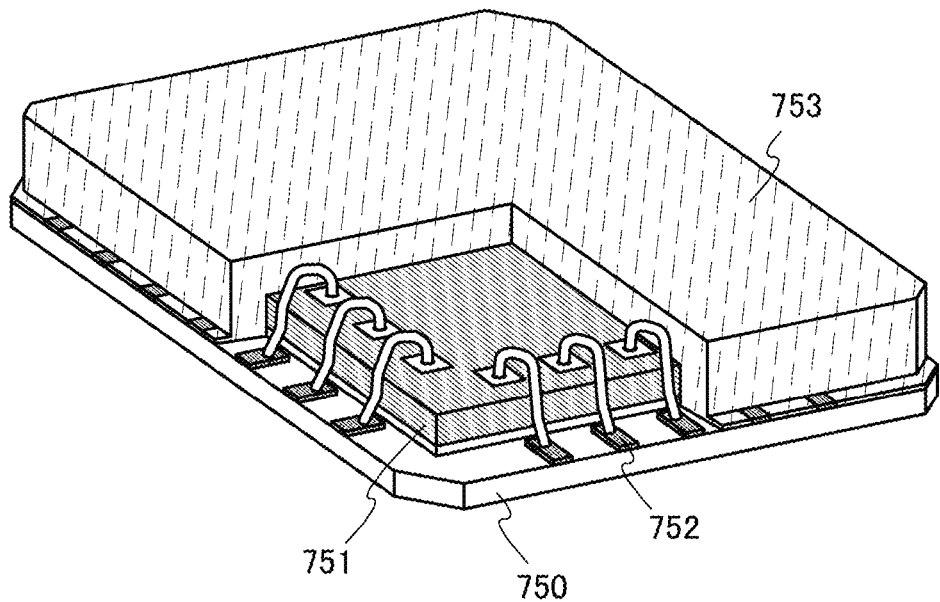
FIGS. 38A and 38B are perspective views illustrating a cross-sectional structure of a package using a lead frame interposer.

FIG. 38A is a perspective view illustrating a cross-sectional structure of a package using a lead frame interposer. In the package illustrated in FIG. 38A, a chip 751 corresponding to the semiconductor device of one embodiment of the present invention is connected to a terminal 752 over an interposer 750 by wire bonding. The terminal 752 is placed on a surface of the interposer 750 on which the chip 751 is mounted. The chip 751 may be sealed by a mold resin 753, in which case the chip 751 is sealed such that part of each of the terminals 752 is exposed.

Figure 38B:
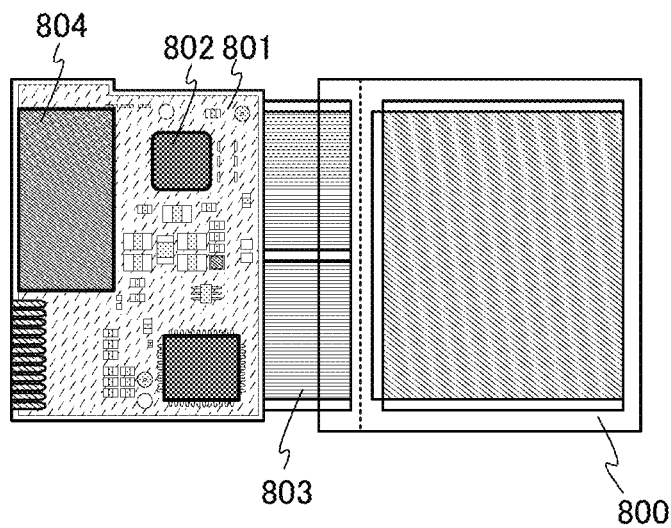

FIG. 38B illustrates the structure of a module of an electronic device (mobile phone) in which a package is mounted on a circuit board. In the module of the mobile phone in FIG. 38B, a package 1802 and a battery 1804 are mounted on a printed wiring board 1801. The printed wiring board 1801 is mounted on a panel 1800 including a display element by an FPC 1803.

This embodiment can be combined as appropriate with any of the other embodiments and examples in this specification.

Embodiment 10

In this embodiment, electronic devices and lighting devices of one embodiment of the present invention will be described with reference to drawings.

<Electronic Device>

Electronic devices and lighting devices can be fabricated using the semiconductor device of one embodiment of the present invention. In addition, highly reliable electronic devices and lighting devices can be fabricated using the semiconductor device of one embodiment of the present invention. Furthermore, electronic devices and lighting devices including touch sensors with improved detection sensitivity can be fabricated using the semiconductor device of one embodiment of the present invention.

Examples of electronic devices are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like.

In the case of having flexibility, the light-emitting device or lighting device of one embodiment of the present invention can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a lithium-ion battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for non-contact power transmission.

Figure 39A:
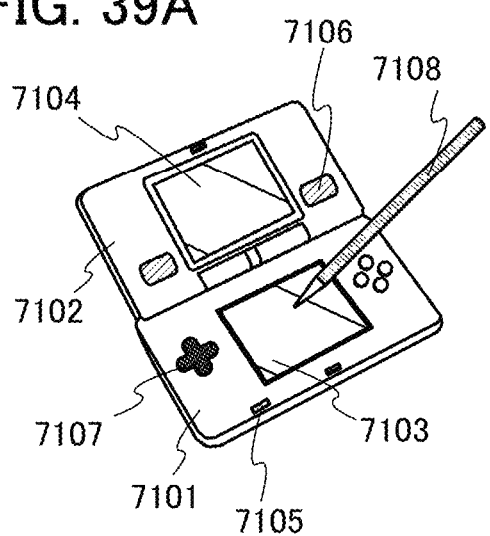
FIGS. 39A to 39E are diagrams illustrating electronic devices.

FIG. 39A illustrates a portable game machine including a housing 7101, a housing 7102, a display portion 7103, a display portion 7104, a microphone 7105, speakers 7106, an operation key 7107, a stylus 7108, and the like. The semiconductor device of one embodiment of the present invention can be used for an integrated circuit, a CPU, or the like incorporated in the housing 7101. When the light-emitting device of one embodiment of the present invention is used as the display portion 7103 or 7104, it is possible to provide a user-friendly portable game machine with quality that hardly deteriorates. Although the portable game machine illustrated in FIG. 39A includes two display portions, the display portion 7103 and the display portion 7104, the number of display portions included in the portable game machine is not limited to two.

Figure 39B:
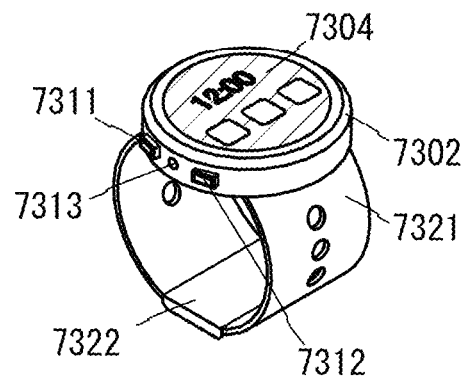

FIG. 39B illustrates a smart watch, which includes a housing 7302, a display portion 7304, operation buttons 7311 and 7312, a connection terminal 7313, a band 7321, a clasp 7322, and the like. The semiconductor device of one embodiment of the present invention can be used for a memory, a CPU, or the like incorporated in the housing 7302.

Figure 39C:
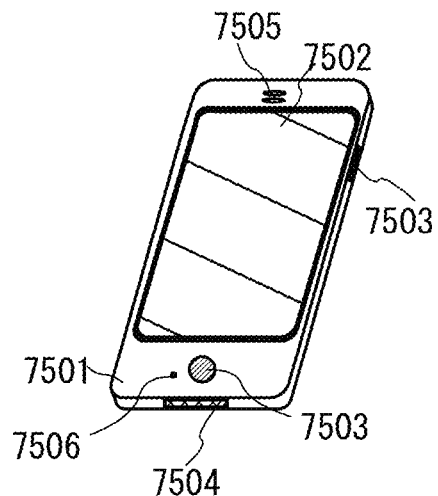

FIG. 39C illustrates a portable information terminal, which includes a display portion 7502 incorporated in a housing 7501, operation buttons 7503, an external connection port 7504, a speaker 7505, a microphone 7506, and the like. The semiconductor device of one embodiment of the present invention can be used for a mobile memory, a CPU, or the like incorporated in the housing 7501. Note that the display portion 7502 is small- or medium-sized but can perform full high vision, 4 k, or 8 k display because it has greatly high definition; therefore, a significantly clear image can be obtained.

Figure 39D:
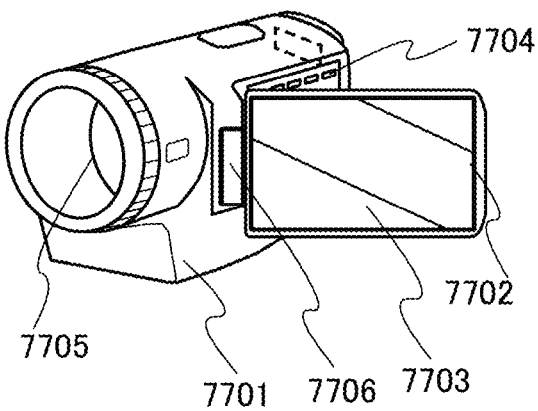

FIG. 39D illustrates a video camera including a first housing 7701, a second housing 7702, a display portion 7703, operation keys 7704, a lens 7705, a joint 7706, and the like. The operation keys 7704 and the lens 7705 are provided for the first housing 7701, and the display portion 7703 is provided for the second housing 7702. The first housing 7701 and the second housing 7702 are connected to each other with the joint 7706, and the angle between the first housing 7701 and the second housing 7702 can be changed with the joint 7706. Images displayed on the display portion 7703 may be switched in accordance with the angle at the joint 7706 between the first housing 7701 and the second housing 7702. The imaging device of one embodiment of the present invention can be used in a portion corresponding to a focus of the lens 7705. The semiconductor device of one embodiment of the present invention can be used for an integrated circuit, a CPU, or the like incorporated in the first housing 7701.

Figure 39E:
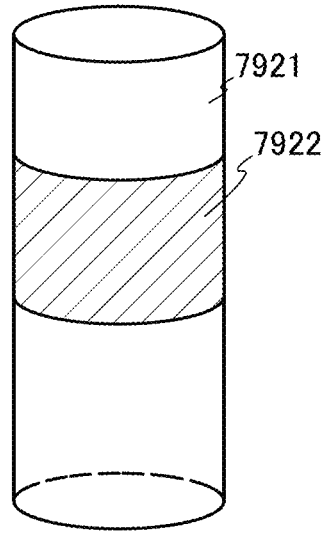

FIG. 39E illustrates a digital signage including a display portion 7902 provided on a utility pole 7901. The semiconductor device of one embodiment of the present invention can be used for a control circuit of the display portion 7902.

Figure 40A:
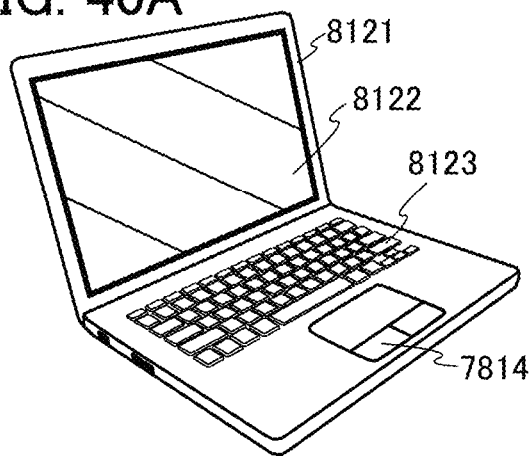
FIGS. 40A to 40D are diagrams illustrating electronic devices.

FIG. 40A illustrates a notebook personal computer, which includes a housing 8121, a display portion 8122, a keyboard 8123, a pointing device 8124, and the like. The semiconductor device of one embodiment of the present invention can be used for a CPU, a memory, or the like incorporated in the housing 8121. Note that the display portion 8122 is small- or medium-sized but can perform 8 k display because it has greatly high definition; therefore, a significantly clear image can be obtained.

Figure 40B:
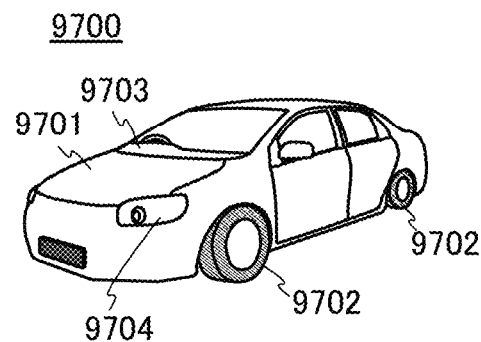
Figure 40C:
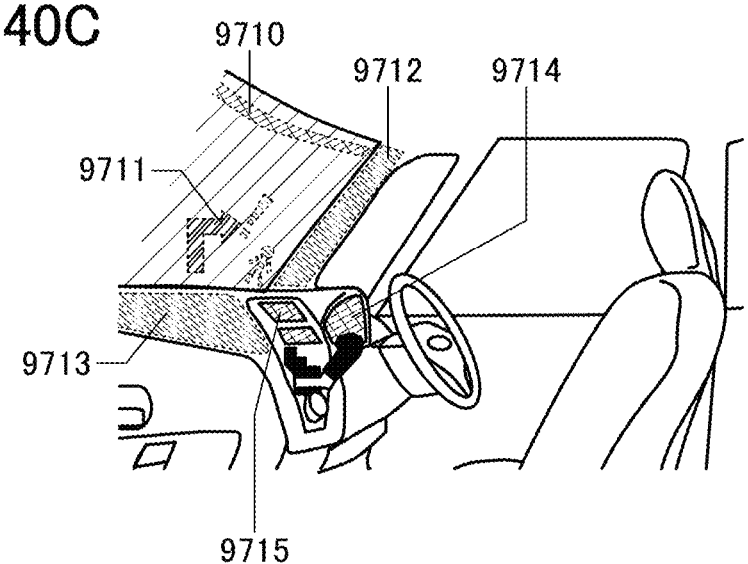

FIG. 40B is an external view of an automobile 9700. FIG. 40C illustrates a driver's seat of the automobile 9700. The automobile 9700 includes a car body 9701, wheels 9702, a dashboard 9703, lights 9704, and the like. The semiconductor device of one embodiment of the present invention can be used in a display portion and a control integrated circuit of the automobile 9700. For example, the display device or input/output device of one embodiment of the present invention can be used in display portions 9710 to 9715 illustrated in FIG. 40C.

The display portion 9710 and the display portion 9711 are display devices or input/output devices provided in an automobile windshield. The display device or input/output device of one embodiment of the present invention can be a see-through display device or input/output device, through which the opposite side can be seen, by using a light-transmitting conductive material for its electrodes. Such a see-through display device or input/output device does not hinder driver's vision during the driving of the automobile 9700. Therefore, the display device or input/output device of one embodiment of the present invention can be provided in the windshield of the automobile 9700. Note that in the case where a transistor or the like for driving the display device or input/output device is provided in the display device or input/output device, a transistor having light-transmitting properties, such as an organic transistor using an organic semiconductor material or a transistor using an oxide semiconductor, is preferably used.

The display portion 9712 is a display device provided on a pillar portion. For example, the display portion 9712 can compensate for the view hindered by the pillar portion by showing an image taken by an imaging unit provided on the car body. The display portion 9713 is a display device provided on a dashboard portion. For example, the display portion 9713 can compensate for the view hindered by the dashboard portion by showing an image taken by an imaging unit provided on the car body. That is, showing an image taken by an imaging unit provided on the outside of the car body leads to elimination of blind areas and enhancement of safety. In addition, showing an image so as to compensate for the area which a driver cannot see makes it possible for the driver to confirm safety easily and comfortably.

Figure 40D:
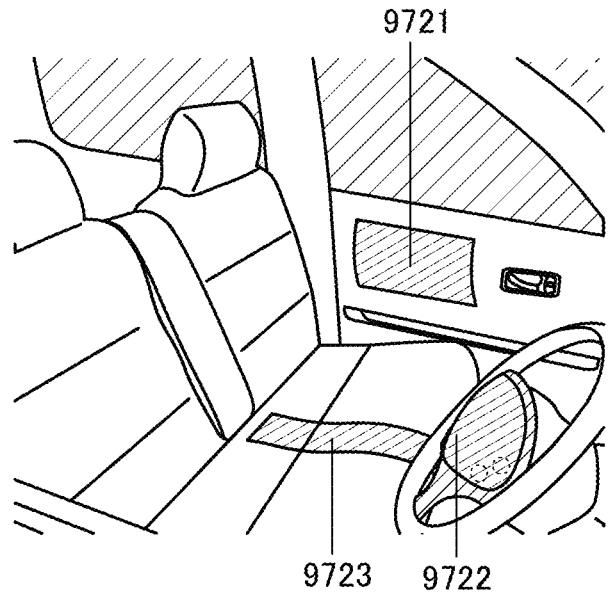

FIG. 40D illustrates the inside of a car in which a bench seat is used as a driver seat and a front passenger seat. A display portion 9721 is a display device or an input/output device provided in a door portion. For example, the display portion 9721 can compensate for the view hindered by the door portion by showing an image taken by an imaging unit provided on the car body. A display portion 9722 is a display device provided in a steering wheel. A display portion 9723 is a display device provided in the middle of a seating face of the bench seat. Note that the display device can be used as a seat heater by providing the display device on the seating face or backrest and by using heat generated by the display device as a heat source.

The display portion 9714, the display portion 9715, and the display portion 9722 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

Figure 41A:
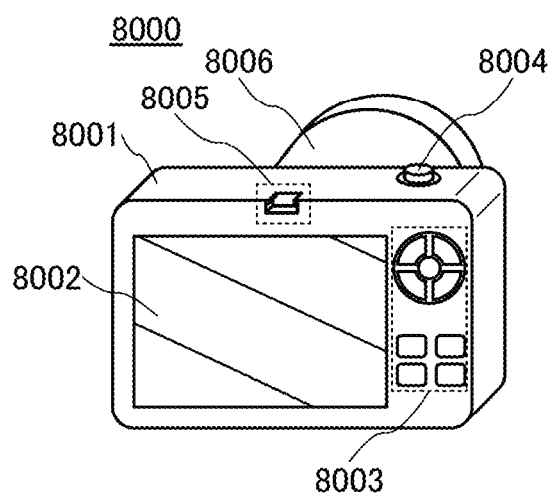
FIGS. 41A to 41C are diagrams illustrating electronic devices.

FIG. 41A illustrates an external view of a camera 8000. The camera 8000 includes a housing 8001, a display portion 8002, an operation button 8003, a shutter button 8004, a connection portion 8005, and the like. A lens 8006 can be put on the camera 8000.

The connection portion 8005 includes an electrode to connect a finder 8100, which is described below, a stroboscope, or the like.

Although the lens 8006 of the camera 8000 here is detachable from the housing 8001 for replacement, the lens 8006 may be included in the housing 8001.

Images can be taken at the press of the shutter button 8004. In addition, images can be taken at the touch of the display portion 8002 which serves as a touch panel.

The display device or input/output device of one embodiment of the present invention can be used in the display portion 8002.

Figure 41B:
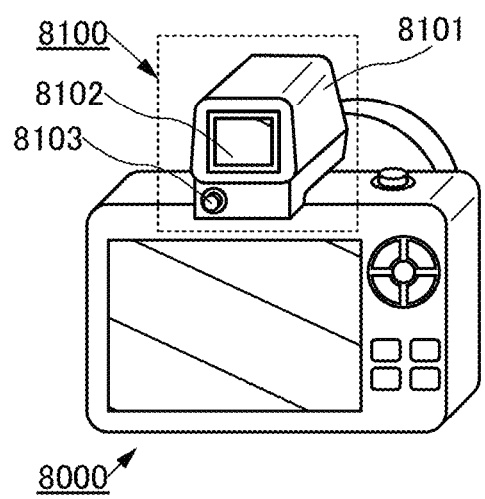

FIG. 41B shows the camera 8000 with the finder 8100 connected.

The finder 8100 includes a housing 8101, a display portion 8102, a button 8103, and the like.

The housing 8101 includes a connection portion for engagement with the connection portion 8005 of the camera 8000 so that the finder 8100 can be connected to the camera 8000. The connection portion includes an electrode, and an image or the like received from the camera 8000 through the electrode can be displayed on the display portion 8102.

The button 8103 has a function of a power button, and the display portion 8102 can be turned on and off with the button 8103.

The semiconductor device of one embodiment of the present invention can be used for an integrated circuit and an image sensor included in the housing 8101.

Although the camera 8000 and the finder 8100 are separate and detachable electronic devices in FIGS. 41A and 41B, the housing 8001 of the camera 8000 may include a finder having the display device or input/output device of one embodiment of the present invention.

Figure 41C:
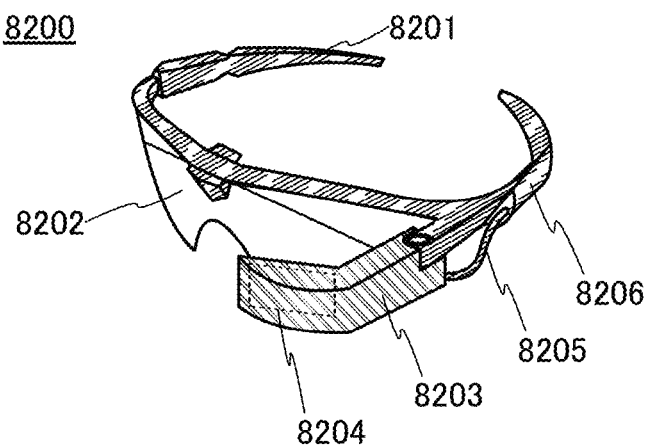

FIG. 41C illustrates an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The semiconductor device of one embodiment of the present invention can be used for an integrated circuit included in the main body 8203.

At least part of this embodiment can be implemented in combination with any of the embodiments described in this specification as appropriate.

Embodiment 11

In this embodiment, application examples of an RF tag using the semiconductor device of one embodiment of the present invention will be described with reference to FIGS. 42A to 42F.

<Application Examples of RF Tag>

Figure 42A:
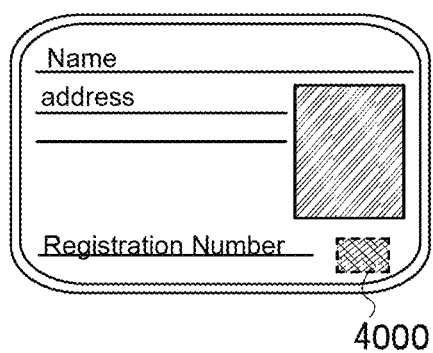
FIGS. 42A to 42F are diagrams illustrating electronic devices.
Figure 42B:
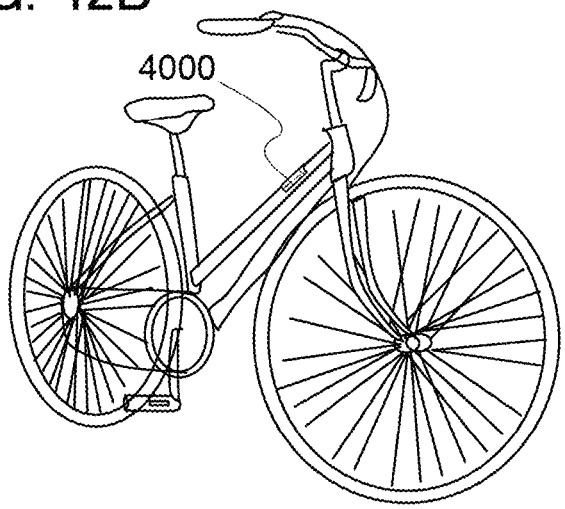
Figure 42C:
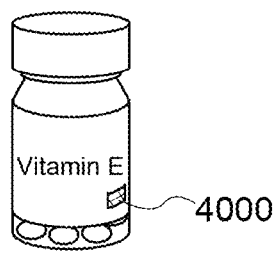
Figure 42D:
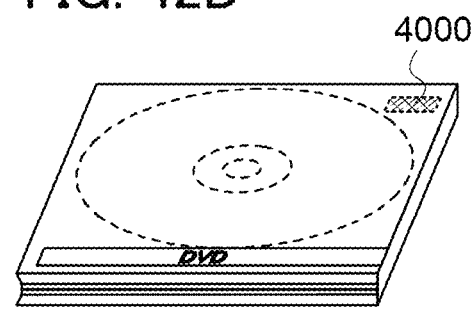
Figure 42E:
Figure 42F:
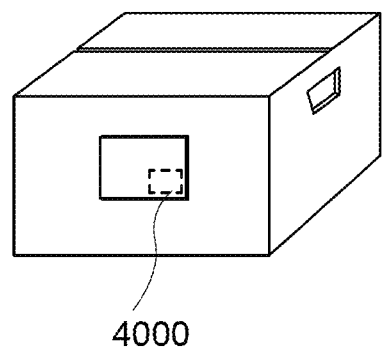

The RF tag is widely used and can be provided for, for example, products such as bills, coins, securities, bearer bonds, documents (e.g., driver's licenses or resident's cards, see FIG. 42A), vehicles (e.g., bicycles, see FIG. 42B), packaging containers (e.g., wrapping paper or bottles, see FIG. 42C), recording media (e.g., DVD or video tapes, see FIG. 42D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 42E and 42F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag including the semiconductor device of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

This embodiment can be combined as appropriate with any of the other embodiments and examples in this specification.

Example 1

The transistor described in Embodiment 1 was fabricated and described here are observations of a cross section of the transistor.

Samples were fabricated by the method described in Embodiment 1.

As the insulating layer 110, a 100-nm-thick silicon oxynitride film was formed by a plasma CVD method. The silicon oxynitride film was formed under the following conditions: the deposition gas flow rates of silane and dinitrogen monoxide were 5 sccm and 1000 sccm, respectively; the pressure in a chamber was controlled to be 133.30 Pa using a diaphragm-type baratron sensor and an APC valve; the RF power frequency was 13.56 MHz; the power was 35 W; the distance between electrodes was 20 mm; and the substrate heating temperature was 325° C.

The oxide insulating layer 121 was formed to a thickness of 20 nm by a sputtering method using a target of In:Ga:Zn=1:3:4 (atomic ratio). The oxide insulating layer 121 was formed under the following conditions: the pressure in a chamber was 0.7 Pa; a DC power source was used and the power was 0.5 kW; the sputtering gas flow rates of an Ar gas and an oxygen gas were 40 sccm and 5 sccm, respectively; the distance between the sample and the target was 60 mm; and the substrate heating temperature was 200° C.

The oxide semiconductor layer 122 was formed to a thickness of 15 nm by a sputtering method using a target of In:Ga:Zn=1:1:1. The oxide semiconductor layer 122 was formed under the following conditions: the pressure in a chamber was 0.7 Pa; a DC power source was used and the power was 0.5 kW; the sputtering gas flow rates of an Ar gas and an oxygen gas were 30 sccm and 15 sccm, respectively; the distance between the sample and the target was 60 mm; and the substrate heating temperature was 300° C.

As the source electrode layer 130 and the drain electrode layer 140, a 20-nm-thick tungsten film was formed by a sputtering method. The tungsten film was formed under the following conditions: the pressure in a chamber was 0.8 Pa; a DC power source was used and the power was 1 kW; the sputtering gas flow rates of an Ar gas and a heated Ar gas were 80 sccm and 10 sccm, respectively; the distance between the substrate and the target was 60 mm; and the substrate heating temperature was 130° C.

An organic resin and a resist were applied onto the tungsten film, and a resist mask was formed by patterning using an electron beam (EB) lithography system. The organic resin and the tungsten film were processed by an ICP dry etching method using the resist mask. The processing was performed for 16 seconds under the following conditions: the etching gas flow rates of chlorine and tetrafluoromethane were 60 sccm and 40 sccm, respectively; the ICP power was 2000 W; Bias power was 50 W; the substrate temperature was −10° C.; and the pressure was 0.67 Pa.

Then, a first oxide insulating film and an oxide semiconductor film were processed to be the oxide insulating layer 121 and the oxide semiconductor layer 122, respectively, by a dry etching method using end-point detection under the following conditions: the etching gas flow rates of methane and argon were 16 sccm and 32 sccm, respectively; and the substrate heating temperature was 70° C.

As the insulating layer 175, a silicon oxynitride film was formed by a plasma CVD method. The silicon oxynitride film was formed to a thickness of 350 nm under the following conditions: the deposition gas flow rates of silane and dinitrogen monoxide were 5 sccm and 1000 sccm, respectively; the pressure in a chamber was controlled to be 133.30 Pa using a diaphragm-type baratron sensor and an APC valve; the RF power frequency was 13.56 MHz; the power was 35 W; the distance between electrodes was 20 mm; and the substrate heating temperature was 325° C.

After the deposition of the silicon oxynitride film, planarization treatment was performed by a CMP method.

After the planarization treatment, an organic resin film and a photosensitive resist were applied onto the silicon oxynitride film, and a resist mask was formed by patterning using an EB lithography system. The silicon oxynitride film and the organic resin film were processed to form the groove portion 174 by an ICP dry etching method using the resist mask.

The processing by an ICP dry etching method included two steps. The first step was performed for 15 seconds under the following conditions: the distance between the upper electrode and the substrate was 40 mm; the pressure was 6.5 Pa; the power of the RF power source was 1000 W on the upper side and 100 W on the lower side; the etching gas flow rate of tetrafluoromethane was 40 sccm; and the chamber temperatures were 60° C., 50° C., and 20° C. in the upper portion, the side wall portion, and the lower portion, respectively.

The second step was performed for 38 seconds under the following conditions: the distance between the upper electrode and the substrate was 25 mm; the pressure was 3.3 Pa; the power of the RF power source was 500 W on the upper side and 1150 W on the lower side; the etching gas flow rates of argon, oxygen, and hexafluoro-1,3-butadiene were 800 sccm, 30 sccm, and 22 sccm, respectively; and the chamber temperatures were 60° C., 50° C., and 20° C. in the upper portion, the side wall portion, and the lower portion, respectively.

Then, the tungsten film exposed by the above steps was processed by an ICP dry etching method. The etching was performed for 20 seconds under the following conditions: the pressure was 2.0 Pa; the power of the RF power source was 1000 W on the upper side and 25 W on the lower side; the etching gas flow rates of chlorine and tetrafluoromethane were each 40 sccm; and the substrate temperature was −10° C.

As the gate insulating layer 150, a silicon oxide film was formed by a plasma CVD method. The silicon oxide film was formed to a thickness of 10 nm under the following conditions: the deposition gas flow rates of silane and dinitrogen monoxide were 1 sccm and 800 sccm, respectively; the pressure in a chamber was controlled to be 200 Pa using a diaphragm-type baratron sensor and an APC valve; the RF power frequency was 60 MHz; the power was 150 W; the distance between electrodes was 28 mm; and the substrate heating temperature was 350° C.

As the gate electrode layer 161 and the gate electrode layer 162, a 10-nm-thick titanium nitride film and a 150-nm-thick tungsten film that were formed by a metal CVD method were used, respectively. Note that the titanium nitride film was formed by an ALD method.

The titanium nitride film was formed in the following manner: 50 sccm of titanium tetrachloride was introduced for 0.05 seconds and adsorbed on the gate insulating layer 150; 4500 sccm of a nitrogen gas was introduced for 0.2 seconds and purging was performed; 2700 sccm of an ammonia gas was introduced for 0.3 seconds and adsorbed on the gate insulating layer 150; and 4000 sccm of a nitrogen gas was introduced for 0.3 seconds. These steps were regarded as one cycle, and the film thickness was controlled by changing the number of cycles. Furthermore, the substrate stage temperature was 412° C., the pressure was 667 Pa, and the distance between the substrate stage and the gas injection stage was 3 mm.

The tungsten film was formed in three steps.

In the first step, tungsten was deposited to a thickness of 3 nm in three cycles under the following conditions: the deposition gas flow rates of tungsten hexafluoride, silane, argon, nitrogen, and argon for the rear side of the stage were 160 sccm, 400 sccm, 6000 sccm, 2000 sccm, and 4000 sccm, respectively; the pressure in a chamber was 1000 Pa; and the substrate stage temperature was 390° C.

In the second step, tungsten was deposited to a thickness of 41 nm under the following conditions: the deposition gas flow rates of tungsten hexafluoride, argon, nitrogen, and argon for the rear side of the stage were 250 sccm, 2000 sccm, 200 sccm, and 4000 sccm, respectively; the deposition gas flow rates of hydrogen were 2200 sccm and 1700 sccm (a gas line was divided into two); the pressure in a chamber was 10666 Pa; and the substrate stage temperature was 390° C.

In the third step, tungsten was deposited to a thickness of 106 nm under the following conditions: the deposition gas flow rates of tungsten hexafluoride, argon, nitrogen, and argon for the rear side of the stage were 250 sccm, 2000 sccm, 200 sccm, and 4000 sccm, respectively; the deposition gas flow rates of hydrogen were 2200 sccm and 1700 sccm (a gas line was divided into two); the pressure in a chamber was 10666 Pa; and the substrate stage temperature was 390° C.

After the titanium nitride film and the tungsten film were formed, planarization treatment was performed by a CMP method until the insulating layer 175 was exposed.

Figure 43:
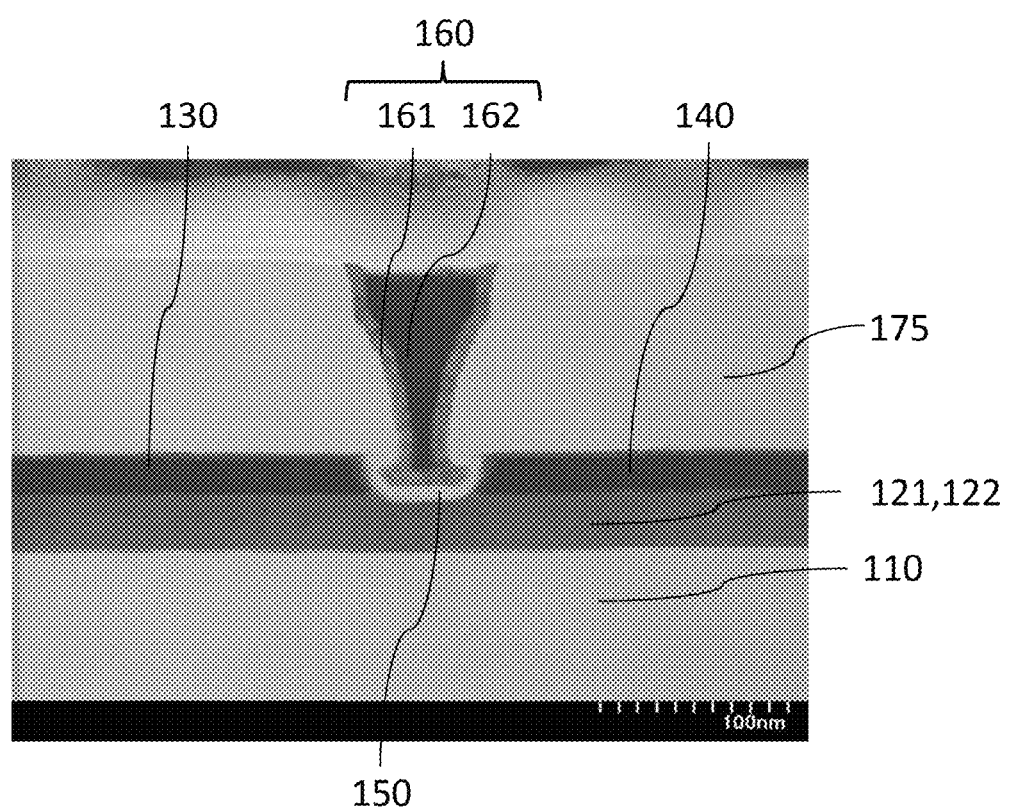
FIG. 43 is a cross-sectional view of a manufactured transistor.

The transistor was observed by STEM using HD-2300 produced by Hitachi High-Technologies Corporation. FIG. 43 shows the observations of the cross section of the transistor by STEM.

As shown in FIG. 43, the transistor includes the insulating layer 110, the oxide insulating layer 121, the oxide semiconductor layer 122, the source electrode layer 130, the drain electrode layer 140, the gate insulating layer 150, the gate electrode layer 160, and the insulating layer 175. The insulating layer 175 has an opening portion and the opening portion is filled with the gate insulating layer 150 and the gate electrode layer 160.

In addition, the insulating layer 175 has a tapered shape and a round shape; thus, the embeddability of the gate insulating layer 150 and the gate electrode layer 160 can be improved.

With such a structure, the gate electrode layer 160, the source electrode layer 130, and the drain electrode layer 140 can be formed in a self-aligned manner; thus, alignment accuracy can be improved and miniaturized transistors can be manufactured more easily. In addition, parasitic capacitance between the gate electrode layer 160 and the source electrode layer 130 or between the gate electrode layer 160 and the drain electrode layer 140 can be reduced, so that the transistor characteristics (e.g., frequency characteristics) can be improved.

Example 2

In this example, results of observing cross sections of the transistor fabricated by the method described in Embodiment 1 will be described. For the processing similar to that in Example 1, the description in Example 1 is referred to.

As the insulating layer 175, a silicon oxynitride film was formed by a plasma CVD method. The silicon oxynitride film was formed to a thickness of 320 nm under the following conditions: the deposition gas flow rates of silane and dinitrogen monoxide were 5 sccm and 1000 sccm, respectively; the pressure in a chamber was controlled to be 133.30 Pa using a diaphragm-type baratron sensor and an APC valve; the RF power frequency was 13.56 MHz; the power was 35 W; the distance between electrodes was 20 mm; and the substrate heating temperature was 325° C.

The insulating layer 175 was formed by an ICP dry etching method in two steps. The first step was performed for 15 seconds under the following conditions: the distance between the upper electrode and the substrate was 40 mm; the pressure was 6.5 Pa; the power of the RF power source was 1000 W on the upper side and 100 W on the lower side; the etching gas flow rate of tetrafluoromethane was 100 sccm; and the chamber temperatures were 60° C., 50° C., and 20° C. in the upper portion, the side wall portion, and the lower portion, respectively.

The second step was performed for 42 seconds under the following conditions: the distance between the upper electrode and the substrate was 25 mm; the pressure was 3.3 Pa; the power of the RF power source was 500 W on the upper side and 1150 W on the lower side; the etching gas flow rates of argon, oxygen, and hexafluoro-1,3-butadiene were 800 sccm, 30 sccm, and 22 sccm, respectively; and the chamber temperatures were 60° C., 50° C., and 20° C. in the upper portion, the side wall portion, and the lower portion, respectively.

Then, the tungsten film exposed by the above steps was processed by an ICP dry etching method. The etching was performed for 10 seconds under the following conditions: the pressure was 2.0 Pa; the power of the RF power source was 1000 W on the upper side and 25 W on the lower side; the etching gas flow rates of chlorine, tetrafluoromethane, and oxygen were 14 sccm, 28 sccm, and 28 sccm, respectively; and the substrate temperature was −10° C.

The oxide insulating layer 123 was formed to a thickness of 5 nm by a sputtering method using a target of In:Ga:Zn=1:3:2 (atomic ratio). The oxide insulating layer 123 was formed under the following conditions: the pressure in a chamber was 0.7 Pa; a DC power source was used and the power was 0.5 kW; the sputtering gas flow rates of an Ar gas and an oxygen gas were 30 sccm and 15 sccm, respectively; the distance between the sample and the target was 60 mm; and the substrate heating temperature was 200° C.

Figure 44A:
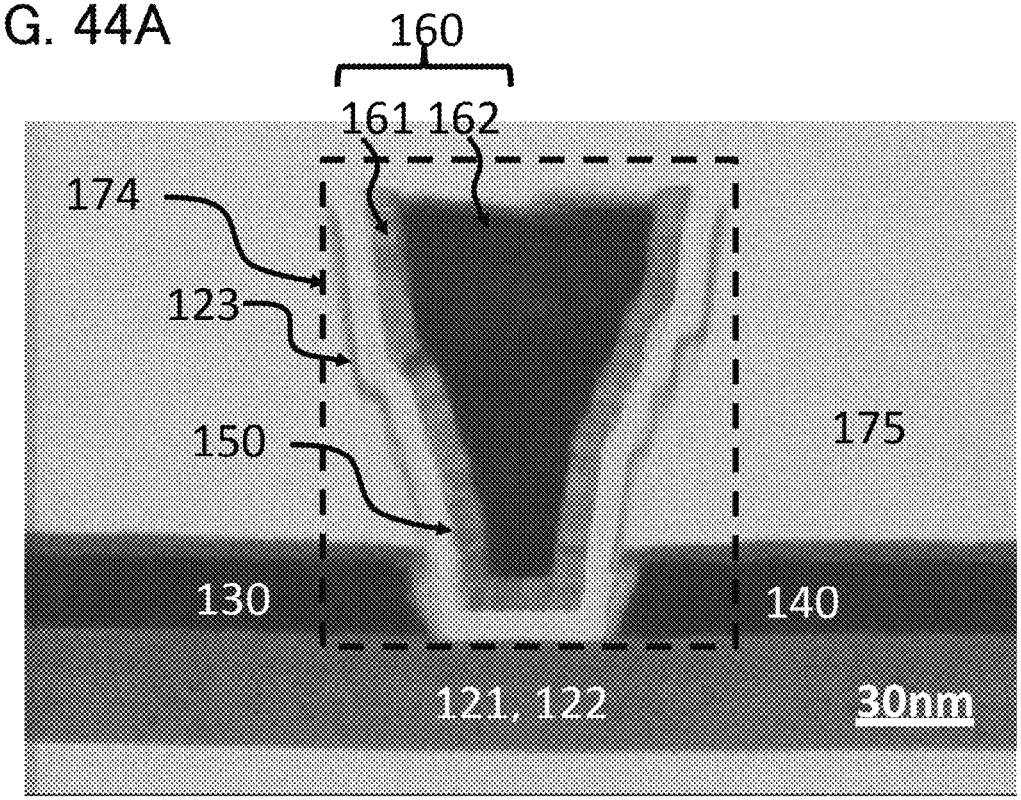
FIGS. 44A and 44B are cross-sectional views of a manufactured transistor.
Figure 44B:
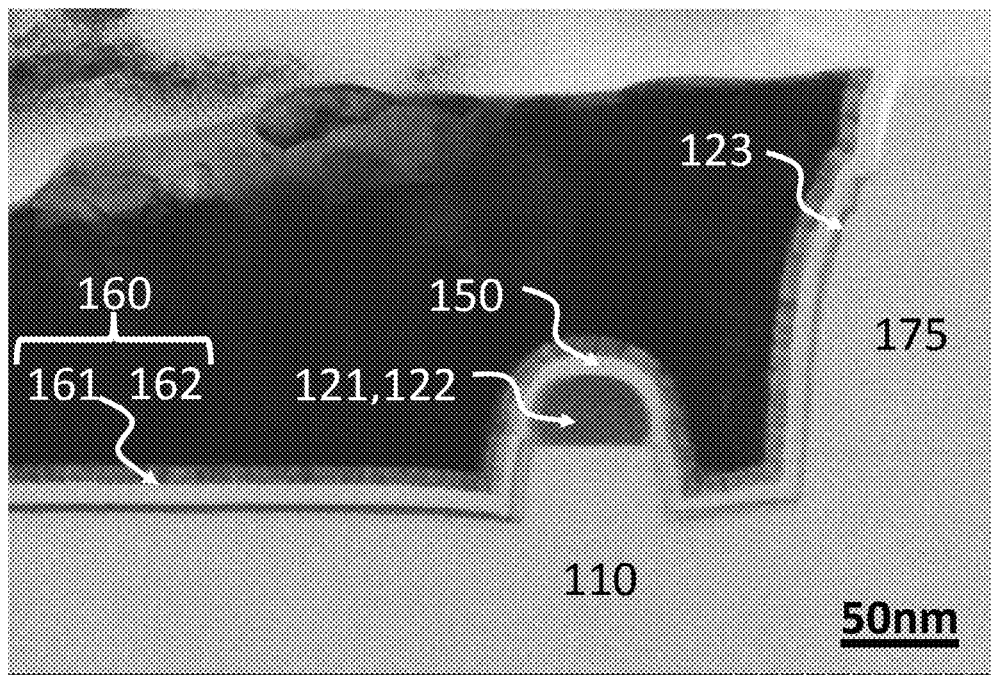

The transistor was observed by STEM as in Example 1. FIGS. 44A and 44B show the results of observing the cross sections of the transistor by STEM.

As shown in FIGS. 44A and 44B, the transistor fabricated in this example includes the insulating layer 110, the oxide insulating layer 121, the oxide semiconductor layer 122, the oxide insulating layer 123, the source electrode layer 130, the drain electrode layer 140, the gate insulating layer 150, the gate electrode layer 160, and the insulating layer 175. In addition, in the transistor, the groove portion 174 is provided and the insulating layer 175 has a tapered shape. The structure of the transistor is substantially the same as the structure shown in FIGS. 1A and 1B, and the present invention can improve the embeddability of the oxide insulating layer 123, the gate insulating layer 150, and the gate electrode layer 160 in the groove portion 174.

Example 3

In this example, measurement results of electrical characteristics of transistors fabricated using one embodiment of the present invention are shown.

In this example, for the portions where processing conditions similar to those in Examples 1 and 2 were used, the descriptions in Examples 1 and 2 are referred to.

After the insulating layer 110 was formed, planarization treatment using a CMP method and heat treatment were performed. The heat treatment was performed at 450° C. under a nitrogen atmosphere for one hour, and then performed at 450° C. under vacuum for one hour.

Furthermore, oxygen addition treatment was performed on the insulating layer 110 by an ion implantation method. Note that the oxygen addition treatment was performed under the following conditions: the acceleration voltage was 60 kV; and the dose of oxygen was $2.0 \times 10^{16}$ ions/cm$^2$.

In addition, after the first oxide insulating film and the oxide semiconductor film were formed, heat treatment was performed. The heat treatment was performed at 450° C. under a nitrogen atmosphere for one hour, and then at 450° C. under an oxygen atmosphere for one hour.

In some samples, the oxide semiconductor layer 122 was formed to a thickness of 15 nm by a sputtering method using a target of In:Ga:Zn=4:2:4.1. The oxide semiconductor layer 122 was formed using a turbo molecular pump and a cryotrap under the following conditions: the pressure in a chamber was 0.7 Pa; a DC power source was used and the power was 0.5 kW; the sputtering gas flow rates of an Ar gas and an oxygen gas were 30 sccm and 15 sccm, respectively; the distance between the sample and the target was 60 mm; and the substrate heating temperature was 200° C.

Before the insulating layer 170 was formed, a silicon oxynitride film was formed by a plasma CVD method. The silicon oxynitride film was formed to a thickness of 50 nm under the following conditions: the deposition gas flow rates of silane and dinitrogen monoxide were 5 sccm and 1000 sccm, respectively; the pressure in a chamber was controlled to be 133.30 Pa using a diaphragm-type baratron sensor and an APC valve; the RF power frequency was 13.56 MHz; the power was 35 W; the distance between electrodes was 20 mm; and the substrate heating temperature was 325° C.

Furthermore, in some samples, oxygen addition treatment was performed on the silicon oxynitride film by an ion implantation method (Step 1). The oxygen addition treatment was performed under the following conditions: the acceleration voltage was 5 kV; and the dose of oxygen was $1.0 \times 10^{16}$ ions/cm$^2$.

In addition, in some samples, heat treatment was performed after the silicon oxynitride film was formed (Step 2). The heat treatment was performed at 350° C. under an oxygen atmosphere for one hour.

Furthermore, the insulating layer 170 was formed to a thickness of 40 nm by a sputtering method using an aluminum oxide target. The insulating layer 170 was formed under the following conditions: the pressure in a chamber was 0.4 Pa; an RF power source was used and the power was 2.5 kW; the sputtering gas flow rates of an Ar gas and an oxygen gas were each 25 sccm; the distance between the sample and the target was 60 mm; and the substrate heating temperature was 250° C.

In addition, heat treatment was performed after the insulating layer 170 was formed. The heat treatment was performed at 350° C. under an oxygen atmosphere for one hour.

Then, an insulating layer and a wiring layer that are needed in measuring the electrical characteristics of the transistors were formed.

Table 1 shows step conditions which are different between samples (the composition of the oxide semiconductor layer 122, the oxygen addition treatment (Step 1), and the heat treatment (Step 2)) in the manufacturing process of the above transistors.

TABLE 1

| | Oxide semiconductor layer 122 | Step 1 (Oxygen addition treatment) | Step 2 (Heat treatment) |
| --- | --- | --- | --- |
| Condition 1 | In:Ga:Zn = 4:2:4.1 | not performed | performed |
| Condition 2 | In:Ga:Zn = 1:1:1 | not performed | performed |
| Condition 3 | In:Ga:Zn = 4:2:4.1 | not performed | not performed |
| Condition 4 | In:Ga:Zn = 1:1:1 | not performed | not performed |
| Condition 5 | In:Ga:Zn = 1:1:1 | performed | performed |
| Condition 6 | In:Ga:Zn = 1:1:1 | performed | not performed |

Figure 45:
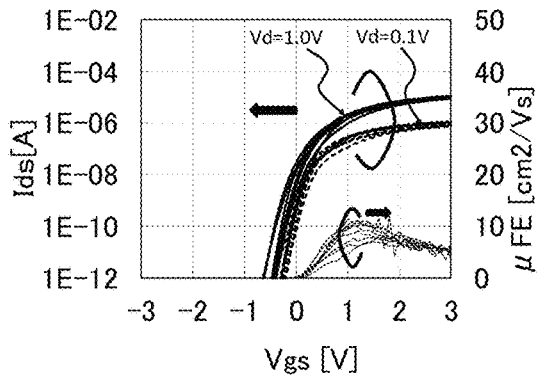
FIG. 45 shows measurement results of Ids-Vgs characteristics of fabricated transistors.
Figure 45:
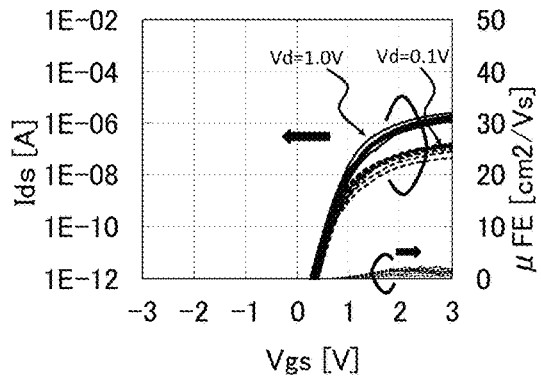
Figure 45:
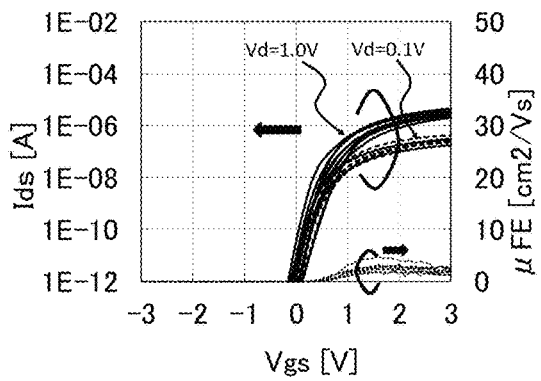
Figure 45:
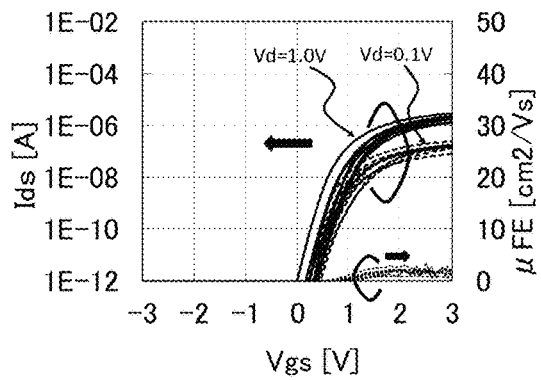
Figure 45:
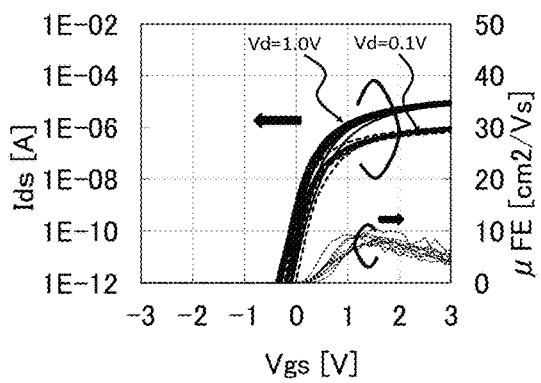
Figure 45:
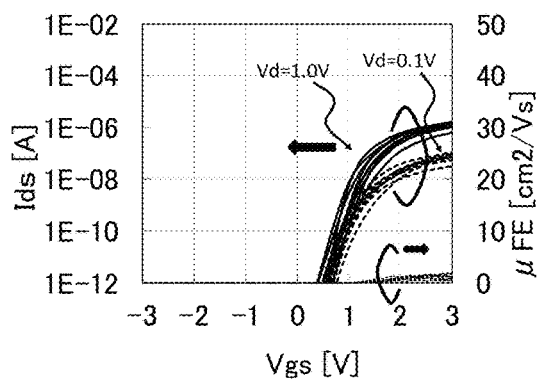

FIG. 45 shows the Ids-Vgs measurement results of the fabricated transistors. The channel length of the transistors was 34 nm, and the channel width thereof was 38 nm. The drain voltages (Vd) were 0.1 V and 1.0 V.

As shown in FIG. 45, in all the conditions, high on-state current and off-state current lower than or equal to the lower measurement limit were obtained. Under Condition 4, variations in characteristics are small; thus, it is found that the present invention can provide transistors with small variations in characteristics.

Figure 46:
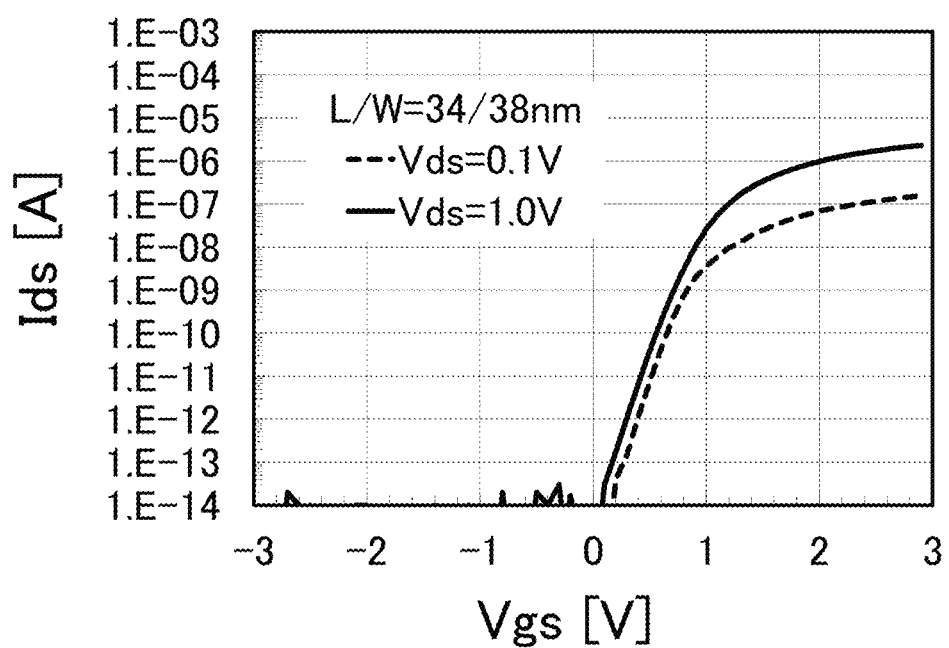
FIG. 46 shows measurement results of Ids-Vgs characteristics of a fabricated transistor.

In addition, FIG. 46 shows the Ids-Vgs measurement results of one point in the substrate surface under Condition 4.

As shown in FIG. 46, when Vds is 0.1 V and 1.0 V, the gate voltage ($V_{shift}$) at a drain current of $1 \times 10^{-12}$ A is larger than 0 V, which means that normally-off characteristics are obtained, and the drain voltage dependence of $V_{shift}$ tends to be small. In addition, when Vds is 1.0 V, high on-state current characteristics are obtained.

Next, the Ids-Vgs measurement and the reliability evaluation were performed on transistors each having a channel length of 58 nm and a channel width of 62 nm.

The Ids-Vgs measurement was performed at Vd of 0.1 V and 1.2 V. The reliability evaluation was performed in the following manner: the positive gate BT test (+GBT test), the negative gate BT test (−GBT test), or the drain BT test (+DBT test) was performed, and then the Ids-Vgs measurement was performed at Vds of 0 V and 1.8 V. The reliability test was performed on the transistors formed under Condition 2, Condition 4, Condition 5, and Condition 6.

The +GBT test was performed at Vgs of +1.8 V at 150° C. for one hour, and variations in characteristics over time were measured. The −GBT test was performed at Vgs of −1.8 V at 150° C. for one hour, and variations in characteristics over time were measured. The +DBT test was performed at Vds of +1.8 V at 150° C. for one hour, and variations in characteristics over time were measured.

Figure 47:
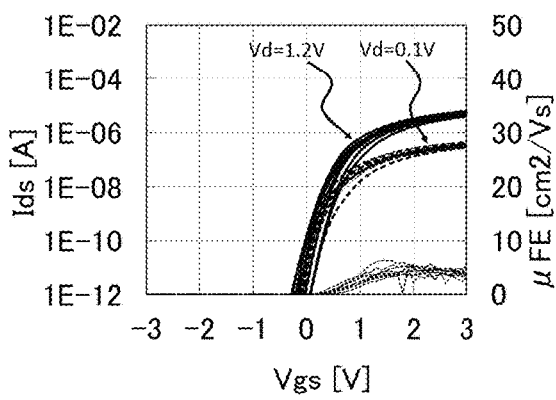
FIG. 47 shows measurement results of Ids-Vgs characteristics of fabricated transistors.
Figure 47:
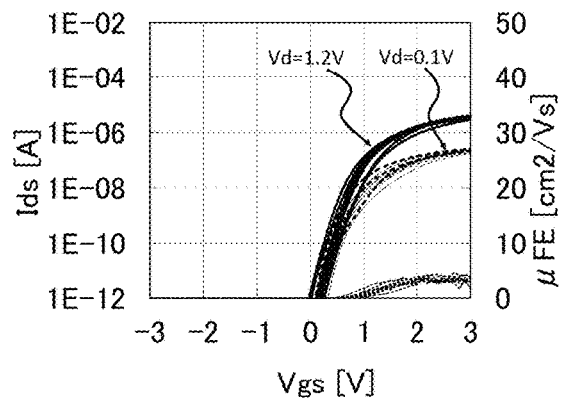
Figure 47:
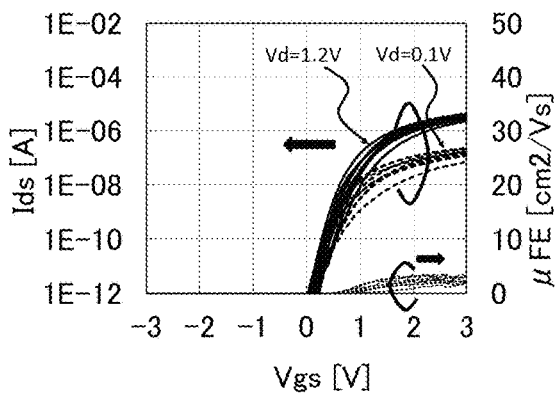
Figure 47:
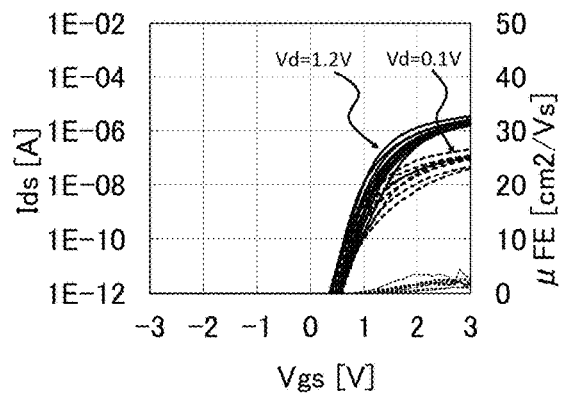
Figure 48:
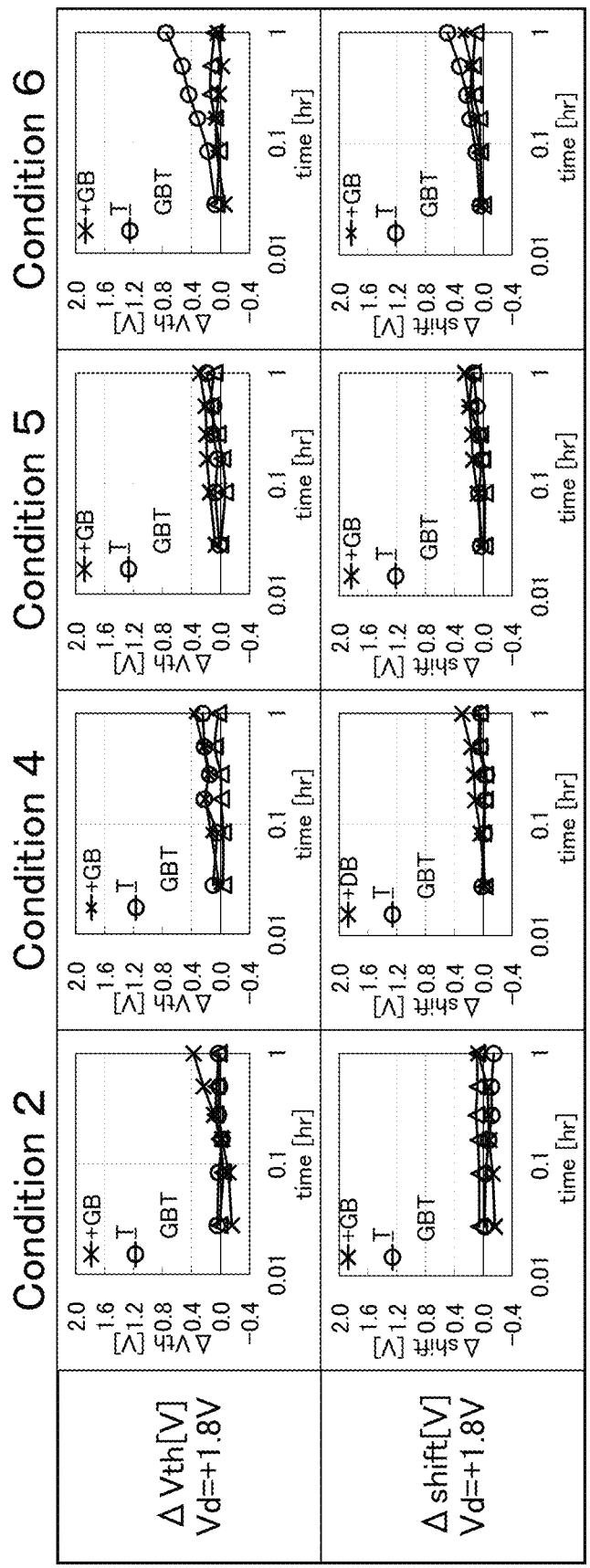
FIG. 48 shows reliability test results of fabricated transistors.

FIG. 47 shows the Ids-Vgs measurement results of the transistors each having a channel length of 58 nm and a channel width of 62 nm, and FIG. 48 shows the results of the reliability tests.

In FIG. 47, favorable characteristics are obtained as in FIG. 45. Furthermore, as shown in FIG. 48, in all of the reliability tests, variations in characteristics are small; thus, it is found that the transistors fabricated using the present invention can have high reliability.

Thus, combination of the above-described electrical characteristics with the characteristics obtained in the other examples makes it possible to stably manufacture LSIs for low-power electronic devices, and the like, which cannot be achieved by using Si.

Example 4

In this example, the measurement results of the frequency characteristics of the transistors fabricated using the present invention are described.

Here, the frequency characteristics of the transistors under Condition 3 and Condition 4 shown in Example 3 were measured. Condition 3 is different from Condition 4 in only the composition of the oxide semiconductor layer 122. The oxide semiconductor layer 122 under Condition 3 was formed to a thickness of 15 nm by a sputtering method using a target of In:Ga:Zn=4:2:4.1, and the oxide semiconductor layer 122 under Condition 4 was formed to a thickness of 15 nm by a sputtering method using a target of In:Ga:Zn=1:1:1.

The transistors were each designed with a channel length (L) of 30 nm or 60 nm and a channel width (W) of 30 nm and evaluated.

A network analyzer used in the measurement has a standard impedance of 50Ω. When the impedance of a transistor to be subjected to the measurement is higher than the standard impedance, measurement accuracy is decreased. Thus, the impedance was decreased by connecting a plurality of transistors in parallel to increase the sum of channel widths of the transistors. Specifically, 600 transistors each having the above-described size were connected in parallel to measure frequency characteristics.

Figure 49:
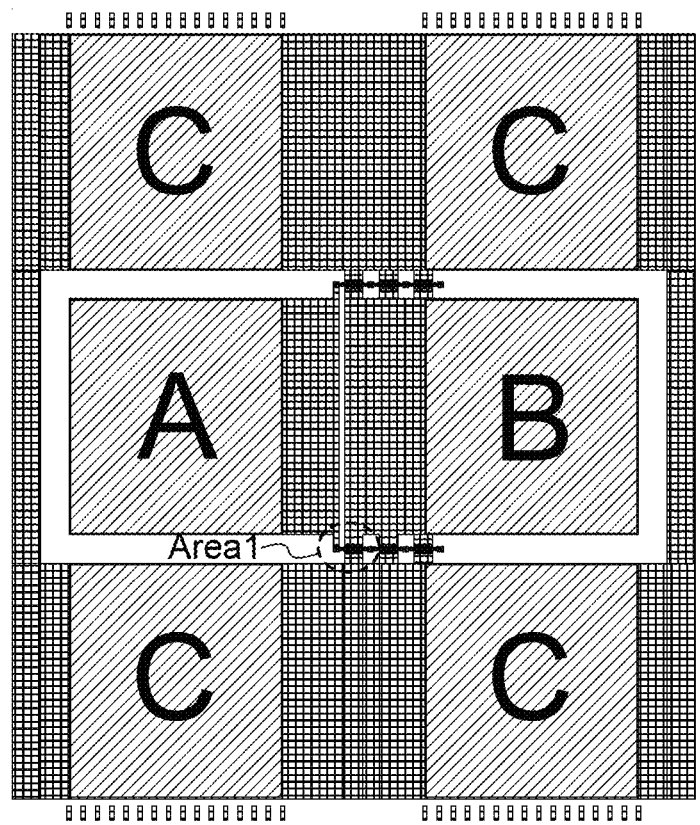
FIG. 49 is a top view of a fabricated TEG.
Figure 50:
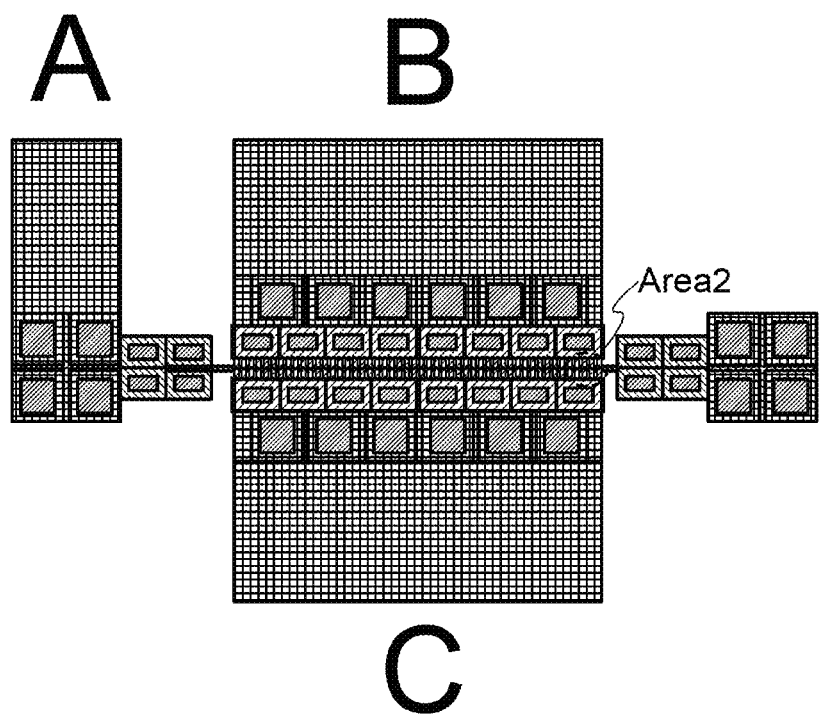
FIG. 50 is a top view of a fabricated TEG.
Figure 51:
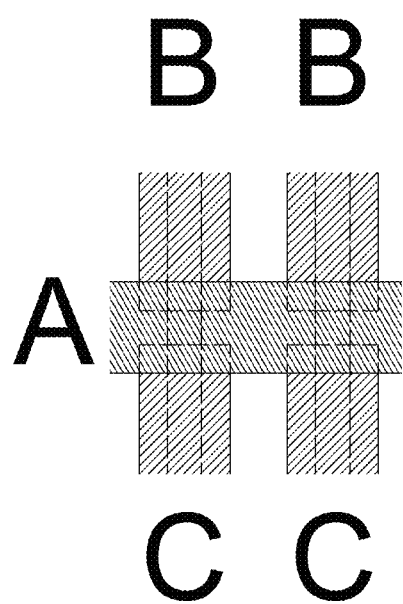
FIG. 51 is a top view of a fabricated TEG.

FIG. 49, FIG. 50, and FIG. 51 each show the layout of transistors that were subjected to the measurement.

FIG. 49 is a top view illustrating a transistor where 600 transistors each having a channel width of 30 nm are connected in parallel and measurement terminals. A terminal A is electrically connected to a gate of the transistor. A terminal B is electrically connected to one of a source and a drain of the transistor. A terminal C is supplied with a GND potential and is electrically connected to the other of the source and the drain of the transistor. Transistors are arranged in Area 1.

FIG. 50 is an enlarged view of Area 1 in the top view of FIG. 49. The terminal A is electrically connected to the gate of the transistor, and the terminals B and C are electrically connected to the source and the drain of the transistor.

FIG. 51 is an enlarged view of Area 2 in the top view of FIG. 50. The terminal A is electrically connected to the gate of the transistor, and the terminals B and C are electrically connected to the source and the drain of the transistor.

A network analyzer was used in the measurement. A network analyzer N5247A produced by Agilent Technologies and SMUs 6242 and 6241A produced by ADC CORPORATION were used.

At the same time as the measurement of a target element (device under test (DUT)), Open and Short test element groups (TEG) were measured, and the characteristics of the DUT were obtained (this is also called de-embedding).

Next, S parameters were measured by the network analyzer, and cutoff frequency ($f_T$) was calculated from the S parameters. The cutoff frequency ($f_T$) is defined as frequency at which a current amplification factor or an extrapolated current amplification factor becomes 1.

Figure 52:
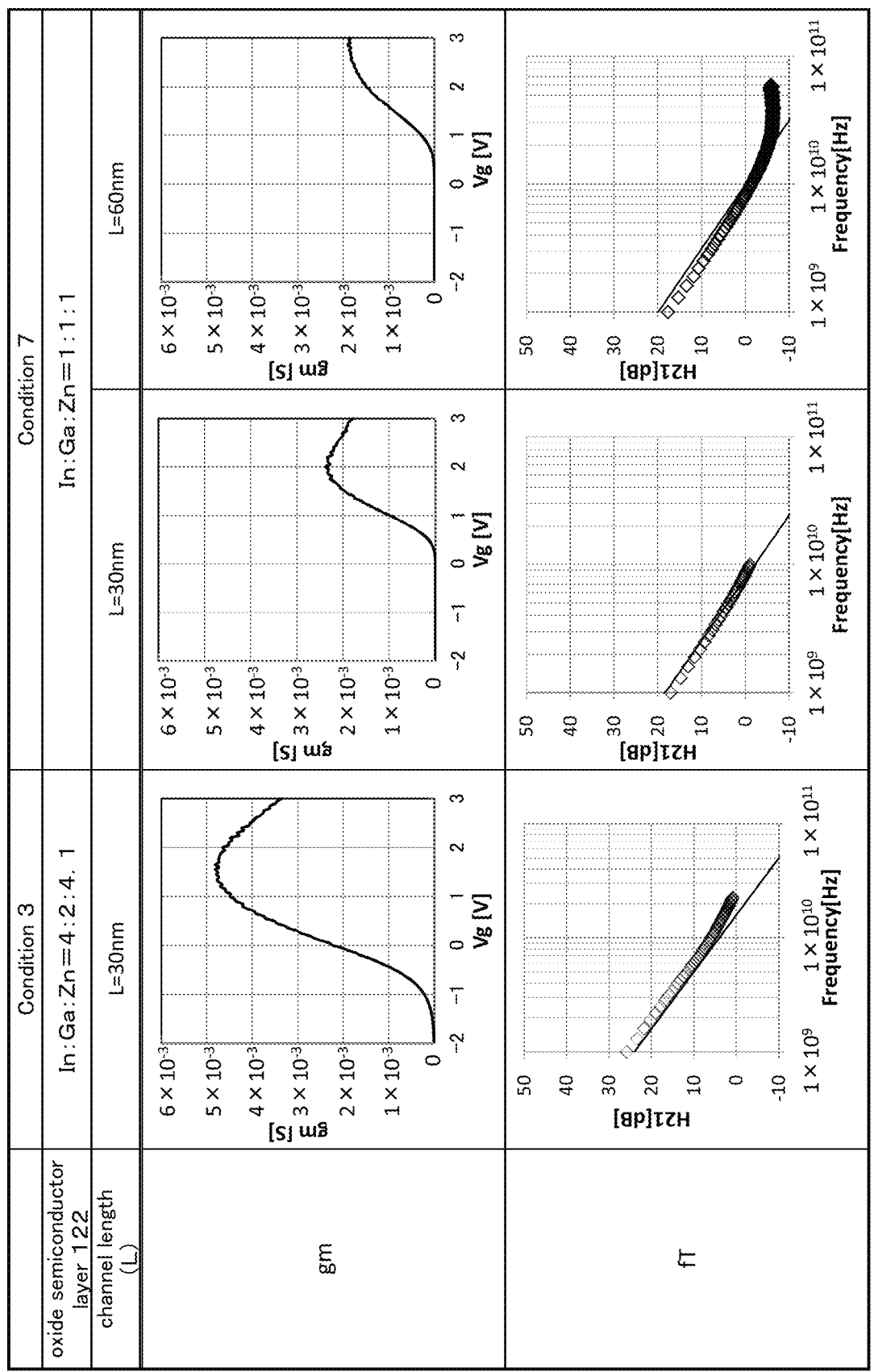
FIG. 52 shows measurement results of frequency characteristics of fabricated transistors.

FIG. 52 shows measurement results of frequency characteristics. FIG. 52 shows measurement results of transconductance ($g_m$), and the frequency was measured based on the results at Vd of 2.0 V and Vg of 2.0 V. FIG. 52 shows data after de-embedding based on the measured S parameters. In FIG. 52, the data after de-embedding is shown in a graph whose vertical axis represents RF Gain [dB].

As shown in FIG. 52, cutoff frequency $f_T$ calculated from an extrapolated value is 20.14 GHz when L is 30 nm under Condition 3, 7.86 GHz when L is 30 nm under Condition 4, and 8.03 GHz when L is 60 nm under Condition 4.

Therefore, it is found that the transistor using the present invention has high frequency characteristics and can achieve high-speed operation when the transistor is used in a memory circuit, a logic circuit, or an analog circuit. Thus, combination of such characteristics with the characteristics obtained in the other examples makes it possible to stably manufacture LSIs and the like which can achieve low-power consumption and high-speed operation, which cannot be achieved by using Si.

Example 5

In this example, results of observing cross sections of the transistor fabricated by the method described in Embodiment 1 will be described. For the processing similar to that in Examples 1 and 2, the description in Examples 1 and 2 is referred to.

In this example, before the insulating layer 175 was formed, a tungsten film and a silicon nitride film which are to be a hard mask were formed over the planarized silicon oxynitride film. The tungsten film was formed to a thickness of 30 nm by a sputtering method, and the silicon nitride film was formed to a thickness of 50 nm by a plasma CVD method.

Then, a resist mask was formed by a lithography process, and then a hard mask was formed by an ICP dry etching method in four steps.

The first step was performed for 13 seconds under the following conditions: the distance between the upper electrode and the substrate was 80 mm; the pressure was 3.0 Pa; the power of the RF power source was 500 W on the upper side and 100 W on the lower side; the etching gas flow rate of tetrafluoromethane was 80 sccm; and the chamber temperature in the lower portion was 20° C.

The second step was performed for 28 seconds under the following conditions: the distance between the upper electrode and the substrate was 80 mm; the pressure was 5.3 Pa; the power of the RF power source was 550 W on the upper side and 350 W on the lower side; the etching gas flow rates of trifluoromethane and oxygen were 67 sccm and 13 sccm, respectively; and the chamber temperature in the lower portion was 20° C.

The third step was performed for 3 seconds under the following conditions: the distance between the upper electrode and the substrate was 100 mm; the pressure was 1.3 Pa; the power of the RF power source was 1000 W on each of the upper side and the lower side; the etching gas flow rates of tetrafluoromethane, oxygen, and chlorine were 22 sccm, 22 sccm, and 11 sccm, respectively; and the chamber temperature in the lower portion was 20° C.

The fourth step was performed for 13 seconds under the following conditions: the distance between the upper electrode and the substrate was 100 mm; the pressure was 0.6 Pa; the power of the RF power source was 1000 W on the upper side and 100 W on the lower side; the etching gas flow rates of tetrafluoromethane, oxygen, and chlorine were 22 sccm, 22 sccm, and 11 sccm, respectively; and the chamber temperature in the lower portion was 20° C.

Then, the silicon oxynitride film exposed by the above steps was processed by an ICP dry etching method. The etching was performed for 42 seconds under the following conditions: the distance between the upper electrode and the substrate was 25 mm; the pressure was 3.3 Pa; the power of the RF power source was 500 W on the upper side and 1150 W on the lower side; the etching gas flow rates of argon, oxygen, and hexafluoro-1,3-butadiene were 800 sccm, 30 sccm, and 22 sccm, respectively; and the chamber temperature in the lower portion was 20° C.

Then, the tungsten film exposed by the above steps was processed by an ICP dry etching method in two steps.

The first step was performed for 3 seconds under the following conditions: the distance between the upper electrode and the substrate was 100 mm; the pressure was 1.3 Pa; the power of the RF power source was 1000 W on the upper side and 50 W on the lower side; the etching gas flow rates of tetrafluoromethane, oxygen, and chlorine were 22 sccm, 22 sccm, and 11 sccm, respectively; and the chamber temperature in the lower portion was 20° C.

The second step was performed for 12 seconds under the following conditions: the distance between the upper electrode and the substrate was 100 mm; the pressure was 0.6 Pa; the power of the RF power source was 1000 W on the upper side and 50 W on the lower side; the etching gas flow rates of tetrafluoromethane, oxygen, and chlorine were 22 sccm, 22 sccm, and 11 sccm, respectively; and the chamber temperature in the lower portion was 20° C.

Figure 53A:
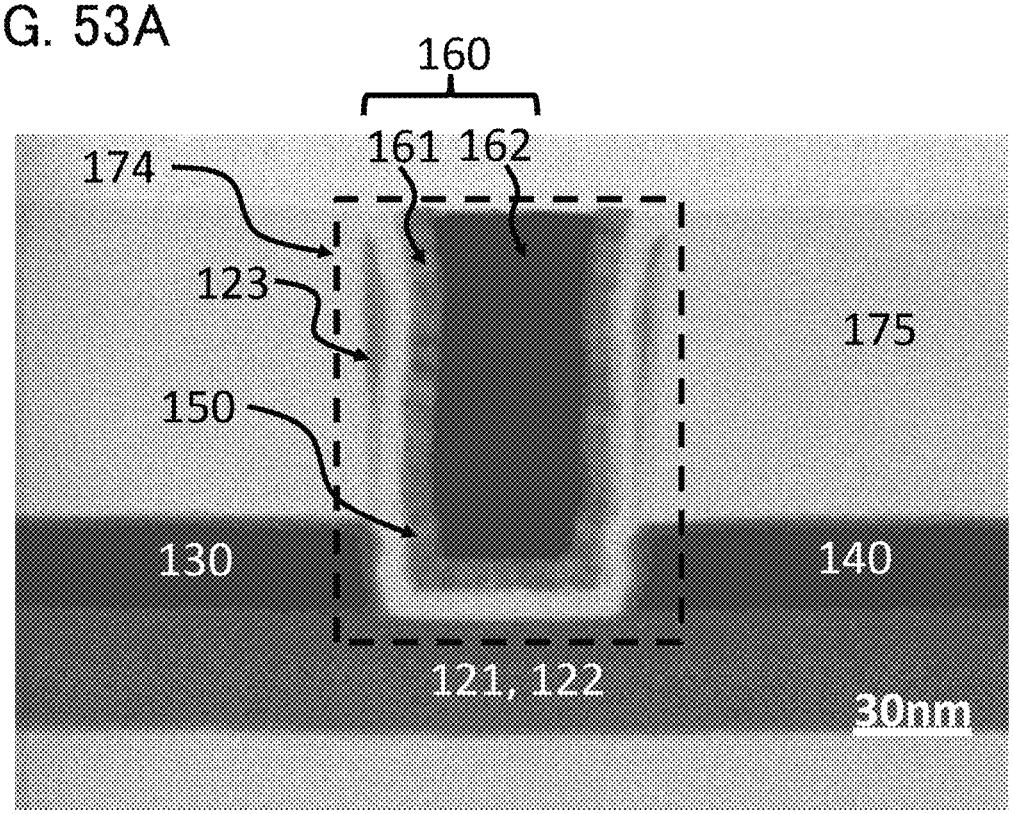
FIGS. 53A and 53B are cross-sectional views of a fabricated transistor.
Figure 53B:
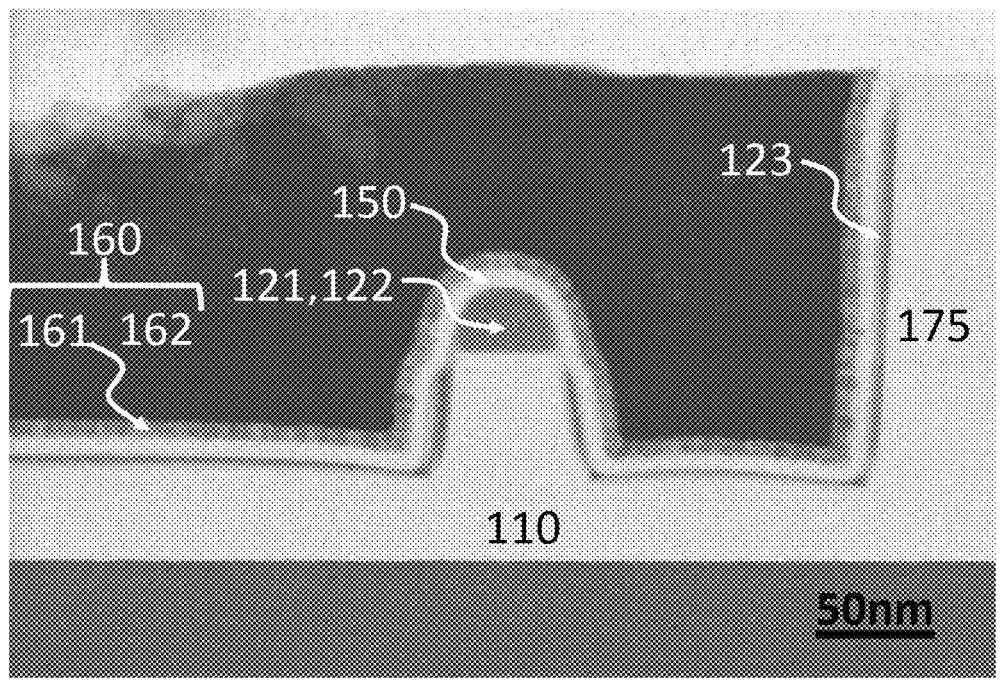

The transistor was observed by STEM as in Example 1 and Example 2. FIGS. 53A and 53B show the results of observing the cross sections of the transistor by STEM.

As shown in FIGS. 53A and 53B, the transistor fabricated in this example includes the insulating layer 110, the oxide insulating layer 121, the oxide semiconductor layer 122, the oxide insulating layer 123, the source electrode layer 130, the drain electrode layer 140, the gate insulating layer 150, the gate electrode layer 160, and the insulating layer 175. In addition, in the transistor, the groove portion 174 is provided, the insulating layer 175 has a tapered shape, and the side surface of the insulating layer 175 is substantially vertical. This cross section is substantially the same as the cross section shown in FIG. 14B. With such a shape, variations in shape of the transistors can be inhibited, so that the channel lengths can be stabilized and variations in transistor characteristics can be reduced.

Therefore, with the present invention, transistors in which variations in characteristics are inhibited and parasitic capacitance is reduced can be manufactured.

Example 6

In this example, a transistor was fabricated by the method described in Embodiment 1 and the cross section of the transistor was observed. The observation results will be described with reference to FIG. 54. For the processing similar to that in Example 1, Example 2, and Example 5, the description in Example 1, Example 2, and Example 5 is referred to.

This example is different from Example 5 in a process size of the resist mask used in manufacture of the transistor.

Figure 54:
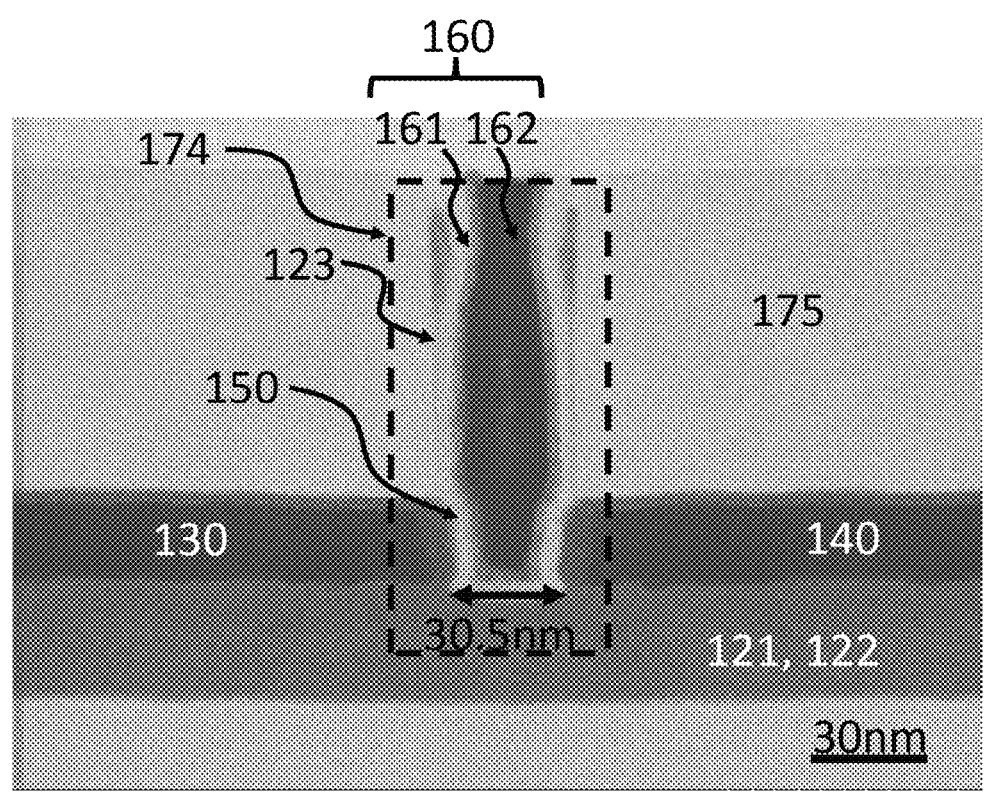
FIG. 54 is a cross-sectional view of a fabricated transistor.

The transistor was observed by STEM as in Example 1, Example 2, and Example 5. FIG. 54 shows the results of observing the cross section of the transistor by STEM.

As shown in FIG. 54, in the transistor fabricated in this example, the groove portion 174 is provided and the side surface of the insulating layer 175 is substantially vertical as in Example 5. The channel length of the transistor is 30.5 nm; thus, it is found that a miniaturized transistor is fabricated. With such a shape, even in a miniaturized transistor, variations in shape of the transistors can be inhibited, so that the channel lengths can be stabilized and variations in transistor characteristics can be reduced.

Therefore, with the present invention, transistors in which variations in characteristics are inhibited and parasitic capacitance is reduced can be manufactured.

Example 7

In this example, measurement results of electrical characteristics of transistors fabricated by the method described in Embodiment 1 will be described with reference to FIG. 55, FIG. 56, and FIG. 57.

Fabrication conditions of transistors used in this example are similar to those in Example 3.

Measurement results of frequency will be described. The frequency was measured using a transistor fabricated under Condition 3 in Example 3 at Vd of 2.0 V and Vg of 2.0 V. The transistor has a channel length of 30 nm and a channel width of 18 μm (600 transistors each having a channel width of 30 nm were connected in parallel).

Figure 55:
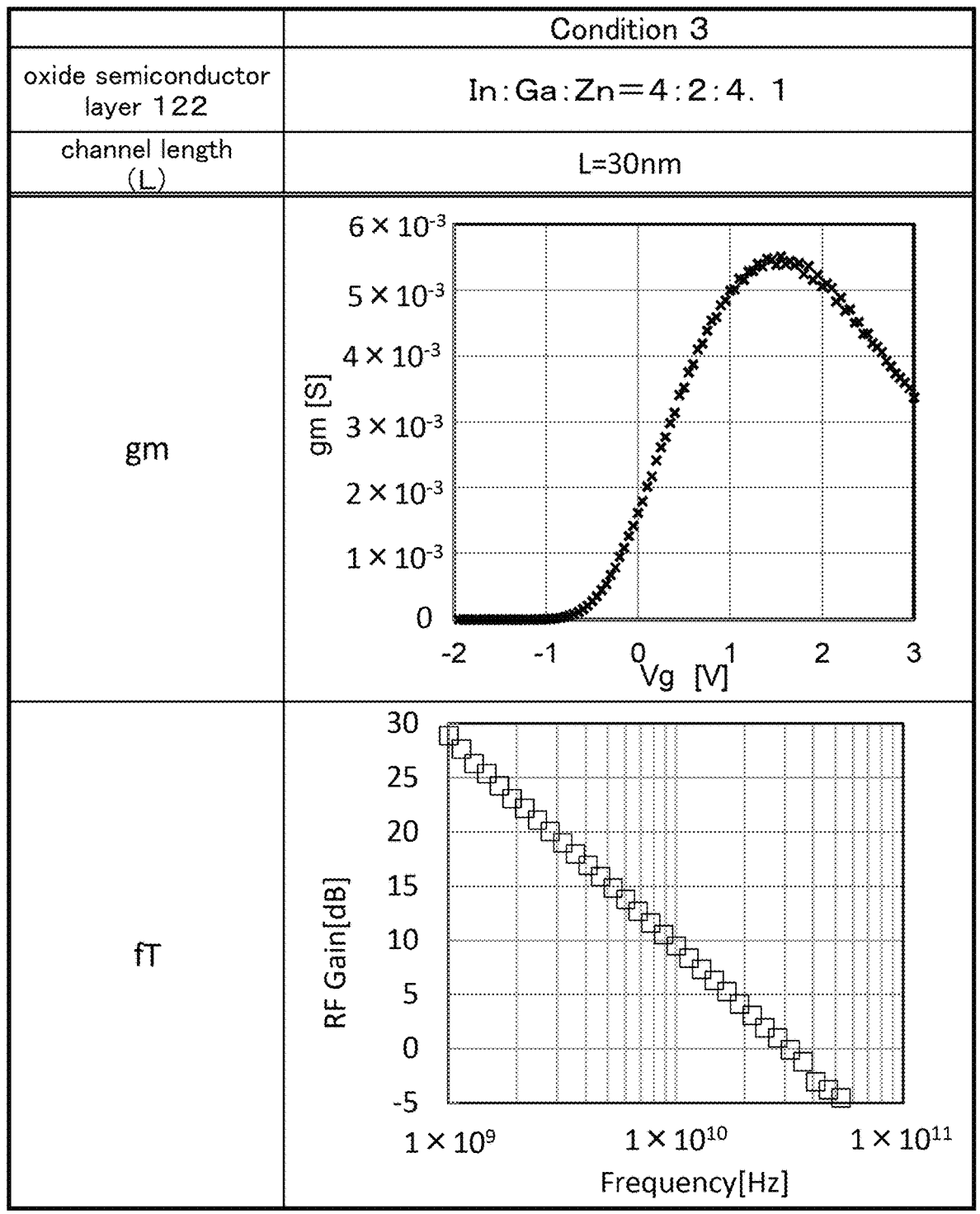
FIG. 55 shows measurement results of frequency characteristics of a fabricated transistor.

FIG. 55 shows measurement results of frequency characteristics. FIG. 55 shows measurement results of transconductance ($g_m$), and the frequency was measured based on the results at Vd of 2.0 V and Vg of 2.0 V. FIG. 55 shows data after de-embedding based on the measured S parameters. In FIG. 55, the data after de-embedding is shown in a graph whose vertical axis represents RF Gain [dB].

As shown in FIG. 55, cutoff frequency $f_T$ calculated from an extrapolated value is 28.3 GHz when L is 30 nm; that is, high frequency was obtained.

Next, measurement results of off-leakage current will be described.

By the use of a transistor fabricated under Condition 2 in Example 3, the off-leakage current was measured at Vd of 1.8 V and a measurement temperature of 150° C. in an air atmosphere. The transistor has a channel length of 30 nm or 60 nm and a channel width of 18 μm (300 transistors each having a channel width of 60 nm were connected in parallel).

Figure 56:
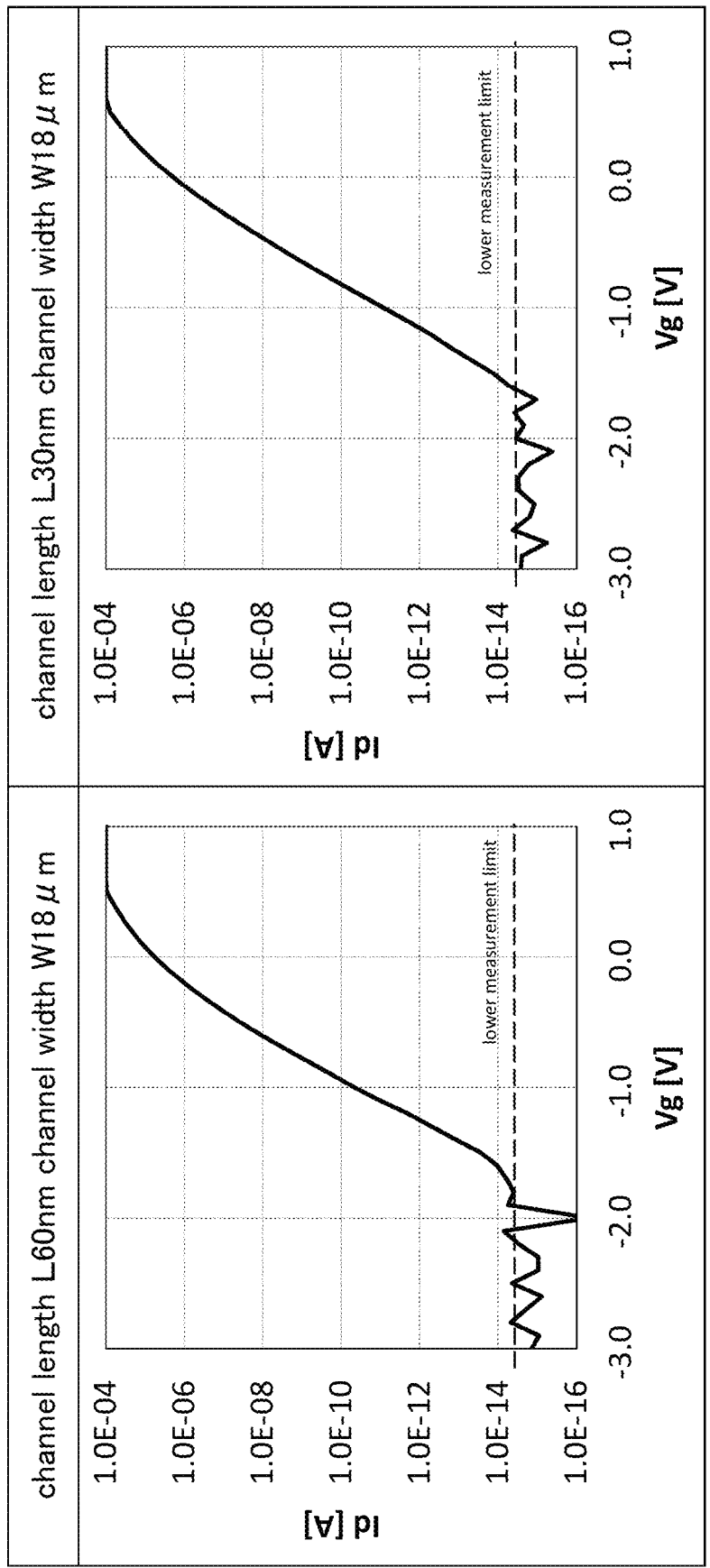
FIG. 56 shows measurement results of off-leakage current of fabricated transistors.

FIG. 56 shows the measurement results of off-leakage current.

As shown in FIG. 56, off-leakage current is lower than or equal to the lower measurement limit at 150° C. In consideration of the acceleration factor depending on temperature, in the case where the channel width is 60 nm, the off-leakage current of the transistor fabricated using the present invention is lower than or equal to 100 zA, which is extremely low, at 85° C.

Next, measurement results of reliability will be described.

The reliability measurement was performed in the following manner: to the transistor fabricated under Condition 6 in Example 3, stress was applied at Vd of 1.8 V and Vg of 0 V at 150° C. for one hour, and the Id-Vg characteristics when Vd was 0.1 V or 1.8 V before and after the stress test were measured. The transistor has a channel length of 58 nm and a channel width of 62 nm. After the above measurement, the source electrode and the drain electrode were switched, and the Id-Vg characteristics measurement was performed.

In addition, a transistor subjected to additional heat treatment (heat treatment at 400° C. in a nitrogen atmosphere for one hour) after being fabricated was similarly evaluated.

Figure 57:
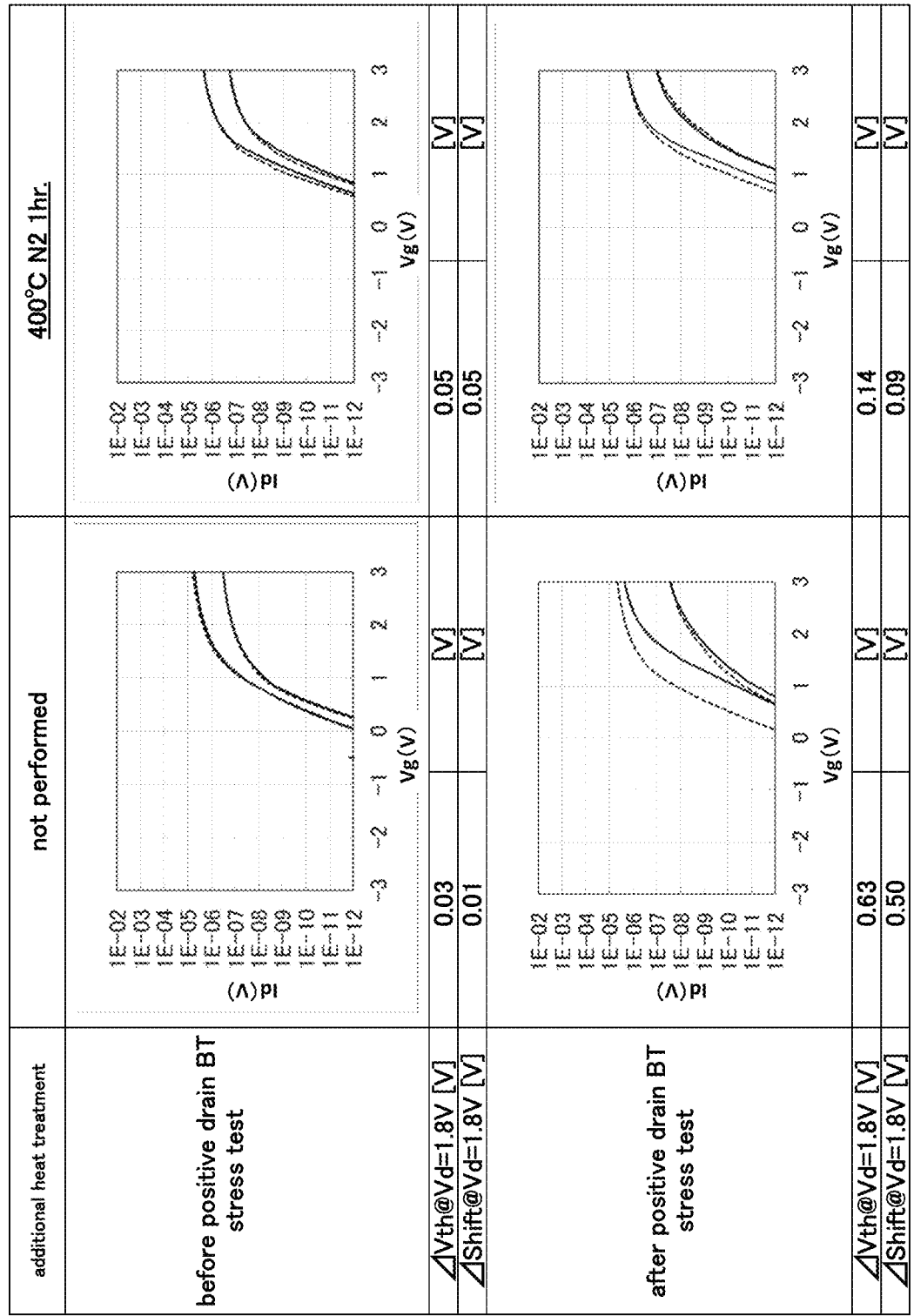
FIG. 57 shows Id-Vg measurement results of fabricated transistors.

FIG. 57 shows Id-Vg measurement results.

As shown in FIG. 57, additional heat treatment is performed after the transistor was fabricated, whereby variations in characteristics before and after the source electrode and the drain electrode are switched after the stress test can be inhibited. This is probably because, by the heat treatment, defects in the film were repaired and the density of interface states was reduced.

Note that variations in characteristics can also be effectively inhibited by performing heat treatment not only after the transistor is fabricated but also after each insulating layer is formed.

Therefore, it is found that the transistor using the present invention has high frequency characteristics and can achieve high-speed operation when the transistor is used in a memory circuit, a logic circuit, or an analog circuit. It is also found that the off-leakage current can be extremely low and variations in characteristics can be inhibited. Thus, combination of such characteristics with the characteristics obtained in the other examples can make it possible to stably manufacture LSIs and the like which can achieve low-power consumption and high-speed operation, which cannot be achieved by using Si.

EXPLANATION OF REFERENCE

10: transistor, 11: transistor, 12: transistor, 13: transistor, 100: substrate, 110: insulating layer, 120: oxide semiconductor layer, 121: oxide insulating layer, 122: oxide semiconductor layer, 123: oxide insulating layer, 123a: oxide insulating film, 130: source electrode layer, 130b: conductive layer, 131: source electrode layer, 140: drain electrode layer, 141: drain electrode layer, 150: gate insulating layer, 150a: insulating film, 160: gate electrode layer, 160a: conductive film, 161: gate electrode layer, 161a: conductive film, 162: gate electrode layer, 162a: conductive film, 170: insulating layer, 171: region, 172: region, 173: region, 174: groove portion, 175: insulating layer, 175b: insulating layer, 176: resist mask, 177: resist mask, 200: imaging device, 201: switch, 202: switch, 203: switch, 210: pixel portion, 211: pixel, 212: subpixel, 212B: subpixel, 212G: subpixel, 212R: subpixel, 220: photoelectric conversion element, 230: pixel circuit, 231: wiring, 247: wiring, 248: wiring, 249: wiring, 250: wiring, 253: wiring, 254: filter, 254B: filter, 254G: filter, 254R: filter, 255: lens, 256: light, 257: wiring, 260: peripheral circuit, 270: peripheral circuit, 280: peripheral circuit, 290: peripheral circuit, 291: light source, 300: silicon substrate, 310: layer, 320: layer, 330: layer, 340: layer, 351: transistor, 352: transistor, 353: transistor, 360: photodiode, 361: anode, 362: cathode, 363: low-resistance region, 365: photodiode, 366: semiconductor layer, 367: semiconductor layer, 368: semiconductor layer, 370: plug, 371: wiring, 372: wiring, 373: wiring, 374: wiring, 601: precursor, 602: precursor, 700: substrate, 701: pixel portion, 702: scan line driver circuit, 703: scan line driver circuit, 704: signal line driver circuit, 710: capacitor wiring, 712: scan line, 713: scan line, 714: signal line, 716: transistor, 717: transistor, 718: liquid crystal element, 719: liquid crystal element, 720: pixel, 721: switching transistor, 722: driver transistor, 723: capacitor, 724: light-emitting element, 725: signal line, 726: scan line, 727: power supply line, 728: common electrode, 750: interposer, 751: chip, 752: terminal, 753: mold resin, 800: RF tag, 801: communication device, 802: antenna, 803: radio signal, 804: antenna, 805: rectifier circuit, 806: constant voltage circuit, 807: demodulation circuit, 808: modulation circuit, 809: logic circuit, 810: memory circuit, 811: ROM, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 1700: substrate, 1701: chamber, 1702: load chamber, 1703: pretreatment chamber, 1704: chamber, 1705: chamber, 1706: unload chamber, 1711a: source material supply portion, 1711b: source material supply portion, 1712a: high-speed valve, 1712b: high-speed valve, 1713a: source material introduction port, 1713b: source material introduction port, 1714: source material exhaust port, 1715: evacuation unit, 1716: substrate holder, 1720: transfer chamber, 1800: panel, 1801: printed wiring board, 1802: package, 1803: FPC, 1804: battery, 2100: transistor, 2200: transistor, 2201: insulator, 2202: wiring, 2203: plug, 2204: insulator, 2205: wiring, 2207: insulator, 2210: intermediate layer, 2211: semiconductor substrate, 2212: insulator, 2213: gate electrode, 2214: gate insulator, 2215: source and drain regions, 3001: wiring, 3002: wiring, 3003: wiring, 3004: wiring, 3005: wiring, 3200: transistor, 3300: transistor, 3400: capacitor, 4000: RF tag, 5100: pellet, 5120: substrate, 5161: region, 6000: display module, 6001: upper cover, 6002: lower cover, 6003: FPC, 6004: touch panel, 6005: FPC, 6006: display panel, 6007: backlight unit, 6008: light source, 6009: frame, 6010: printed board, 6011: battery, 7101: housing, 7102: housing, 7103: display portion, 7104: display portion, 7105: microphone, 7106: speaker, 7107: operation key, 7108: stylus, 7302: housing, 7304: display portion, 7311: operation button, 7312: operation button, 7313: connection terminal, 7321: band, 7322: clasp, 7501: housing, 7502: display portion, 7503: operation button, 7504: external connection port, 7505: speaker, 7506: microphone, 7701: housing, 7702: housing, 7703: display portion, 7704: operation key, 7705: lens, 7706: joint, 7901: utility pole, 7902: display portion, 8000: camera, 8001: housing, 8002: display portion, 8003: operation button, 8004: shutter button, 8005: connection portion, 8006: lens, 8100: finder, 8101: housing, 8102: display portion, 8103: button, 8121: housing, 8122: display portion, 8123: keyboard, 8124: pointing device, 8200: head-mounted display, 8201: mounting portion, 8202: lens, 8203: main body, 8204: display portion, 8205: cable, 8206: battery, 9700: automobile, 9701: car body, 9702: wheels, 9703: dashboard, 9704: lights, 9710: display portion, 9711: display portion, 9712: display portion, 9713: display portion, 9714: display portion, 9715: display portion, 9721: display portion, 9722: display portion, 9723: display portion.

This application is based on Japanese Patent Application serial no. 2015-012713 filed with Japan Patent Office on Jan. 26, 2015, Japanese Patent Application serial no. 2015-012718 filed with Japan Patent Office on Jan. 26, 2015, Japanese Patent Application serial no. 2015-039161 filed with Japan Patent Office on Feb. 27, 2015, Japanese Patent Application serial no. 2015-041682 filed with Japan Patent Office on Mar. 3, 2015, Japanese Patent Application serial no. 2015-046870 filed with Japan Patent Office on Mar. 10, 2015, and Japanese Patent Application serial no. 2015-053100 filed with Japan Patent Office on Mar. 17, 2015, the entire contents of which are hereby incorporated by reference.

The invention claimed is:

1. A semiconductor device comprising:
a transistor,
wherein the transistor comprises:
  a first insulating layer;
  an oxide semiconductor layer having a channel formation region, the oxide semiconductor layer overlapping with a first region of the first insulating layer;
  a second insulating layer disposed over the first insulating layer and the oxide semiconductor layer, the second insulating layer having a groove on the channel formation region;
  a gate insulating layer formed along an inner wall of the groove; and
  a gate electrode embedded in an inner side of the groove with the gate insulating layer provided therebetween,
wherein in a cross-section of a channel length direction of the transistor,
  a length of a top surface of the gate electrode is larger than a length of a bottom surface of the gate electrode,
  a side surface of the gate electrode in the inner side of the groove includes a first portion having a first taper angle and a second portion located under the first portion and having a second taper angle,
  a degree of the first taper angle is different from a degree of the second taper angle,
  a top surface of the second insulating layer, a top surface of the gate insulating layer, and the top surface of the gate electrode are polished surfaces flatted on a same plane, and
  the second insulating layer has a region being in contact with a second region of the first insulating layer.

2. The semiconductor device according to claim 1,
wherein in the cross-section of the channel length direction of the transistor, the first taper angle is smaller than the second taper angle.

3. The semiconductor device according to claim 1,
wherein in a cross-section of a channel width direction of the transistor, the side surface of the gate electrode is opposite to a side surface of a first portion of the oxide semiconductor layer with the gate insulating layer provided therebetween.

4. The semiconductor device according to claim 1,
wherein the gate electrode is a stacked layer of a first layer and a second layer, and
wherein a lower surface and a side surface of the second layer are covered by the first layer.

5. The semiconductor device according to claim 1,
wherein the transistor comprises a back gate electrode.

6. The semiconductor device according to claim 1,
wherein the transistor comprises a source electrode and a drain electrode, and
wherein both of the source electrode and the drain electrode are in contact with a top surface of the oxide semiconductor layer.

7. The semiconductor device according to claim 1,
wherein the oxide semiconductor layer comprises indium and zinc.

8. A semiconductor device comprising:
a transistor,
wherein the transistor comprises:
  a first insulating layer;
  an oxide semiconductor layer having a channel formation region, the oxide semiconductor layer overlapping with a first region of the first insulating layer;
  a second insulating layer disposed over the first insulating layer and the oxide semiconductor layer, the second insulating layer having a groove on the channel formation region;
  a gate insulating layer formed along an inner wall of the groove; and
  a gate electrode embedded in an inner side of the groove with the gate insulating layer provided therebetween,
wherein in a cross-section of a channel length direction of the transistor,
  a length of a top surface of the gate electrode is larger than a length of a bottom surface of the gate electrode,
  a side surface of the gate electrode in the inner side of the groove includes at least a first portion having a first taper angle, a second portion located under the first portion and having a second taper angle, a first inflection point located over the second portion, and a second inflection point located under the first inflection point,
  a degree of the first taper angle is different from a degree of the second taper angle,
  a top surface of the second insulating layer, a top surface of the gate insulating layer, and the top surface of the gate electrode are polished surfaces flatted on a same plane, and
  the second insulating layer has a region being in contact with a second region of the first insulating layer.

9. The semiconductor device according to claim 8,
wherein in the cross-section of the channel length direction of the transistor, the first taper angle is smaller than the second taper angle.

10. The semiconductor device according to claim 8,
wherein in a cross-section of a channel width direction of the transistor, the side surface of the gate electrode is opposite to a side surface of a first portion of the oxide semiconductor layer with the gate insulating layer provided therebetween.

11. The semiconductor device according to claim 8,
wherein the gate electrode is a stacked layer of a first layer and a second layer, and
wherein a lower surface and a side surface of the second layer are covered by the first layer.

12. The semiconductor device according to claim 8,
wherein the transistor comprises a back gate electrode.

13. The semiconductor device according to claim 8,
wherein the transistor comprises a source electrode and a drain electrode, and
wherein both of the source electrode and the drain electrode are in contact with a top surface of the oxide semiconductor layer.

14. The semiconductor device according to claim 8,
wherein the oxide semiconductor layer comprises indium and zinc.

15. A semiconductor device comprising:
a transistor,
wherein the transistor comprises:
  a first insulating layer;
  an oxide semiconductor layer having a channel formation region, the oxide semiconductor layer overlapping with a first region of the first insulating layer;

a second insulating layer disposed over the first insulating layer and the oxide semiconductor layer, the second insulating layer having a groove on the channel formation region;

a gate insulating layer formed along an inner wall of the groove; and a gate electrode embedded in an inner side of the groove with the gate insulating layer provided therebetween, wherein in a cross-section of a channel length direction of the transistor, the gate electrode has a structure in which a length of a top surface is larger than a length of a bottom surface and continuously widen toward upside from a side of the channel formation region, a side surface of the gate electrode in the inner side of the groove includes a first portion having a first taper angle and a second portion located under the first portion and having a second taper angle, a degree of the first taper angle is different from a degree of the second taper angle, a top surface of the second insulating layer, a top surface of the gate insulating layer, and the top surface of the gate electrode are polished surfaces flatted on a same plane, and the second insulating layer has a region being in contact with a second region of the first insulating layer.

16. The semiconductor device according to claim 15, wherein in the cross-section of the channel length direction of the transistor, the first taper angle is smaller than the second taper angle.

17. The semiconductor device according to claim 15, wherein in a cross-section of a channel width direction of the transistor, the side surface of the gate electrode is opposite to a side surface of a first portion of the oxide semiconductor layer with the gate insulating layer provided therebetween.

18. The semiconductor device according to claim 15, wherein the gate electrode is a stacked layer of a first layer and a second layer, and wherein a lower surface and a side surface of the second layer are covered by the first layer.

19. The semiconductor device according to claim 15, wherein the transistor comprises a back gate electrode.

20. The semiconductor device according to claim 15, wherein the transistor comprises a source electrode and a drain electrode, and wherein both of the source electrode and the drain electrode are in contact with a top surface of the oxide semiconductor layer.

21. The semiconductor device according to claim 15, wherein the oxide semiconductor layer comprises indium and zinc.

* * * * *